(12) United States Patent
Nagaya et al.

(10) Patent No.: US 11,163,098 B2
(45) Date of Patent: Nov. 2, 2021

(54) OPTICAL FILTER AND OPTICAL SENSOR DEVICE

(71) Applicant: JSR CORPORATION, Minato-ku (JP)

(72) Inventors: Katsuya Nagaya, Minato-ku (JP);
Daisuke Shigeoka, Minato-ku (JP);
Hiroyuki Kishida, Minato-ku (JP);
Masako Horiuchi, Minato-ku (JP)

(73) Assignee: JSR CORPORATION, Minato-ku (JP)

( * ) Notice: Subject to any disclaimer, the term of this patent is extended or adjusted under 35 U.S.C. 154(b) by 385 days.

(21) Appl. No.: 16/306,687

(22) PCT Filed: Jun. 2, 2017

(86) PCT No.: PCT/JP2017/020632
§ 371 (c)(1),
(2) Date: Dec. 3, 2018

(87) PCT Pub. No.: WO2017/213047
PCT Pub. Date: Dec. 14, 2017

(65) Prior Publication Data
US 2019/0227207 A1   Jul. 25, 2019

(30) Foreign Application Priority Data

Jun. 8, 2016 (JP) .............................. JP2016-114314

(51) Int. Cl.
*G02B 5/22* (2006.01)
*G02B 5/28* (2006.01)
(Continued)

(52) U.S. Cl.
CPC ............ *G02B 5/208* (2013.01); *G01J 1/0488* (2013.01); *G02B 5/22* (2013.01); *G02B 5/223* (2013.01);
(Continued)

(58) Field of Classification Search
None
See application file for complete search history.

(56) References Cited

U.S. PATENT DOCUMENTS 4,857,431 A   8/1989   Kato et al.
5,296,519 A   3/1994   Otsuka
(Continued)

FOREIGN PATENT DOCUMENTS

CN   105452911 A   3/2016
JP   60-139757 A   7/1985
(Continued)

OTHER PUBLICATIONS

Combined Chinese Office Action and Search Report dated Sep. 21, 2020 in Patent Application No. 201780036284.1 (with English language translation), 19 pages.
(Continued)

*Primary Examiner* — Derek S. Chapel
(74) *Attorney, Agent, or Firm* — Oblon, McClelland, Maier & Neustadt, L.L.P.

(57) ABSTRACT

An object of the present invention is to provide an optical filter having excellent visible light-cut characteristics and near-infrared rays transmission properties at a specific wavelength that are compatible with one another even in the case where the incident angle is increased, according to reduction in height of equipment on which an optical sensor device is provided. The optical filter of the present invention includes a base material (i) including a resin layer containing a compound (Z) having an absorption maximum in the wavelength region of 700 to 930 nm, and a dielectric multilayer film formed on at least one surface of the base material (i), and has specific optical properties.

21 Claims, 12 Drawing Sheets

(51) Int. Cl.
*H01L 27/146* (2006.01)
*G02B 5/20* (2006.01)
*G01J 1/04* (2006.01)
*G02B 5/26* (2006.01)
*C09B 57/00* (2006.01)
*C09B 23/00* (2006.01)

(52) U.S. Cl.
CPC .............. *G02B 5/26* (2013.01); *G02B 5/281* (2013.01); *H01L 27/14621* (2013.01); *H01L 27/14625* (2013.01); *C09B 23/00* (2013.01); *C09B 57/00* (2013.01)

(56) References Cited

U.S. PATENT DOCUMENTS

| | | | |
|---|---|---|---|
| 5,401,438 | A | 3/1995 | Otsuka |
| 5,405,976 | A | 4/1995 | Telfer et al. |
| 5,523,027 | A | 6/1996 | Otsuka |
| 5,627,014 | A | 5/1997 | Chu et al. |
| 5,977,351 | A | 11/1999 | Chu et al. |
| 6,020,490 | A | 2/2000 | Reinehr et al. |
| 2004/0137367 | A1 | 7/2004 | Kitayama et al. |
| 2008/0132667 | A1 | 6/2008 | Makinoshima et al. |
| 2008/0165421 | A1 | 7/2008 | Matsumoto et al. |
| 2012/0145901 | A1* | 6/2012 | Kakiuchi ............... G02B 5/22 250/330 |
| 2014/0091419 | A1 | 4/2014 | Hasegawa et al. |
| 2014/0350146 | A1* | 11/2014 | Tsubouchi ............. G02B 5/208 524/94 |
| 2015/0160386 | A1* | 6/2015 | Takemura ............. G02B 5/208 359/359 |
| 2015/0293282 | A1 | 10/2015 | Takishita et al. |
| 2016/0170105 | A1 | 6/2016 | Nagaya et al. |
| 2016/0195651 | A1* | 7/2016 | Yoshioka .................. B32B 7/00 359/359 |
| 2016/0231482 | A1 | 8/2016 | Hasegawa et al. |
| 2018/0149781 | A1* | 5/2018 | Ockenfuss ............ C23C 14/352 |
| 2018/0196177 | A1 | 7/2018 | Takishita et al. |
| 2021/0055462 | A1* | 2/2021 | Kweon ................... C23C 28/04 |

FOREIGN PATENT DOCUMENTS

| | | |
|---|---|---|
| JP | 60-228448 A | 11/1985 |
| JP | 63-124054 A | 5/1988 |
| JP | 1-146846 A | 6/1989 |
| JP | 1-228960 A | 9/1989 |
| JP | 7-126036 A | 5/1995 |
| JP | 2846091 B2 | 1/1999 |
| JP | 2864475 B2 | 3/1999 |
| JP | 3094037 B2 | 10/2000 |
| JP | 2001-40234 A | 2/2001 |
| JP | 3196383 B2 | 8/2001 |
| JP | 3366697 B2 | 1/2003 |
| JP | 3699464 B2 | 9/2005 |
| JP | 3703869 B2 | 10/2005 |
| JP | 2006-199945 A | 8/2006 |
| JP | 2007-169315 A | 7/2007 |
| JP | 4081149 B2 | 4/2008 |
| JP | 2008-163107 A | 7/2008 |
| JP | 2008-163194 A | 7/2008 |
| JP | 2008-181121 A | 8/2008 |
| JP | 2009-108267 A | 5/2009 |
| JP | 2010-241873 A | 10/2010 |
| JP | 2010-285505 A | 12/2010 |
| JP | 4740631 82 | 8/2011 |
| JP | 2011-197450 A | 10/2011 |
| JP | 2012-137728 A | 7/2012 |
| JP | 2014-130173 A | 7/2014 |
| JP | 5741283 B2 | 7/2015 |
| JP | 2015-184627 A | 10/2015 |
| JP | 2015-131594 A | 1/2016 |
| TW | 201520609 A | 6/2015 |
| WO | WO 2012/169447 A1 | 12/2012 |
| WO | WO 2015/056734 A1 | 4/2015 |
| WO | WO 2016/098810 A1 | 6/2016 |

OTHER PUBLICATIONS

Combined Taiwanese Office Action and Search Report dated Jan. 28, 2021 in Patent Application No. 106118599 (with English language translation), 24 pages.
Notice of Reasons for Refusal dated Feb. 16, 2021 in Japanese Patent Application No. 2020-126496 (with English language translation), 12 pages.
Office Action dated May 26, 2020 in corresponding Japanese Patent Application No. 2018-522454 (with English Translation), 13 pages.
International Search Report dated Aug. 1, 2017 in PCT/JP2017/020632 (with English translation), 5 pages.
Written Opinion of the International Searching Authority dated Aug. 1, 2017 in PCT/ JP2017/020632 filed Jun. 2, 2017 (with English translation), 9 pages.
"Phthalocyanine: Its Chemistry and Functions" Industrial Publishing & Consulting, Inc, Feb. 28, 1997 (with partial English translation).

* cited by examiner

Fig. 2
(A)
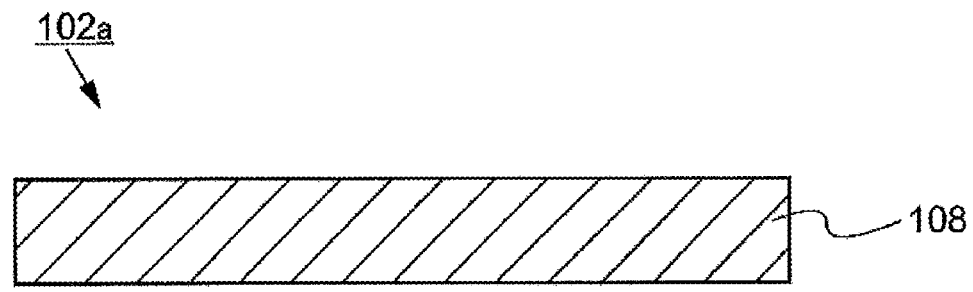
(B)
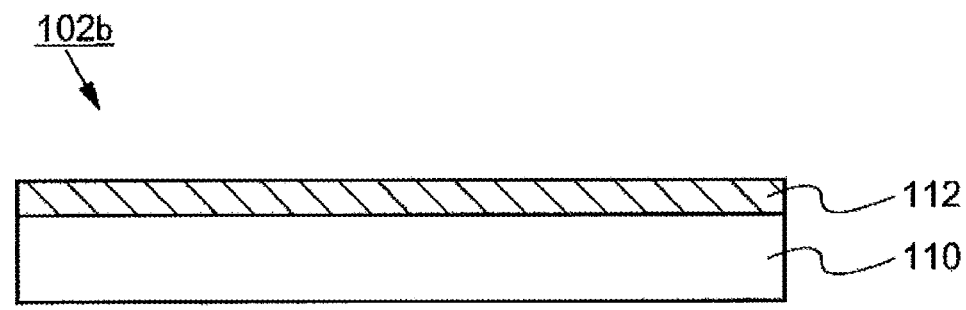
(C)
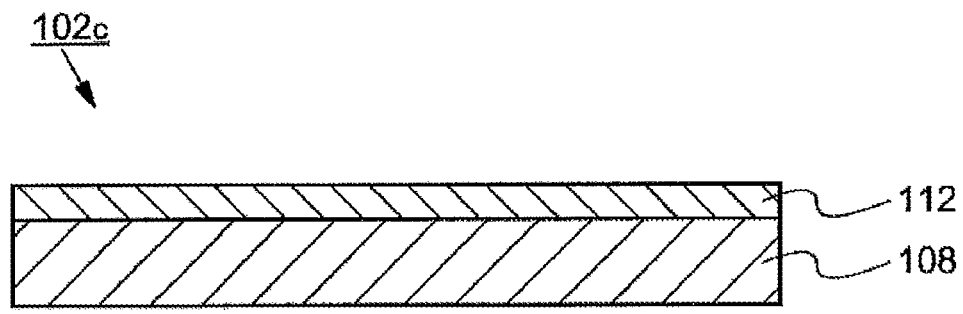

Fig. 3
(A)
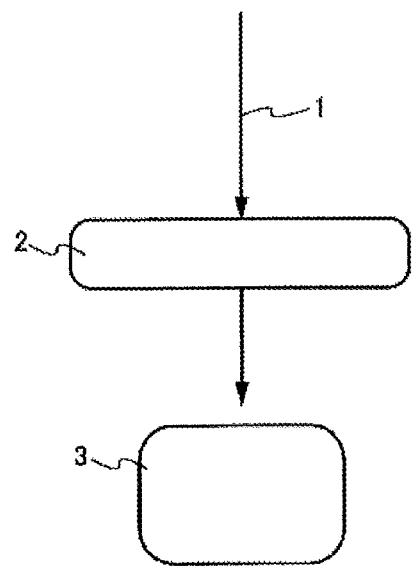
(B)
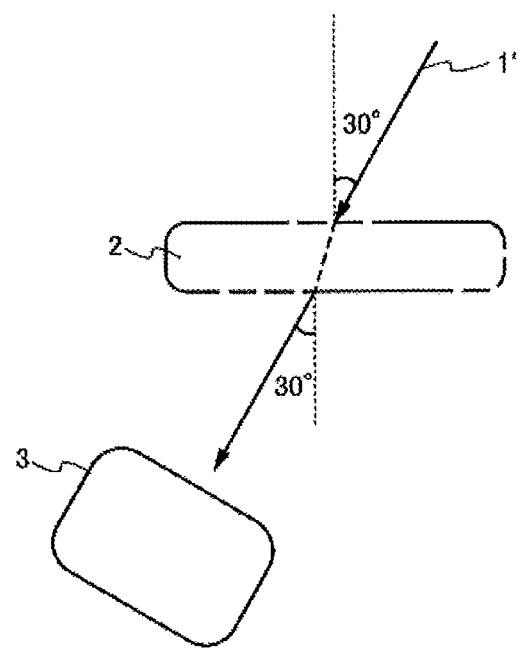

OPTICAL FILTER AND OPTICAL SENSOR DEVICE

TECHNICAL FIELD

The present invention relates to an optical filter and an optical sensor device. More particularly, the present invention relates to an optical filter which cuts visible rays and which transmits near-infrared rays at some of wavelengths, and an optical sensor device using the optical filter.

BACKGROUND ART

In recent years, various optical sensor devices using near-infrared rays, for use in mobile information terminal devices such as smart phones, tablet terminals, and wearable appliances, have been progressively developed. With respect to information terminal devices, optical sensor devices have been studied to be applied to various applications, and one example of such applications includes applications for space recognition such as distance measurement, applications for motion recognition, security applications for iris verification, vein authentication in confession, and face authentication, and healthcare applications for pulse measurement and blood oxygen level measurement.

It is important for optical sensor devices using near-infrared rays to cut light of unnecessary wavelengths, in particular, visible rays, in order to allow a sensing function to be accurately performed. In addition, it is possible, depending on the wavelengths of near-infrared rays for use in sensing, to cut near-infrared rays of shorter wavelengths than the wavelengths (for example, cut not only visible rays, but also near-infrared rays of wavelengths of up to about 780 nm, in the case of use of near-infrared rays of wavelengths of about 850 nm in sensing), to result in a reduction in noise in use and an enhancement in characteristics of optical sensor devices.

On the other hand, mobile information terminal devices are increasingly reduced in height and the distance from a light entrance window to an optical sensor is thus decreased, whereby the proportion of light incident from an oblique direction is increased as compared with a conventional case. For the purpose of an enhancement in sensor accuracy, light incident from an oblique direction, when reaches an optical sensor, is also demanded not to be changed in spectral characteristics (in particular, cut characteristics of visible rays and near-infrared rays of unnecessary wavelengths).

As a solution for cutting visible rays and transmitting near-infrared rays of specific wavelengths, a bandpass filter is disclosed where high-refractive index materials and low-refractive index materials are alternatively laminated on a glass substrate (see, for example, Patent Literature 1). However, an optical filter where such a multilayer thin film is formed is highly changed in optical properties depending on the incident angle of incident light. Therefore, such an optical filter has the problem of a reduction in the detection accuracy of an optical sensor when used in mobile information terminal devices.

On the other hand, a glass filter including a metallic coloring component (see, for example, Patent Literature 2) and a filter including a color pigment (see, for example, Patent Literature 3) are known as optical filters capable of cutting visible rays regardless of the incident angle. While all these filters cut visible rays by absorption and are less changed in optical properties depending on the incident angle, the filters are needed to have a thickness of about 1.0 mm in order to achieve sufficient light cut characteristics, and cannot be sometimes favorably used in a mobile information terminal where reduction in size and weight has rapidly progressed in recent years. In addition, these filters, if reduced in thickness, have the problems of significant deterioration in light cutting performance by absorption and an increase in noise during sensing. Furthermore, if the wavelength of near-infrared rays for use in sensing is not less than 800 nm (such a wavelength is currently mainly adopted in terms of invisibility), these filters not only may be insufficient in cut characteristics of near-infrared rays having a wavelength shorter than such a wavelength, and but also tend to be moderated in the slope of an absorption spectrum and reduced in the contrast between light cutting and light transmission (increased in noise in sensing) if being particularly optical filters including a color pigment.

As an infrared transmission filter capable of simultaneously satisfying reduction in thickness and reduction in incident angle dependence, an infrared transmission filter has been proposed which is provided with a film including a near-infrared rays absorbing agent on a base material including a visible light absorbing agent (see, for example, Patent Literature 4), but the filter is not sometimes sufficient in the effect of reduction in incident angle dependence, and cannot sometimes perform precise sensing recently demanded.

CITATION LIST

Patent Literature

Patent Literature 1: Japanese Patent Laid-Open Publication No. 2015-184627
Patent Literature 2: Japanese Patent Laid-Open Publication No. H07(1995)-126036
Patent Literature 3: Japanese Patent Laid-Open Publication No. S60(1985)-139757
Patent Literature 4: Japanese Patent No. 5741283

SUMMARY OF INVENTION

Technical Problem

One object of the present invention is to provide an optical filter having excellent visible light-cut characteristics and near-infrared rays transmission properties at a specific wavelength that are compatible with one another even in the case where the incident angle is increased, according to reduction in height of equipment on which an optical sensor device is provided.

Solution to Problem

[1] An optical filter comprising:
a base material (i) comprising a resin layer containing a compound (Z) having an absorption maximum in the wavelength region of 700 to 930 nm; and
a dielectric multilayer film formed on at least one surface of the base material (i),
wherein the optical filter satisfies the following requirements (a) to (c):
(a) an average value of transmittances measured in the perpendicular direction to the optical filter in the wavelength region of 380 to 700 nm is not more than 10%;
(b) the optical filter has a light passband (Za) in the wavelength region of not less than 750 nm, and the maximum transmittance (Td) measured in the perpendicular direction to the optical filter in the light passband (Za) is not less than 45%; and (c) an absolute value |Xa−Xb| of a difference between a wavelength (Xa) on the shortest wavelength side, at which a transmittance measured in the perpendicular direction to the optical filter is half the transmittance (Td), and a wavelength (Xb) on the shortest wavelength side, at which a transmittance measured at an angle of 30° to the perpendicular direction to the optical filter is half the transmittance (Td), in the light passband (Za), is not more than 15 nm, and the wavelength (Xa) is in the range of 730 to 980 nm.

[2] The optical filter according to [1], wherein the optical filter further satisfies the following requirement (d):

(d) an average value of transmittances measured in the perpendicular direction to the optical filter in the wavelength region of 701 to 750 nm is not more than 15%.

[3] The optical filter according to [1] or [2], wherein a wavelength (Xc), at which a transmittance measured in the perpendicular direction to the optical filter in the light passband (Za) is maximum, is in the range of 780 to 1000 nm.

[4] The optical filter according to any one of [1] to [3], wherein the optical filter further satisfies the following requirement (e):

(e) a maximum transmittance measured in the perpendicular direction to the optical filter in the light passband (Za) is not less than 75%, and an absolute value |Xd−Xe| of a difference between a wavelength (Xd) on the shortest wavelength side, at which a transmittance measured in the perpendicular direction to the optical filter in the light passband (Za) is 70%, and a wavelength (Xe) on the shortest wavelength side, at which a transmittance measured in the perpendicular direction to the optical filter in the wavelength region of not less than 720 nm is 30%, is not more than 30 nm.

[5] The optical filter according to [3], wherein a transmittance (Tc) measured at an angle of 30° to the perpendicular direction to the optical filter at the wavelength (Xc) is not less than 45%.

[6] The optical filter according to any one of [1] to [5], wherein the thickness of the optical filter is not more than 180 μm.

[7] The optical filter according to any one of [1] to [6], wherein the compound (Z) is at least one compound selected from the group consisting of a squarylium-based compound, a phthalocyanine-based compound, a naphthalocyanine-based compound, a croconium-based compound, a hexaphyrin-based compound and a cyanine-based compound.

[8] The optical filter according to any one of [1] to [7], wherein a resin for forming the resin layer is at least one resin selected from the group consisting of a cyclic (poly) olefin-based resin, an aromatic polyether-based resin, a polyimide-based resin, a fluorene polycarbonate-based resin, a fluorene polyester-based resin, a polycarbonate-based resin, a polyamide-based resin, a polyarylate-based resin, a polysulfone-based resin, a polyether sulfone-based resin, a polyparaphenylene-based resin, a polyamideimide-based resin, a polyethylene naphthalate-based resin, a fluorinated aromatic polymer-based resin, a (modified) acrylic-based resin, an epoxy-based resin, an allyl ester-based curing type resin, a silsesquioxane-based ultraviolet curing resin, an acrylic-based ultraviolet curing resin and a vinyl-based ultraviolet curing resin.

[9] The optical filter according to [7], wherein the squarylium-based compound is a compound represented by the following formula (Z).

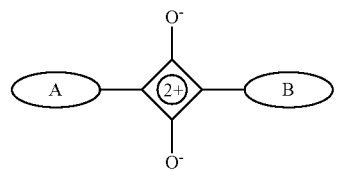

In the formula (Z), substitution units A and B are each independently any of substitution units represented by the following formulae (I) to (III).

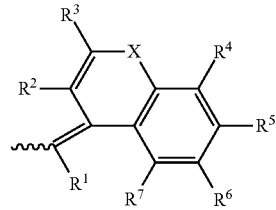

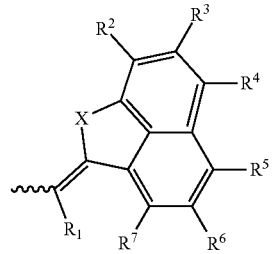

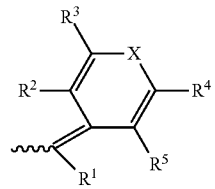

In the formulae (I) to (III), a site represented by a wavy line is a binding site to a central 4-membered ring, each X is independently an oxygen atom, a sulfur atom, a selenium atom, a tellurium atom or —NR$^8$—, $R^1$ to $R^8$ are each independently a hydrogen atom, a halogen atom, a sulfo group, a hydroxyl group, a cyano group, a nitro group, a carboxy group, a phosphoric acid group, a —NR$^g$R$^h$ group, a —SR$^i$ group, a —SO$_2$R$^i$ group, a —OSO$_2$R$^i$ group or any one of the following L$^a$ to L$^h$, R$^g$ and R$^h$ are each independently a hydrogen atom, a —C(O)R$^i$ group or any one of the following L$^a$ to L$^e$, and R$^i$ is any one of the following L$^a$ to L$^e$, (L$^a$) an aliphatic hydrocarbon group of 1 to 12 carbon atoms (L$^b$) a halogen-substituted alkyl group of 1 to 12 carbon atoms (L$^c$) an alicyclic hydrocarbon group of 3 to 14 carbon atoms (L$^d$) an aromatic hydrocarbon group of 6 to 14 carbon atoms (L$^e$) a heterocyclic group of 3 to 14 carbon atoms (L$^f$) an alkoxy group of 1 to 12 carbon atoms (L$^g$) an acyl group of 1 to 12 carbon atoms, which may have a substituent L (L$^h$) an alkoxycarbonyl group of 1 to 12 carbon atoms, which may have a substituent L, and the substituent L is at least one kind selected from the group consisting of an aliphatic hydrocarbon group of 1 to 12 carbon atoms, a halogen-substituted alkyl group of 1 to 12 carbon atoms, an alicyclic hydrocarbon group of 3 to 14 carbon atoms, an aromatic hydrocarbon group of 6 to 14 carbon atoms and a heterocyclic group of 3 to 14 carbon atoms.

[10] The optical filter according to any one of [1] to [9], wherein the base material (i) comprises a resin substrate (ii) containing the compound (Z).

[11] The optical filter according to any one of [1] to [10], wherein the base material (i) further contains a compound (S) having an absorption maximum in the wavelength region of 350 to 699 nm.

[12] The optical filter according to [10], wherein the resin substrate (ii) further contains a compound (S) having an absorption maximum in the wavelength region of 350 to 699 nm.

[13] The optical filter according to [10] or [12], wherein the glass transition temperature of the resin substrate (ii) is 130 to 300° C.

[14] The optical filter according to [10], [12] or [13], wherein a difference between the glass transition temperature of the resin substrate (ii) and the glass transition temperature of the resin contained in the resin substrate (ii) is 0 to 10° C.

[15] The optical filter according to any one of [1] to [14], wherein the base material (i) contains a compound (S-a) having an absorption maximum in the wavelength region of 350 to 500 nm, a compound (S-b) having an absorption maximum in the wavelength region of 501 to 600 nm and a compound (S-c) having an absorption maximum in the wavelength region of 601 to 699 nm.

[16] The optical filter according to [15], wherein a difference in absorption maximum wavelength between the compound (S-a) and the compound (S-b) is 50 to 140 nm, and a difference in absorption maximum wavelength between the compound (S-b) and the compound (S-c) is 30 to 100 nm.

The optical filter according to any one of [1] to [16], wherein the optical filter has a light stopband (Zb) in a region on a longer wavelength side than the light passband (Za), and the minimum transmittance (Te) measured in the perpendicular direction to the optical filter in the light stopband (Zb) is not more than 10%.

[18] The optical filter according to [17], wherein an absolute value |Xg−Xh| of a difference between a wavelength (Xg) on the longest wavelength side, at which a transmittance measured in the perpendicular direction to the optical filter is half the transmittance (Td), and a wavelength (Xh) on the longest wavelength side, at which a transmittance measured at an angle of 30° to the perpendicular direction to the optical filter is half the transmittance (Td), in the light passband (Za), is not more than 30 nm.

[19] The optical filter according to [17] or [18], wherein the base material (i) further contains a compound (Y) having an absorption maximum on a longer wavelength side than the light passband (Za).

[20] The optical filter according to [19], wherein when a wavelength at which a transmittance measured in the perpendicular direction to the optical filter in the light passband (Za) is maximum is a wavelength (Xc), an absorption maximum wavelength of the compound (Y) is from the wavelength (Xc)+10 nm to the wavelength (Xc)+100 nm.

[21] The optical filter according to any one of [1] to [20], which is for an optical sensor device.

[22] An optical sensor device equipped with the optical filter according to any one of [1] to [21].

Advantageous Effects of Invention

The optical filter of the present invention has excellent visible light-cut characteristics and near-infrared rays transmission properties, and is less changed in optical properties even when rays are incident in the oblique direction, and therefore is favorably used for an optical sensor.

BRIEF DESCRIPTION OF DRAWINGS

FIG. 2 is an illustrative view of an embodiment of a base material forming the optical filter of the present invention.

FIG. 3(A) is an illustrative diagram of an aspect of a method for measuring a transmittance in the case where the transmittance is measured in the perpendicular direction to an optical filter.

FIG. 3(B) is an illustrative diagram of an aspect of a method for measuring a transmittance in the case where the transmittance is measured at an angle of 30° to the perpendicular direction to an optical filter.

DESCRIPTION OF EMBODIMENTS

Figure 1:
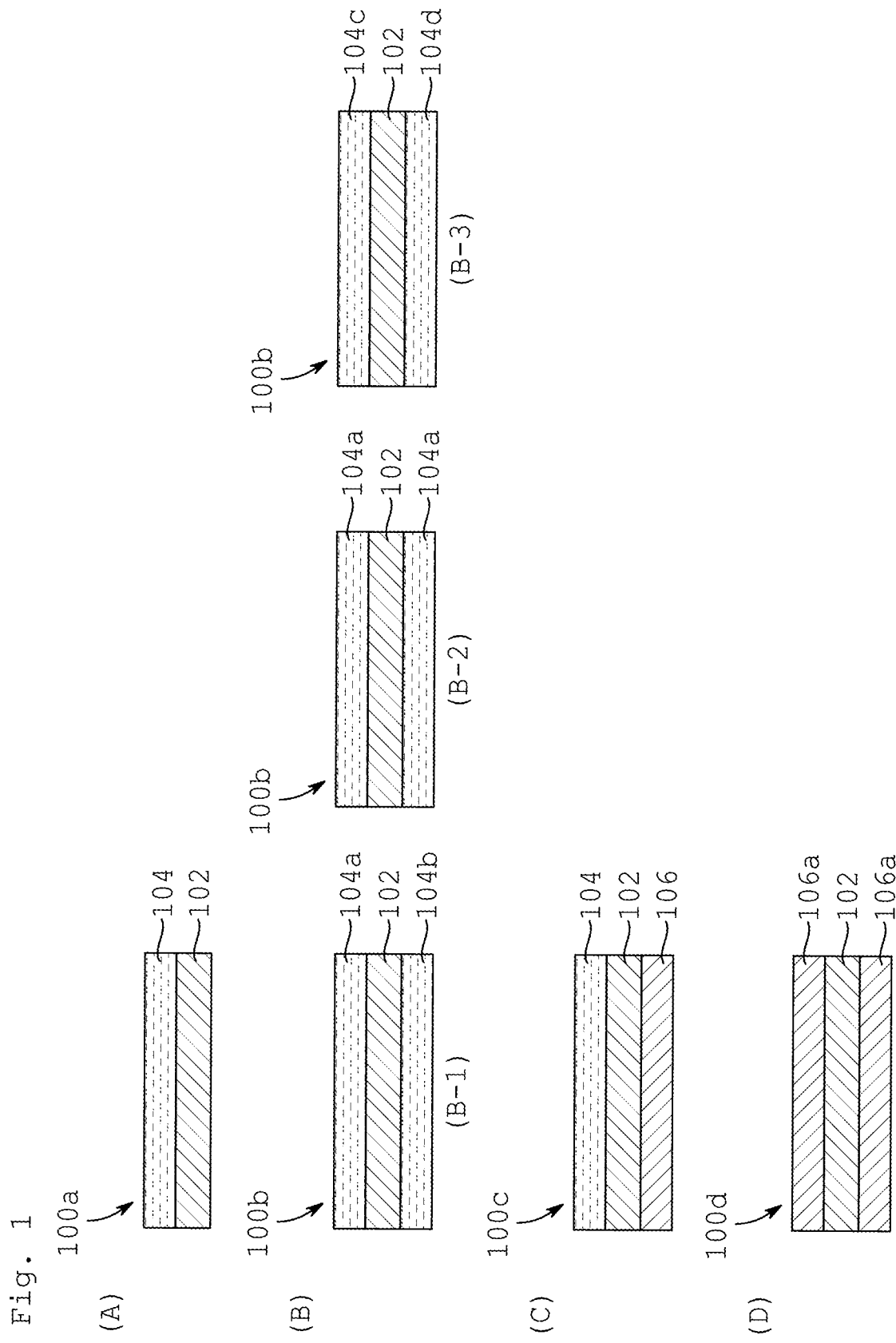
FIG. 1 is an illustrative view of an embodiment of the optical filter of the present invention.

Embodiments of the optical filter according to the present invention are described hereinafter with reference to the drawings and the like. It is noted that the present invention can be carried out in many different aspects and is not to be construed as being limited to the description of embodiments listed below. While the drawings may be more schematically illustrated than actual aspects with respect to the width, thickness, shape, and the like of each component in order to make the description clearer, these are merely examples and are not intended to limit the interpretation of the present invention. In the present specification and drawings, any element similar to an element previously described with reference to the drawing previously mentioned is marked with the same symbol or a similar symbol (symbol where any number is simply marked with a, b or the like following the number), and the detailed description thereof may be properly omitted.

In the present specification, the term "upper" is meant by a relative position based on a main surface (a surface on which a solid-state imaging element is to be disposed) of a support substrate, and a direction away from the main surface of a support substrate corresponds to an "upper" direction. In the present drawings, the upper portion of a page layout corresponds to "upper". The term "upper" encompasses a case where a subject is in contact with the upper portion of an object (i.e., a case where a subject is located "on" an object) and a case where a subject is positioned above an object (i.e., a case where a subject is located "over" an object). On the contrary, the term "lower" is meant by a relative position based on a main surface of a support substrate, and a direction close to the main surface of a support substrate corresponds to a "lower" direction. In the present drawings, the lower portion of a page layout corresponds to "lower".

[Optical Filter]

The optical filter according to the present invention comprises a base material (i) comprising a transparent resin layer containing a compound (Z) having an absorption maximum in the wavelength region of 700 to 930 nm, and a dielectric multilayer film formed on at least one surface of the base material (i), and satisfies the following requirements (a) to (c).

Requirement (a); an average value of transmittances measured in the perpendicular direction to the optical filter in the wavelength region of 380 to 700 nm is not more than 10%.

The average value of the transmittances is preferably not more than 8%, more preferably not more than 5%, still more preferably not more than 2%, particularly preferably not more than 1%. When the average value of the transmittances is in the above range, visible rays unnecessary for near-infrared sensing can be efficiently cut, and excellent sensing performance with few noises observed can be achieved.

Requirement (b); the optical filter has a light passband (Za) in the wavelength region of not less than 750 nm, and the maximum transmittance (Td) measured in the perpendicular direction to the optical filter in the light passband (Za) is not less than 45%.

The light passband (Za) refers to a wavelength band in which a transmittance measured in the perpendicular direction to the optical filter, in the wavelength region of not less than 750 nm but not more than 1050 nm, is not less than 40% and which satisfies the following conditions (1) and (2).

(1) The light passband (Za) is present on a longer wavelength side than the shortest wavelength (Za1) at which a transmittance measured in the perpendicular direction to the optical filter varies from less than 40% to not less than 40% from the shorter wavelength side towards the longer wavelength side.

(2) The width is not less than 5 nm.

The width of the light passband (Za) is preferably not less than 10 nm, still more preferably not less than 25 nm, particularly preferably not less than 50 nm. A plurality of light passbands (Za) may be present with respect to the same optical filter, and one thereof is preferably a wavelength band directly continued from the wavelength (Za1). The average transmittance in the light passband (Za) is preferably not less than 45%, more preferably not less than 50%, still more preferably not less than 60%, particularly preferably not less than 70%.

In the light passband (Za), a transmittance in a wavelength band of more than 1050 nm may be not less than 40% provided that the light passband (Za) satisfies the conditions (1) and (2). There may also be present any shortest wavelength (Za2) at which a transmittance measured in the perpendicular direction to the optical filter, in a wavelength region equal to or more than the light passband (Za), varies from not less than 40% to less than 40% from the shorter wavelength side towards the longer wavelength side. The latter case is more preferable in term of characteristics of the optical filter because unnecessary near-infrared rays on a longer wavelength side than the light passband (Za) can be efficiently cut.

The maximum transmittance (Td) is preferably not less than 55%, more preferably not less than 65%, still more preferably not less than 75%, particularly preferably not less than 80%. When the maximum transmittance (Td) is in the above range, near-infrared rays necessary for sensing can be efficiently taken, and favorable sensing performance can be achieved.

A wavelength (Xc) at which a transmittance measured in the perpendicular direction to the optical filter in the light passband (Za) is maximum is preferably 780 to 1000 nm, still more preferably 800 to 980 nm, particularly preferably 820 to 960 nm. A transmittance (Tc) measured at an angle of 30° to the perpendicular direction to the optical filter, at the wavelength (Xc), is preferably not less than 45%, more preferably not less than 55%, still more preferably not less than 60%, particularly preferably not less than 65%. The center wavelength with respect to near-infrared rays for use in sensing is preferably in the range of 780 to 1000 nm in consideration of invisibility and availability of a light source of near-infrared rays. When the wavelength (Xc) and the transmittance (Tc) are in the above ranges, such a case is preferable because the optical filter can more efficiently transmit near-infrared rays for use in sensing and sensing sensitivity can be enhanced.

Requirement (c); an absolute value |Xa−Xb| of a difference between a wavelength (Xa) on the shortest wavelength side, at which a transmittance measured in the perpendicular direction to the optical filter is half the transmittance (Td), and a wavelength (Xb) on the shortest wavelength side, at which a transmittance measured at an angle of 30° to the perpendicular direction to the optical filter is half the transmittance (Td), in the light passband (Za), is not more than 15 nm, and the wavelength (Xa) is in the range of 730 to 980 nm. When a plurality of the light passbands (Za) are presents, at least one of the light passbands (Za) may satisfy the requirement (c).

The wavelength (Xa) is preferably 740 to 940 nm, still more preferably 750 to 930 nm, particularly preferably 760 to 920 nm. When the wavelength (Xa) is in the above range, such a case is preferable because not only invisibility of near-infrared lights for use in sensing can be ensured, but also a relatively inexpensive near-infrared rays light source (near-infrared rays LED or the like) can be applied.

The absolute value |Xa−Xb| is preferably not more than 12 nm, more preferably not more than 10 nm, still more preferably not more than 8 nm, particularly preferably not more than 5 nm. When the absolute value |Xa−Xb| is in the above range, the optical filter is less changed in optical properties even when light is incident from an oblique direction, and excellent sensing performance with few noises observed can be achieved. Such an optical filter can be favorably used particularly for an optical sensor which is demanded to be reduced in height, for use in an information terminal device.

While an optical filter satisfying any one or two of the requirements (a) to (c) has been conventionally present, there is not any optical filter satisfying all the requirements, and there cannot be any optical filter favorably used for an optical sensor directed to an information terminal device which has been recently enhanced in performance remarkably. On the other hand, the optical filter of the present invention can satisfy all the requirements (a) to (c) by combining light cutting due to reflection of a dielectric multilayer film with light cutting by the compound (Z) contained in the transparent resin layer of the base material (i), and can be favorably used particularly for an optical sensor directed to an information terminal device.

The optical filter of the present invention preferably further satisfies the following requirement (d).

Requirement (d); an average value of transmittances measured in the perpendicular direction to the optical filter in the wavelength region of 701 to 750 nm is not more than 15%.

The average value of transmittances in the requirement (d) is preferably not more than 12%, more preferably not more than 10%, still more preferably not more than 5%, particularly preferably not more than 1%. The wavelength of near-infrared rays for use in sensing is currently mainly not less than 800 nm from the viewpoint of invisibility. In this case, rays in the wavelength region of 701 to 750 nm are unnecessary, and therefore the average transmittance of the optical filter in the wavelength region can be in the above range to thereby suppress malfunction in sensing.

The optical filter of the present invention preferably further satisfies the following requirement (e).

Requirement (e); a maximum transmittance measured in the perpendicular direction to the optical filter in the light passband (Za) is not less than 75%, and an absolute value |Xd-Xe| of a difference between a wavelength (Xd) on the shortest wavelength side, at which a transmittance measured in the perpendicular direction to the optical filter in the light passband (Za) is 70%, and a wavelength (Xe) on the shortest wavelength side, at which a transmittance measured in the perpendicular direction to the optical filter in the wavelength region of not less than 720 nm is 30%, is not more than 30 nm. When a plurality of the light passbands (Za) are present, at least one of the light passbands (Za) may satisfy the requirement (e).

The absolute value |Xd-Xe| is preferably not more than 28 nm, still more preferably not more than 25 nm, particularly preferably not more than 22 nm. When the absolute value |Xd-Xe| is in the above range, such a case is preferable because the slope of the waveform between the wavelength region in which rays are cut and the near-infrared rays passband is steep, the contrast between light cutting and light transmission can be increased, and sensing performance can be enhanced.

The optical filter of the present invention preferably has a light stopband (Zb) in a region on a longer wavelength side than the light passband (Za).

The light stopband (Zb) refers to a wavelength band in which a transmittance measured in the perpendicular direction to the optical filter, in the wavelength region of not less than 800 nm but not more than 1400 nm, is not more than 15% and which satisfies the following conditions (3) and (4).

(3) The light stopband (Zb) is present on a longer wavelength side than the shortest wavelength (Zb1) at which a transmittance measured in the perpendicular direction to the optical filter varies from more than 20% to not more than 20% from the shorter wavelength side towards the longer wavelength side.

(4) The width is not less than 5 nm.

The width of the light stopband (Zb) is preferably not less than 10 nm, still more preferably not less than 25 nm, particularly preferably not less than 50 nm. A plurality of light stopbands (Zb) may be present with respect to the same optical filter, and one thereof is preferably a wavelength band directly continued from the wavelength (Zb1).

The minimum transmittance (Te) measured in the perpendicular direction to the optical filter in the light stopband (Zb) is preferably not more than 10%, more preferably not more than 8%, still more preferably not more than 5%, particularly preferably not more than 2%. The average transmittance measured in the perpendicular direction to the optical filter in the light stopband (Zb) is preferably not more than 8%, more preferably not more than 5%, still more preferably not more than 2%, particularly preferably not more than 1%. When the maximum transmittance (Te) and the average transmittance in the light stopband (Zb) are in the above ranges, such a case is preferable because unnecessary near-infrared rays can be efficiently cut and more precise sensing can be conducted.

When the optical filter of the present invention has the light stopband (Zb), an absolute value |Xg-Xh| of a difference between a wavelength (Xg) on the longest wavelength side, at which a transmittance measured in the perpendicular direction to the optical filter is half the transmittance (Td), and a wavelength (Xh) on the longest wavelength side, at which a transmittance measured at an angle of 30° to the perpendicular direction to the optical filter is half the transmittance (Td), is preferably not more than 30 nm, still more preferably not more than 28 nm, particularly preferably not more than 25 nm. When the absolute value |Xg-Xh| is in the above range, the change in optical properties due to the incident angle can be reduced both on the shorter wavelength side and on the longer wavelength side of the light passband (Za), and more precise sensing can be conducted.

Examples of a specific method for reducing the absolute value |Xg-Xh| include a method where an average refractive index of a dielectric multilayer film having reflection characteristics in the light stopband (Zb) is allowed to be not less than 2.0, a method where a dielectric multilayer film having reflection characteristics in the light stopband (Zb) is designed so that nH·dH/nL·dL≥1.5 is satisfied (where nH represents a refractive index of a high-refractive index material contained in the dielectric multilayer film, at 550 nm, dH represents the total film thickness of layers of a high-refractive index material in the dielectric multilayer film, nL represents a refractive index of a low-refractive index material contained in the dielectric multilayer film, at 550 nm, and dL represents the total film thickness of layers of a low-refractive index material in the dielectric multilayer film, and the nH·dH/nL*dL is more preferably not less than 2.0, still more preferably not less than 2.5, particularly preferably not less than 3.0), and a method where a compound (Y) having an absorption maximum on a longer wavelength side than the light passband (Za) is further added.

Examples of embodiments of the optical filter of the present invention are shown in FIGS. 1(A) to 1(C).

An optical filter 100*a* shown in FIG. 1(A) includes a dielectric multilayer film 104 on at least one surface of a base material 102. The dielectric multilayer film 104 can be properly selected from a wavelength-selective reflection film which has the property of reflecting visible rays and a part of near-infrared rays, an antireflection film which suppresses reflection of rays in the region from the visible to the light passband (Za), and a near-infrared rays reflecting film which reflects near-infrared rays on a longer wavelength side than the light passband (Za), according to the optical properties of the base material (i). For example, when the base material (i) has sufficient visible light cutting performance, no problems may be caused in terms of use even when a dielectric multilayer film which reflects visible rays (which has an appearance like a mirror) is not used, and a dielectric multilayer film which suppresses of reflection of visible rays may be preferred in terms of design (a black appearance can be kept). FIG. 1(B) shows an optical filter 100*b* including a dielectric multilayer film 104 on both surfaces of a base material 102. The dielectric multilayer film may be thus provided on one surface of the base material, or may be provided on both surfaces thereof. When the dielectric multilayer film is provided on one surface, production cost and ease of production are excellent, and when the dielectric multilayer film is provided on both surfaces, an optical filter having high strength and rarely suffering warpage and distortion can be obtained. When the optical filter is applied to uses such as an optical sensor device, warpage and distortion of the optical filter are preferably smaller, and therefore, it is preferable to provide the dielectric multilayer film on both surfaces of the base material.

The dielectric multilayer film 104 preferably has reflection characteristics of rays other than rays in the wavelength region for use in near-infrared sensing, among rays incident at an angle of 5° to the perpendicular direction. For example, when rays with a wavelength of about 850 nm are used for near-infrared sensing, the dielectric multilayer film preferably has reflection characteristics against rays with wavelengths of about 400 to 750 nm and about 950 to 1150 nm, particularly preferably has reflection characteristics against rays with wavelengths of about 380 to 780 nm and about 920 to 1200 nm. It is noted that rays on a longer wavelength side than the wavelength region for use in near-infrared sensing may be cut by another optical filter (for example, Shortwave Pass Filter) according to the configuration of an optical sensor device and, when the optical filter of the present invention is applied to a sensor thus configured, the dielectric multilayer film 104 is not necessarily required to have reflection characteristics against rays on a longer wavelength side than the wavelength region for use in near-infrared sensing.

Examples of a form where the dielectric multilayer film is provided on both surfaces of the base material 102 include forms (B-1) to (B-3) shown in FIG. 1(B).

(B-1) is a form where a first dielectric multilayer film 104*a* having reflection characteristics mainly on a shorter wavelength side (also referred to as "wavelength region 1", hereinafter) than the wavelength region for use in near-infrared sensing, in measurement at an angle of 5° to the perpendicular direction of the optical filter (or the base material), is provided on one surface of the base material 102, and a second dielectric multilayer film 104*b* having reflection characteristics mainly on a longer wavelength side (also referred to as "wavelength region 2", hereinafter) than the wavelength region for use in near-infrared sensing, in measurement at an angle of 5° to the perpendicular direction of the optical filter (or the base material), is provided on the other surface of the base material 102.

(B-2) is a form where the first dielectric multilayer film 104*a* is provided on both surfaces of the base material 102.

(B-3) is a form where a third dielectric multilayer film 104*c* having reflection characteristics mainly in the wavelength region of not more than 550 nm in the wavelength region 1, in measurement at an angle of 5° to the perpendicular direction of the optical filter (or the base material), is provided on one surface of the base material 102, and a fourth dielectric multilayer film 104*d* having reflection characteristics mainly in the wavelength region of not less than 550 nm in the wavelength region 1, in measurement at an angle of 5° to the perpendicular direction of the optical filter (or the base material), is provided on the other surface of the base material 102.

A form of an optical filter 100*c* shown in FIG. 1(C) is as follows: a dielectric multilayer film 104 having reflection characteristics mainly in the region of visible rays and a part of near-infrared rays, specifically, in a region other than the wavelength region for use in near-infrared sensing, in measurement at an angle of 5° to the perpendicular direction of the optical filter (or the base material), is provided on one surface of a base material 102, and an antireflection film 106 having antireflection characteristics in the wavelength region for use in near-infrared sensing is provided on the other surface of the base material 102. When the base material has sufficient absorption characteristics on the entire shorter wavelength side (for example, the wavelength region of 380 to 750 nm) than the wavelength region for use in near-infrared sensing, a form can be taken where a second dielectric multilayer film 104*b* having reflection characteristics mainly in the wavelength region 2, in measurement at an angle of 5° to the perpendicular direction of the optical filter (or the base material), is provided on one surface of the base material 102, and an antireflection film 106 having antireflection characteristics in the wavelength region for use in near-infrared sensing is provided on the other surface of the base material 102. The dielectric multilayer film and the antireflection film are provided in combination on the base material, whereby not only the transmittance in the wavelength region for use in near-infrared sensing can be enhanced, but also rays unnecessary for sensing can be reflected.

A form of an optical filter 100*d* shown in FIG. 1(D) is as follows: an antireflection film 106*a* having antireflection characteristics in the visible region and the wavelength region for use in near-infrared sensing is provided on both surfaces of the optical filter (or base material). When the base material (i) has sufficient absorption properties in the visible region, the dielectric multilayer film is not necessarily required to have reflection characteristics in the visible region, and a dielectric multilayer film having antireflection characteristics in both the visible region and the wavelength region for use in near-infrared sensing can be favorably used.

The thickness of the optical filter has only to be properly selected according to the desired use, but it is preferably smaller according to the recent trend toward reduction in thickness and weight and so on of an information terminal. In particular, it is very important for use in an optical sensor device that favorable optical properties (transmission properties of sensing rays, and cut characteristics of unnecessary rays) and reduction in thickness be compatible with one another, and the optical filter of the present invention can be applied to thereby allow these properties to be compatible with one another at a level unattainable by a conventional product.

The thickness of the optical filter of the present invention is preferably not more than 180 μm, more preferably not more than 160 μm, still more preferably not more than 150 μm, particularly preferably not more than 120 μm. The lower limit is not specifically restricted, but is desirably, for example, 20 μm in consideration of strength and handleability of the optical filter.

[Base Material]

FIGS. 2(A) to 2(C) show configuration examples of the base material (i). A base material (i)102 may include a transparent resin layer containing at least one compound (Z) having an absorption maximum in the wavelength region of 700 to 930 nm, and may be a single-layer base material or a multilayer base material.

Hereinafter, a resin layer containing at least one compound (Z) and a transparent resin is also referred to as a "transparent resin layer", and a resin layer other than that is also referred to as a "resin layer" simply.

FIG. 2(A) shows a base material (i)102a having a singly-layer structure formed of a transparent resin substrate (ii)108 containing a compound (Z). The transparent resin substrate (ii) corresponds to the above-mentioned transparent resin layer. FIG. 2(B) shows a base material (i)102b having a multilayer structure, and examples of a mode of the structure include a configuration in which a resin layer 112 such as an overcoat layer formed of a curable resin or a thermoplastic resin containing a compound (Z) is laminated on a support 110 such as a glass support or a resin support that becomes a base. A layer corresponding to the resin layer 112 may be provided on both surfaces of the support 110. FIG. 2(C) shows a base material (i)102c in which a resin layer 112 such as an overcoat layer formed of a curable resin or the like containing a compound (Z) is laminated on a transparent resin substrate (ii)108 containing a compound (Z).

When the base material (i) includes a glass support, the glass support is preferably a colorless and transparent glass substrate including no absorbing agent, from the viewpoint of strength of the base material (i) and a transmittance in the near-infrared wavelength region. Fluorophosphate glass containing copper as an absorbing agent not only tends to cause deterioration in base material strength, but also causes deterioration in transmittance in the near-infrared wavelength region, not enabling near-infrared sensing to be performed at good sensitivity in some cases.

When the base material (i) includes a resin support, a form is particularly preferable where a resin layer such as an overcoat layer formed of a curable resin or a thermoplastic resin is laminated on both surfaces of the resin support and at least one of such resin layers contains a compound (Z), from the viewpoint of ease of adjustment of optical properties, as well as achievability of the effect of removing flaws of the resin support and an enhancement in flaw resistance of the base material.

The base material (i) particularly preferably includes a transparent resin substrate (ii) containing a compound (Z). Such a base material (i) is used, whereby reduction in thickness and cracking resistance are compatible with one another, and such a base material can be favorably used for an optical sensor device.

The base material (i) desirably satisfies at least one of the following conditions (i-1) to (i-3).

(i-1) The minimum transmittance (Ta) measured in the perpendicular direction of the base material (i) in the wavelength region of 700 to 930 nm is preferably not more than 30%, more preferably not more than 20%, still more preferably not more than 10%, particularly preferably not more than 5%.

(i-2) The shortest wavelength (Xf) at which a transmittance measured in the perpendicular direction of the base material (i), in the wavelength region of not less than 700 nm, is from less than 50% to not less than 50% is preferably 750 to 970 nm, more preferably 770 to 950 nm, still more preferably 780 to 940 nm, particularly preferably 790 to 930 nm.

(i-3) The maximum transmittance (Tb) measured in the perpendicular direction of the base material (i), in the wavelength region of 780 to 1000 nm, is preferably not less than 60%, still more preferably not less than 70%, particularly preferably not less than 80%.

When the transmittance (Ta), the wavelength (Xf) and the transmittance (Tb) of the base material (i) are in the above ranges, not only a sufficient transmittance is secured in the wavelength region for use in near-infrared sensing, but also unnecessary near-infrared rays in the vicinity of the wavelength region can be selectively efficiently cut, and a near-infrared rays S/N ratio for sensing can be enhanced and furthermore the incident angle dependence of optical properties on the shorter wavelength side in the light passband (Za) can be reduced in formation of the dielectric multilayer film on the base material (i).

The thickness of the base material (i) is desirably selected so that strength of the base material and reduction in thickness are compatible with one another, and it is preferably 10 to 180 μm, more preferably 10 to 160 μm, still more preferably 15 to 150 μm, particularly preferably 20 to 120 μm. When the thickness of the base material (i) is in the above range, an optical filter using the base material (i) can be reduced in thickness and weight, and can be favorably used in various applications, for example, particularly an optical sensor device to be mounted to mobile equipment.

<Compound (Z)>

The compound (Z) is not specifically restricted provided that it is a compound having an absorption maximum in the wavelength region of 700 to 930 nm. This compound is preferably a solvent-soluble type dye compound, and is more preferably at least one kind selected from the group consisting of a squarylium-based compound, a phthalocyanine-based compound, a cyanine-based compound, a naphthalocyanine-based compound, a pyrrolopyrrole-based compound, a croconium-based compound, a hexaphyrin-based compound, a metal dithiolate-based compound and a ring-expanded BODIPY (boron dipyromethene)-based compound, further preferably at least one kind selected from the group consisting of a squarylium-based compound, a cyanine-based compound, a croconium-based compound, a phthalocyanine-based compound, a naphthalocyanine-based compound and a pyrrolopyrrole-based compound, particularly preferably a squarylium-based compound represented by the following formula (Z). By the use of such a compound (Z), efficient light cut characteristics and a steep spectral shape near the absorption maximum wavelength can be attained at the same time.

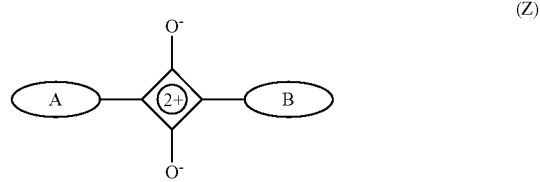

(Z)

In the formula (Z), substitution units A and B are each independently any of substitution units represented by the following formulae (I) to (III).

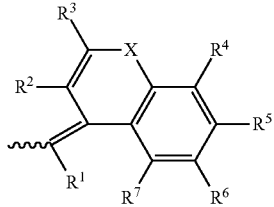
(I)

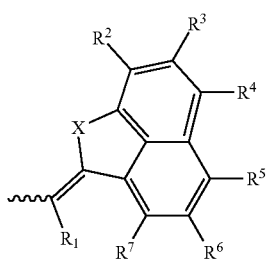
(II)

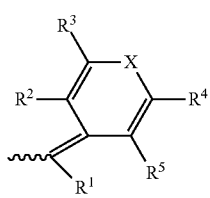
(III)

In the formulae (I) to (III), a site represented by a wavy line is a binding site to a central 4-membered ring, each X is independently an oxygen atom, a sulfur atom, a selenium atom, a tellurium atom or —$NR^8$—, $R^1$ to $R^8$ are each independently a hydrogen atom, a halogen atom, a sulfo group, a hydroxyl group, a cyano group, a nitro group, a carboxy group, a phosphoric acid group, a —$NR^gR^h$ group, a —$SR^i$ group, a —$SO_2R^i$ group, a —$OSO_2R^i$ group or any one of the following $L^a$ to $L^h$, $R^g$ and $R^h$ are each independently a hydrogen atom, a —$C(O)R^i$ group or any one of the following $L^a$ to $L^e$, and $R^i$ is any one of the following $L^a$ to $L^e$, ($L^a$) an aliphatic hydrocarbon group of 1 to 12 carbon atoms
($L^b$) a halogen-substituted alkyl group of 1 to 12 carbon atoms
($L^c$) an alicyclic hydrocarbon group of 3 to 14 carbon atoms
($L^d$) an aromatic hydrocarbon group of 6 to 14 carbon atoms
($L^e$) a heterocyclic group of 3 to 14 carbon atoms
($L^f$) an alkoxy group of 1 to 12 carbon atoms
($L^g$) an acyl group of 1 to 12 carbon atoms, which may have a substituent L,
($L^h$) an alkoxycarbonyl group of 1 to 12 carbon atoms, which may have a substituent L, and the substituent L is at least one kind selected from the group consisting of an aliphatic hydrocarbon group of 1 to 12 carbon atoms, a halogen-substituted alkyl group of 1 to 12 carbon atoms, an alicyclic hydrocarbon group of 3 to 14 carbon atoms, an aromatic hydrocarbon group of 6 to 14 carbon atoms and a heterocyclic group of 3 to 14 carbon atoms.

The $R^i$ is preferably a hydrogen atom, a chlorine atom, a fluorine atom, a methyl group, an ethyl group, a n-propyl group, an isopropyl group, a n-butyl group, a sec-butyl group, a tert-butyl group, a cyclohexyl group, a phenyl group, a hydroxyl group, an amino group, a dimethylamino group, or a nitro group, and is more preferably a hydrogen atom, a chlorine atom, a fluorine atom, a methyl group, an ethyl group, a n-propyl group, an isopropyl group, or a hydroxyl group.

The $R^2$ to $R^7$ are each independently preferably a hydrogen atom, a chlorine atom, a fluorine atom, a methyl group, an ethyl group, a n-propyl group, an isopropyl group, a n-butyl group, a sec-butyl group, a tert-butyl group, a cyclohexyl group, a phenyl group, a hydroxyl group, an amino group, a dimethylamino group, cyano group, a nitro group, a methoxy group, an ethoxy group, a n-propoxy group, a n-butoxy group, an acetylamino group, a propionylamino group, an N-methylacetylamino group, a trifluoromethanoylamino group, a pentafluoroethanoylamino group, a t-butanoylamino group, a cyclohexynoylamino group, a n-butylsulfonyl group, a methylthio group, an ethylthio group, a n-propylthio group, or a n-butylthio group, and is more preferably a hydrogen atom, a chlorine atom, a fluorine atom, a methyl group, an ethyl group, a n-propyl group, an isopropyl group, a tert-butyl group, a hydroxyl group, a dimethylamino group, a methoxy group, an ethoxy group, an acetylamino group, a propionylamino group, a trifluoromethanoylamino group, a pentafluoroethanoylamino group, a t-butanoylamino group, a cyclohexynoylamino group, a methylthio group, or an ethylthio group.

The $R^8$ is preferably a hydrogen atom, a methyl group, an ethyl group, a n-propyl group, an isopropyl group, a n-butyl group, a sec-butyl group, a ten-butyl group, a cyclohexyl group, a n-pentyl group, a n-hexyl group, a n-heptyl group, a n-octyl group, a n-nonyl group, a n-decyl group, or a phenyl group, and is more preferably a hydrogen atom, a methyl group, an ethyl group, a n-propyl group, an isopropyl group, a n-butyl group, a tert-butyl group, or a n-decyl group.

The X is preferably an oxygen atom, a sulfur atom, or —$NR^8$—, and is particularly preferably an oxygen atom or a sulfur atom in a substitution unit in formulae (I) and (III), and —$NR^8$— in a substitution unit in formula (II).

A structure of the squarylium-based compound can be represented also by such descriptive means as have resonance structures, such as the following formula (Z2), in addition to the descriptive means such as the following formula (Z1). That is to say, a difference between the following formula (Z1) and the following formula (Z2) is only descriptive means for the structures, and both of them represent the same compound. In the present invention, the structure of the squarylium-based compound is represented by descriptive means such as the following formula (Z1) unless otherwise noted.

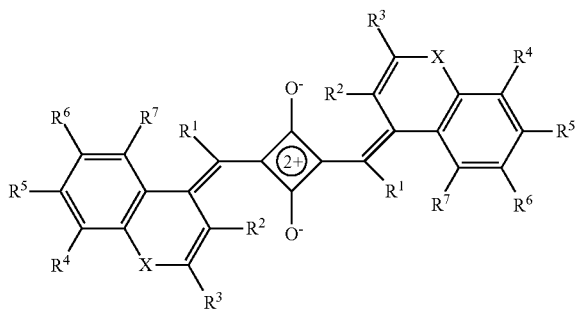

(Z1)

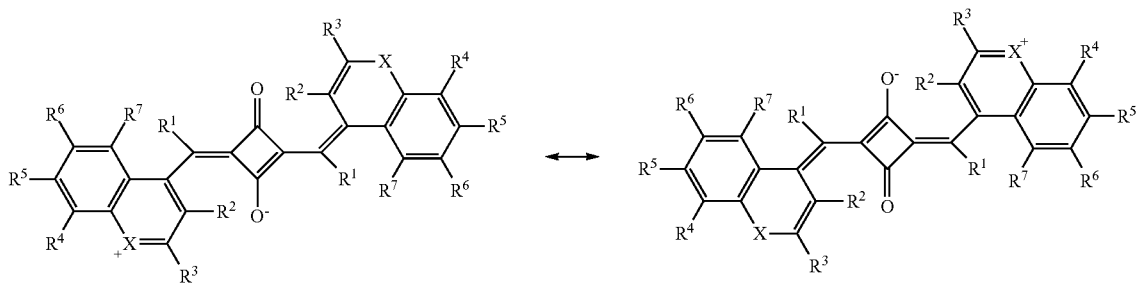

(Z2)

Furthermore, for example, a compound represented by the following formula (Z1) and a compound represented by the following formula (Z3) can be regarded as identical with each other.

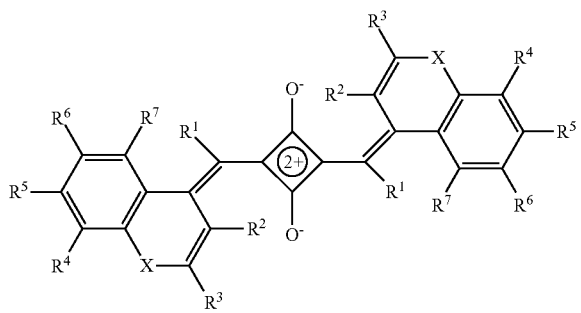

(Z1)

-continued

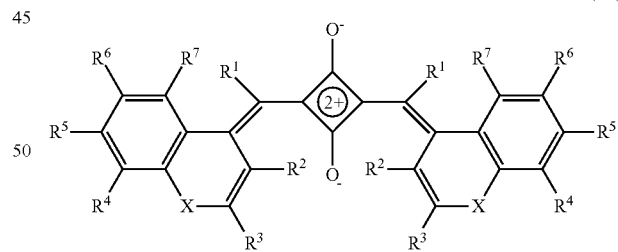

(Z3)

In compounds represented by formula (Z), the units which are bonded to the central 4-membered ring and are on the right-hand side and the left-hand side thereof may be the same or different, provided that each unit is represented by formula (I), formula (II) or formula (III), but the units, including substituents, are preferably the same as each other because of ease of synthesis. That is to say, compounds represented by the following formulae (IV) to (VI), among the compounds represented by formula (Z), are preferable.

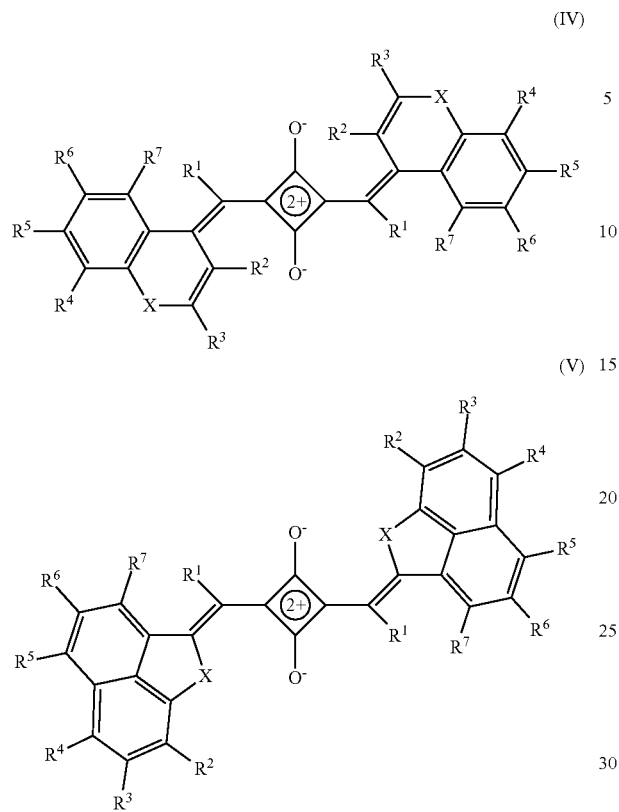

(IV)

(V)

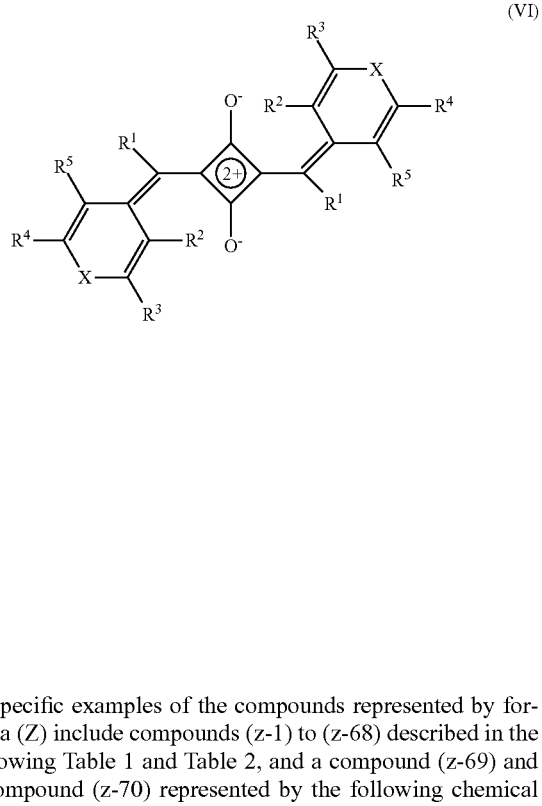

(VI)

Specific examples of the compounds represented by formula (Z) include compounds (z-1) to (z-68) described in the following Table 1 and Table 2, and a compound (z-69) and a compound (z-70) represented by the following chemical formulae.

TABLE 1

| Compound | Structure | X | $R^1$ | $R^2$ | $R^3$ | $R^4$ | $R^5$ | $R^6$ | $R^7$ | $R^8$ |
|---|---|---|---|---|---|---|---|---|---|---|
| (Z-1) | Formula (IV) | O | H | H | H | H | H | H | H | — |
| (Z-2) | | S | H | H | Me | H | H | H | H | — |
| (Z-3) | | Se | H | H | Me | H | H | H | H | — |
| (Z-4) | | —$NR^8$— | Me | H | H | H | H | H | H | H |
| (Z-5) | | O | H | H | t-Bu | H | H | H | H | — |
| (Z-6) | | O | Me | H | Et | H | H | H | H | — |
| (Z-7) | | S | H | H | t-Bu | H | Me | H | H | — |
| (Z-8) | | O | H | H | i-Bu | H | H | Me | H | — |
| (Z-9) | | Se | H | Me | i-Pr | H | H | cyclohexyl | H | — |
| (Z-10) | | S | Me | Me | Me | H | H | H | Me | — |
| (Z-11) | | O | H | H | t-Bu | H | H | i-Pr | H | — |
| (Z-12) | | O | H | H | cyclohexyl | H | Me | H | Me | — |
| (Z-13) | | —$NR^8$— | H | H | t-Bu | H | morpholino | H | H | Me |
| (Z-14) | | O | H | H | t-Bu | H | morpholino | H | H | — |

TABLE 1-continued

| Compound | Structure | X | R¹ | R² | R³ | R⁴ | R⁵ | R⁶ | R⁷ | R⁸ |
|---|---|---|---|---|---|---|---|---|---|---|
| (Z-15) | | S | H | H | t-Bu | H | 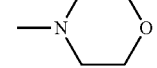 | H | H | — |
| (Z-16) | | O | H | H | t-Bu | H | Me | Me | H | — |
| (Z-17) | | S | Et | H | Et | Me | —N(CH₂CH₃) | H | H | — |
| (z-18) | | O | H | H | i-Pr | H | H |  | H | — |
| (Z-19) | | O | H | H | t-Bu | Me | H | Me | H | — |
| (Z-20) | | O | Me | H | Me | H |  | H | H | — |
| (Z-21) | | S | H | H | t-Bu | 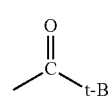 | H | H | H | — |
| (Z-22) | | O | H | H | t-Bu | H | H | Cl | H | — |
| (Z-23) | | O | H | H | t-Bu | H | Me | Cl | H | — |
| (Z-24) | | O | H | H | t-Bu | Cl | H | t-Bu | H | — |
| (Z-25) | | O | H | H | t-Bu | Cl | H | i-Pr | H | — |
| (Z-26) | | Te | Me | H | F | H | H | t-Bu | H | — |
| (Z-27) | | S | H | H | t-Bu | H | H | i-Pr | H | — |
| (Z-28) | | S | H | H | t-Bu | Cl | H | t-Bu | H | — |
| (Z-29) | | S | H | Cl | t-Bu | H | H | t-Bu | H | — |
| (Z-30) | | O | H | H | t-Bu | H | 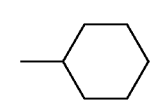 | F | H | — |
| (Z-31) | | O | H | H | t-Bu | H | H | 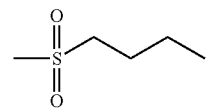 | H | — |
| (Z-32) | | —NR⁸— | H | H | t-Bu | H | Et | 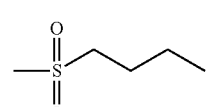 | t-Bu | n-Bu |
| (Z-33) | | O | H | H | i-Pr | H | Me | 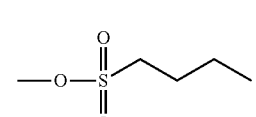 | H | — |
| (Z-34) | | S | H | Et | t-Bu | H | H | 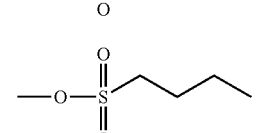 | H | — |
| (Z-35) | | S | H | H | t-Bu | H | H | —OMe | H | — |
| (Z-36) | | S | H | H | t-Bu | Me | H | —OEt | H | — |
| (Z-37) | | —NR⁸— | H | H | t-Bu | H | H | t-Bu | H | n-Bu |
| (Z-38) | | S | H | H | i-Pr | H | H | Cl | Me | — |
| (Z-39) | | S | H | H | t-Bu | H | H | —SMe | H | — |
| (Z-40) | | S | H | H | 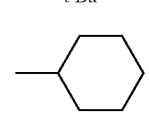 | H | H | —SEt | H | — |

TABLE 2

| Compound | Structure | X | R¹ | R² | R³ | R⁴ | R⁵ | R⁶ | R⁷ | R⁸ |
|---|---|---|---|---|---|---|---|---|---|---|
| (Z-41) | Formula (V) | O | H | H | H | H | H | H | H | — |
| (Z-42) | | —NR⁸— | H | H | Me | Me | H | H | H | H |
| (Z-43) | | S | H | H | t-Bu | H | Me | H | H | — |
| (Z-44) | | —NR⁸— | H | H | H | H | H | H | H | n-Bu |
| (Z-45) | | —NR⁸— | H | H | H | H | H | H | H | —C₉H₁₈CH₃ |
| (Z-46) | | O | Me | H | H | H | H | Cl | H | — |
| (Z-47) | | —NR⁸— | H | H | i-Pr | H | H | H | H | n-Pr |
| (Z-48) | | O | H | Et | H | H | H | Me | Cl | — |
| (Z-49) | | S | H | H | t-Bu | H | H | 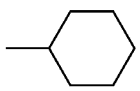 | H | — |
| (Z-50) | | —NR⁸— | H | H | t-Bu | H | H | 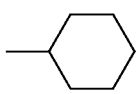 | H | —C₉H₁₈CH₃ |
| (Z-51) | | O | Et | H | H | F | H | i-Pr | H | — |
| (Z-52) | | —NR⁸— | H | H | 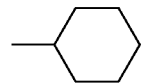 | H | Me | H | Me | t-Bu |
| (Z-53) | | —NR⁸— | H | H | t-Bu | H | 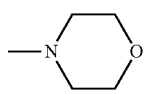 | H | H | n-Bu |
| (Z-54) | | —NR⁸— | H | H | i-Pr | H | H | 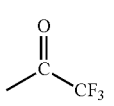 | H | —C₉H₁₈CH₃ |
| (Z-55) | | O | H | H | t-Bu | 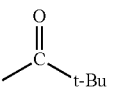 | H | Me | H | — |
| (Z-56) | | —NR⁸— | Me | H | Me | H | 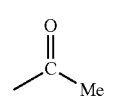 | H | H | Et |
| (Z-57) | | —NR⁸— | H | H | H | H | H | —OMe | H | —C₉H₁₈CH₃ |
| (Z-58) | | —NR⁸— | H | H | H | H | H | —SMe | H | —C₉H₁₈CH₃ |
| (Z-59) | Formula (VI) | O | H | H | H | H | H | — | — | — |
| (Z-60) | | O | H | H | t-Bu | t-Bu | H | | | |
| (Z-61) | | O | Cl | H | 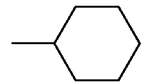 |  | H | | | |
| (Z-62) | | S | H | H | i-Pr | i-Pr | H | | | |
| (Z-63) | | S | H | H | t-Bu | t-Bu | H | | | |
| (Z-64) | | S | Me | H | t-Bu | t-Bu | H | | | |
| (Z-65) | | S | Me | Me | t-Bu | t-Bu | Me | | | |
| (Z-66) | | —NR⁸— | H | H | i-Pr | i-Pr | H | — | — | n-Bu |
| (Z-67) | | —NR⁸— | H | H | 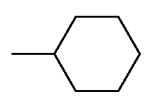 |  | H | — | — | t-Bu |
| (Z-68) | | —NR⁸— | Me | H | t-Bu | t-Bu | H | — | — | Et |

(z-69)
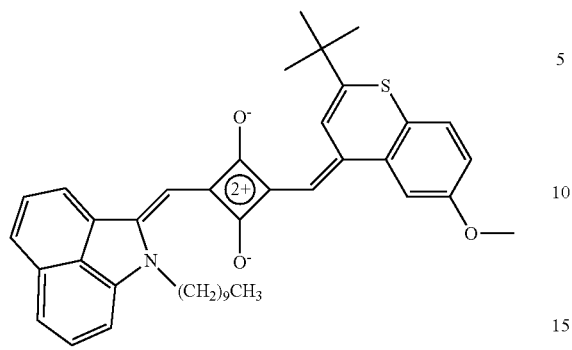
(z-70)
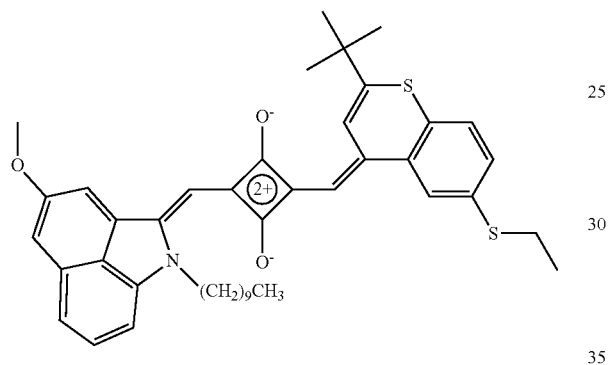
The squarylium-based compound, the cyanine-based compound and the pyrrolopyrrole-based compound other than the squarylium-based compound represented by the formula (Z) are not specifically restricted, provided that these compounds have an absorption maximum in the wavelength region of 700 to 900 nm, and examples include the following compounds (z-71) to (z-74).
(z-71)
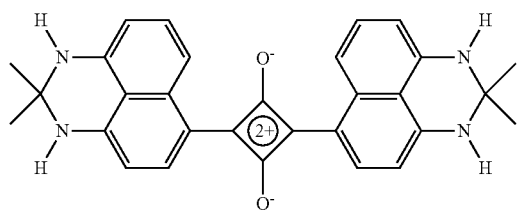
(z-72)
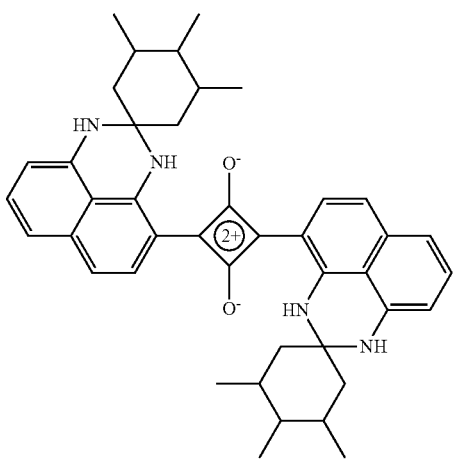

-continued

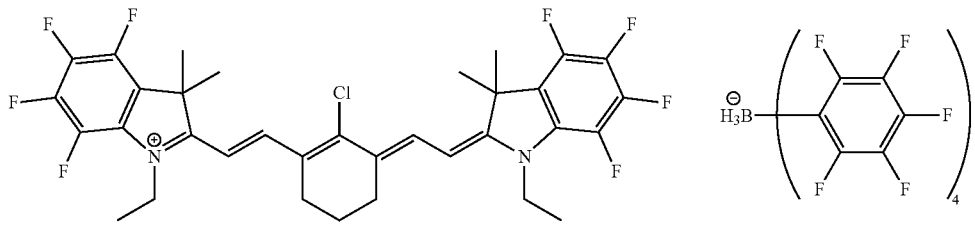

(z-73)

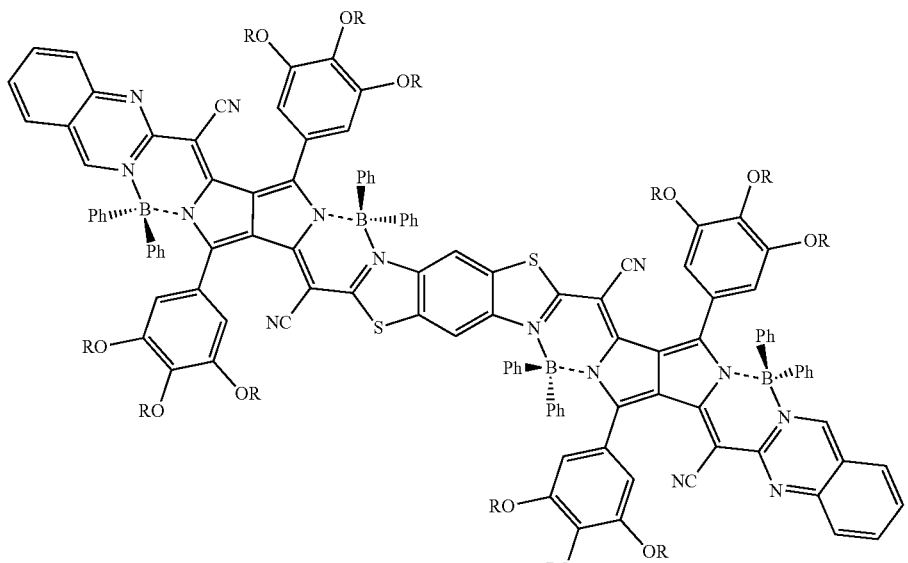

(z-74)

R = -(CH₂)₉CH₃

The absorption maximum wavelength of the compound (Z) is 700 to 930 nm, preferably 720 to 920 nm, still more preferably not less than 730 nm but not more than 900 nm, particularly preferably not less than 750 mu but not more than 890 mu. When the absorption maximum wavelength of the compound (Z) is in the above range, unnecessary near-infrared rays can be cut while rays in the wavelength region useful for near-infrared sensing being transmitted, and the incident angle dependence of the near-infrared rays passband can be reduced.

The compound (Z) may be synthesized by a commonly known method, and can be synthesized with reference to any method described in, for example, Japanese Patent Laid-Open Publication No. H01(1989)-228960, Japanese Patent Laid-Open Publication No. 2001-40234, Japanese Patent No. 3094037, and Japanese Patent No. 3196383.

For example, when a base material formed of a transparent resin substrate (ii) containing the compound (Z), or a base material in which a resin layer such as an overcoat layer formed of a curable resin is laminated on a transparent resin substrate (ii) is used as the base material (i), the content of the compound (Z) is preferably 0.01 to 2.0 parts by weight, more preferably 0.02 to 1.5 parts by weight, particularly preferably 0.03 to 1.0 parts by weight based on 100 parts by weight of the transparent resin. For example, when a base material in which a transparent resin layer such as an overcoat layer formed of a curable resin containing the compound (Z) is laminated on a glass support or a resin support that becomes a base is used as the base material (i), the content of the compound (Z) is preferably 0.1 to 5.0 parts by weight, more preferably 0.2 to 4.0 parts by weight, particularly preferably 0.3 to 3.0 parts by weight based on 100 parts by weight of the resin forming the transparent resin layer containing the compound (Z). When the content of the compound (Z) is in the above range, favorable near-infrared rays absorption properties can be achieved.

<Compound (S)>

The base material (i) preferably contains, in addition to the compound (Z), a compound (S) having an absorption maximum in the wavelength region of 350 to 699 nm, and a layer containing the compound (S) may be the same as or different from a layer containing the compound (Z). When the compound (S) and the compound (Z) are contained in the same layer, configuration examples include a configuration where the transparent resin substrate (ii) contains the compound (S) and a configuration where a transparent resin layer such as an overcoat layer formed of a curable resin containing the compound (S) and the compound (Z) is laminated on a glass support or a resin support that becomes a base. When the compound (S) and the compound (Z) are contained in different layers, configuration examples include a configuration where a transparent resin layer such as an overcoat layer formed of a curable resin containing the compound (S) is laminated on the transparent resin substrate (ii), a configuration where a transparent resin layer such as an overcoat layer formed of a curable resin containing the compound (S) is laminated on a transparent resin substrate (iii) containing the compound (S), and a configuration where the transparent resin substrate (ii) and the transparent resin substrate (iii) are bonded to each other. A configuration where the transparent resin substrate (ii) contains the compound (S) is particularly preferable from the viewpoint of ease of adjustment of optical properties and the production cost.

The compound (S) is not specifically restricted provided that it is a compound having an absorption maximum in the wavelength region of 350 to 699 nm. From the viewpoint of heat resistance of the optical filter, it is preferable that at least one compound (S-a) having an absorption maximum in the wavelength region of 350 to 500 nm, at least one compound (S-b) having an absorption maximum in the wavelength region of 501 to 600 nm and at least one compound (S-c) having an absorption maximum in the wavelength region of 601 to 699 nm be contained and it is particularly preferable that a difference in absorption maximum wavelength between the compound (S-a) and the compound (S-b) be 50 to 140 nm and a difference in absorption maximum wavelength between the compound (S-b) and the compound (S-c) be 30 to 100 nm. When the compound (S) is contained in the resin layer, the compound (S) may not only act as an absorbing agent in the visible region, but also act as a plasticizer of the resin layer to reduce the glass transition temperature of the resin layer, resulting in deterioration of heat resistance of the optical filter. On the other hand, when the compound (S) includes the compound (S-a), the compound (S-b) and the compound (S-c) satisfying the above conditions, even a small amount of the compound (S) added can allow unnecessary visible rays to be efficiently cut, and can minimize reduction in the glass transition temperature of the resin layer.

The compound (S) is preferably a solvent-soluble type dye compound, and is more preferably at least one kind selected from the group consisting of a squarylium-based compound, a phthalocyanine-based compound, a cyanine-based compound, a methine-based compound, a tetraaza porphyrin-based compound, a porphyrin-based compound, a triarylmethane-based compound, a subphthalocyanine-based compound, a perylene-based compound, a semi-squarylium-based compound, a styryl-based compound, a phenazine-based compound, a pyridomethene-boron complex-based compound, a pyrazine-boron complex-based compound, a pyridone azo-based compound, a xanthene-based compound and a BODIPY (borondipyromethene)-based compound, particularly preferably at least one kind selected from the group consisting of a squarylium-based compound, a phthalocyanine-based compound, a cyanine-based compound, a methine-based compound, a triarylmethane-based compound, a xanthene-based compound and a pyridone azo-based compound.

As commercial products of the compound (S), common visible light absorbing dyes and visible light absorbing pigments can be mentioned. Visible light absorbing dyes tend to be more excellent in visible light cutting efficiency and thus are more preferable. Commercial products of the compound (S) are not specifically restricted provided that these have an absorption maximum in the wavelength region of 350 to 699 nm, and examples include C.I. Solvent Yellow 14, C.I. Solvent Yellow 16, C.I. Solvent Yellow 21, C.I. Solvent Yellow 61, C.I. Solvent Yellow 81, C.I. Disperse Orange 3, C.I. Disperse Orange 11, C.I. Disperse Orange 35, C.I. Disperse Orange 37, C.I. Disperse Orange 47, C.I. Disperse Orange 61, C.I. Solvent Red 1, C.I. Solvent Red 2, C.I. Solvent Red 8, C.I. Solvent Red 12, C.I. Solvent Red 19, C.I. Solvent Red 23, C.I. Solvent Red 24, C.I. Solvent Red 27, C.I. Solvent Red 31, C.I. Solvent Red 83, C.I. Solvent Red 84, C.I. Solvent Red 121, C.I. Solvent Red 132, C.I. Solvent Violet 21, C.I. Solvent Black 3, C.I. Solvent Black 4, C.I. Solvent Black 21, C.I. Solvent Black 23, C.I. Solvent Black 27, C.I. Solvent Black 28, C.I. Solvent Black 31, C.I. Solvent Orange 7, C.I. Solvent Orange 9, C.I. Solvent Orange 37, C.I. Solvent Orange 40, C.I. Solvent Orange 45, C.I. Solvent Red 52, C.I. Solvent Red 111, C.I. Solvent Red 149, C.I. Solvent Red 150, C.I. Solvent Red 151, C.I. Solvent Red 168, C.I. Solvent Red 191, C.I. Solvent Red 207, C.I. Solvent Blue 7, C.I. Solvent Blue 35, C.I. Solvent Blue 36, C.I. Solvent Blue 63, C.I. Solvent Blue 78, C.I. Solvent Blue 83, C.I. Solvent Blue 87, C.I. Solvent Blue 94, C.I. Solvent Blue 97, C.I. Solvent Green 3, C.I. Solvent Green 20, C.I. Solvent Green 28, C.I. Solvent Violet 13, C.I. Solvent Violet 14, C.I. Solvent Violet 36, C.I. Solvent Orange 60, C.I. Solvent Orange 78, C.I. Solvent Orange 90, C.I. Solvent Violet 29, C.I. Solvent Red 135, C.I. Solvent Red 162, C.I. Solvent Orange 179, C.I. Solvent Green 5, C.I. Solvent Orange 55, C.I. Vat Red 15, C.I. Vat Orange 7, C.I. Solvent Orange 80, C.I. Solvent Yellow 93, C.I. Solvent Yellow 33, C.I. Solvent Yellow 98, C.I. Solvent Yellow 157, C.I. Solvent Black 5, and C.I. Solvent Black 7.

For example, when a base material formed of a transparent resin substrate (ii) containing the compound (Z) and the compound (S) or a transparent resin substrate (iii) containing the compound (S), or a base material in which a resin layer such as an overcoat layer formed of a curable resin is laminated on a transparent resin substrate (iii) is used as the base material (i), the content of the compound (S) is preferably 0.10 to 5.0 parts by weight, more preferably 0.25 to 3.5 parts by weight, particularly preferably 0.50 to 2.0 parts by weight based on 100 parts by weight of the transparent resin. For example, when a base material in which a transparent resin layer such as an overcoat layer formed of a curable resin containing the compound (S) is laminated on a glass support or a resin support that becomes a base is used as the base material (i), the content of the compound (S) is preferably 1.0 to 30.0 parts by weight, more preferably 2.0 to 25.0 parts by weight, particularly preferably 3.0 to 20.0 parts by weight based on 100 parts by weight of the resin forming the transparent resin layer containing the compound (S). When the content of the compound (S) is in the above range, favorable near-infrared rays absorption properties can be achieved. In particular, when the base material (i) includes a transparent resin substrate (ii) containing the compound (Z) and the compound (S) and the content of the compound (S) is in the above range, reduction in the glass transition temperature of the transparent resin substrate (ii) can be suppressed, and an optical filter excellent heat resistance can be provided.

<Compound (Y)>

The compound (Y) is not specifically restricted provided that it is a compound having an absorption maximum on a longer wavelength side than the light passband (Za). This compound is preferably a solvent-soluble type dye compound, and is more preferably at least one kind selected from the group consisting of a squarylium-based compound, a phthalocyanine-based compound, a cyanine-based compound, a naphthalocyanine-based compound, a pyrrolopyrrole-based compound, a croconium-based compound, a hexaphyrin-based compound and a ring-expanded BODIPY (borondipyromethene)-based compound, particularly preferably at least one kind selected from the group consisting of a squarylium-based compound, a cyanine-based compound, a croconium-based compound and a pyrrolopyrrole-based compound. An absorption maximum wavelength of the compound (Y) is preferably from the wavelength (Xc)+10 nm to the wavelength (Xc)+100 nm, more preferably from the wavelength (Xc)+15 nm to the wavelength (Xc)+

90 nm, particularly preferably from the wavelength (Xc)+20 nm to the wavelength (Xc)+80 nm. When the compound (Y) has an absorption maximum in such a wavelength, such a case is preferable because the incident angle dependence can be reduced on the longer wavelength side of the light passband (Za) and more precise sensing performance can be achieved.

<Transparent Resin>

The transparent resin layer laminated on a resin support or a glass support and the transparent resin substrate (ii) can be formed using a transparent resin. Such a transparent resin may be used singly or two or more kinds.

The transparent resin is not specifically restricted as long as it does not impair the effect of the present invention. However, in order to form a film which ensures thermal stability and moldability into a film and on which a dielectric multilayer film can be formed through high-temperature deposition that is carried out at a deposition temperature of not lower than 100° C., there can be mentioned a resin preferably having a glass transition temperature (Tg) of 110 to 380° C., more preferably 115 to 370° C., still more preferably 120 to 360° C., particularly preferably 130 to 300° C. When the glass transition temperature of the resin is in the above range, a dielectric multilayer film can be formed by vapor deposition at a higher temperature when a resin substrate is adopted, and an optical filter excellent in crack resistance and weather resistance can be obtained.

When the transparent resin is used as a resin forming a transparent resin substrate (ii) containing the compound (S), a difference between the glass transition temperature of the transparent resin substrate (ii) and the glass transition temperature of the resin contained in the transparent resin substrate (ii) is preferably 0 to 10° C., more preferably 0 to 8° C., still more preferably 0 to 5° C. The compound (S) may act as a plasticizer of the resin layer as described above, but reduction in the glass transition temperature of the transparent resin substrate (ii) can be decreased by properly selecting the type and the amount of the compound (S), and an optical filter excellent in heat resistance and crack resistance is obtained.

As the transparent resin, a resin such that when a resin plate having a thickness of 0.1 mm is formed from the resin, the total light transmittance (JIS K7105) of the resin plate preferably becomes 75 to 95%, still more preferably 78 to 95%, particularly preferably 80 to 95%, can be used. When a resin having the total light transmittance in such a range is used, the resulting substrate exhibits good transparency as an optical film.

The weight-average molecular weight (Mw) of the transparent resin, as measured by gel permeation chromatography (GPC) method, is usually 15,000 to 350,000, preferably 30,000 to 250,000, in terms of polystyrene, and the number-average molecular weight (Mn) thereof is usually 10,000 to 150,000, preferably 20,000 to 100,000, in terms of polystyrene.

Examples of the transparent resins include cyclic (poly) olefin-based resins, aromatic polyether-based resins, polyimide-based resins, fluorene polycarbonate-based resins, fluorene polyester-based resins, polycarbonate-based resins, polyamide (aramid)-based resins, polyarylate-based resins, polysulfone-based resins, polyether sulfone-based resins, polyparaphenylene-based resins, polyamidoimide-based resins, polyethylene naphthalate (PEN)-based resins, fluorinated aromatic polymer-based resins, (modified) acrylic-based resins, epoxy-based resins, allyl ester-based curable resins, silsesquioxane-based ultraviolet curable resins, acrylic-based ultraviolet curable resins and vinyl-based ultraviolet curable resins.

<<Cyclic (Poly)Olefin-Based Resin>>

The cyclic (poly)olefin-based resin is preferably a resin obtained from at least one monomer selected from the group consisting of a monomer represented by the following formula $(X_0)$ and a monomer represented by the following formula $(Y_0)$, or a resin obtained by hydrogenating the resin thus obtained.

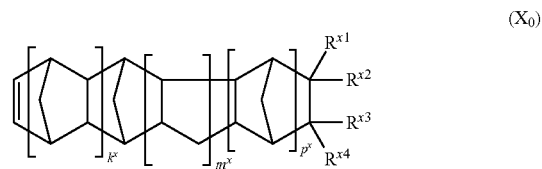

$(X_0)$

In the formula $(X_0)$, $R^{x1}$ to $R^{x4}$ are each independently an atom or a group selected from the following (i') to (ix'), and $k^x$, $m^x$ and $p^x$ are each independently 0 or a positive integer.

(i') a hydrogen atom (ii') a halogen atom (iii') a trialkylsilyl group (iv') a substituted or unsubstituted hydrocarbon group of 1 to 30 carbon atoms, which has a linking group containing an oxygen atom, a sulfur atom, a nitrogen atom or a silicon atom (v') a substituted or unsubstituted hydrocarbon group of 1 to 30 carbon atoms (vi') a polar group (except (iv'))

(vii') an alkylidene group formed by bonding of $R^{x1}$ and $R^{x2}$ or $R^{x3}$ and $R^{x4}$ to each other ($R^{x1}$ to $R^{x4}$ which do not take part in the bonding are each independently an atom or a group selected from the above (i') to (vi').)

(viii') a monocyclic or polycyclic hydrocarbon ring or heterocyclic ring formed by bonding of $R^{x1}$ and $R^{x2}$ or $R^{x3}$ and $R^{x4}$ to each other ($R^{x1}$ to $R^{x4}$ which do not take part in the bonding are each independently an atom or a group selected from the above (i') to (vi').)

(ix') a monocyclic hydrocarbon ring or heterocyclic ring formed by bonding of $R^{x2}$ and $R^{x3}$ to each other ($R^{x1}$ to $R^{x4}$ which do not take part in the bonding are each independently an atom or a group selected from the above (i') to (vi').)

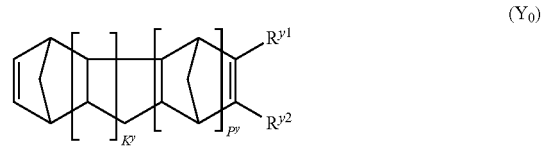

$(Y_0)$

In the formula $(Y_0)$, $R^{y1}$ and $R^{y2}$ are each independently an atom or a group selected from the aforesaid (i') to (vi') or represent a monocyclic or polycyclic alicyclic hydrocarbon, aromatic hydrocarbon or heterocyclic ring, which is formed by bonding of $R^{y1}$ and $R^{y2}$ to each other, and $k^y$ and $p^y$ are each independently 0 or a positive integer.

<<Aromatic Polyether-Based Resin>>

The aromatic polyether-based resin preferably has at least one structural unit selected from the group consisting of a structural unit represented by the following formula (1) and a structural unit represented by the following formula (2).

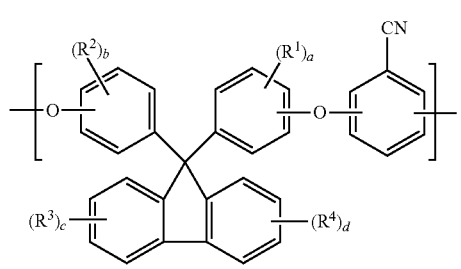

(1)

In the formula (1), $R^1$ to $R^4$ are each independently a monovalent organic group of 1 to 12 carbon atoms, and "a" to "d" are each independently an integer of 0 to 4.

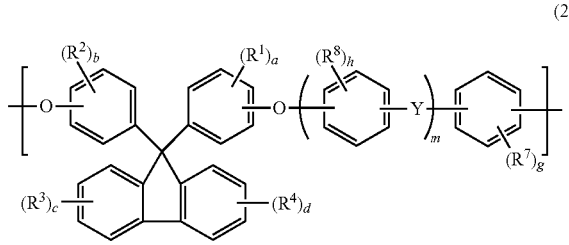

(2)

In the formula (2), $R^1$ to $R^4$ and "a" to "d" have the same meanings as those of $R^1$ to $R^4$ and "a" to "d" in the formula (1), respectively, Y is a single bond, —$SO_2$— or >C=O, $R^7$ and $R^8$ are each independently a halogen atom, a monovalent organic group of 1 to 12 carbon atoms or a nitro group, "g" and "h" are each independently an integer of 0 to 4, and "m" is 0 or 1, but when "m" is 0, $R^7$ is not a cyano group.

Further, the aromatic polyether-based resin preferably has at least one structural unit selected from the group consisting of a structural unit represented by the following formula (3) and a structural unit represented by the following formula (4).

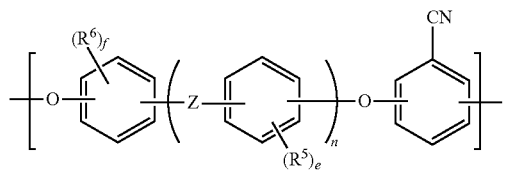

(3)

In the formula (3), $R^5$ and $R^6$ are each independently a monovalent organic group of 1 to 12 carbon atoms, Z is a single bond, —O—, —S—, —$SO_2$—, >C=O, —CONH—, —COO— or a divalent organic group of 1 to 12 carbon atoms, "e" and "f" are each independently an integer of 0 to 4, and "n" is 0 or 1.

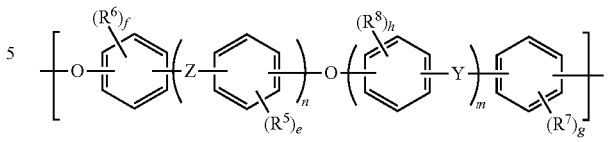

(4)

In the formula (4), $R^7$, $R^8$, Y, "m", "g" and "h" have the same meanings as those of $R^7$, $R^8$, Y, "m", "g" and "h" in the formula (2), respectively, and $R^5$, $R^6$, Z, "n", "e" and "f" have the same meanings as those of $R^5$, $R^6$, Z, "n", "e" and "f" in the formula (3), respectively.

<<Polyimide-Based Resin>>

The polyimide-based resin is not specifically restricted provided that it is a high-molecular compound containing an imide linkage in a repeating unit, and it can be synthesized by a process described in, for example, Japanese Patent Laid-Open Publication No. 2006-199945 or Japanese Patent Laid-Open Publication No. 2008-163107.

<<Fluorene Polycarbonate-Based Resin>>

The fluorene polycarbonate-based resin is not specifically restricted provided that it is a polycarbonate resin containing a fluorene moiety, and it can be synthesized by a process described in, for example, Japanese Patent Laid-Open Publication No. 2008-163194.

<<Fluorene Polyester-Based Resin>>

The fluorene polyester-based resin is not specifically restricted provided that it is a polyester resin containing a fluorene moiety, and it can be synthesized by a process described in, for example, Japanese Patent Laid-Open Publication No. 2010-285505 or Japanese Patent Laid-Open Publication No. 2011-197450.

<<Fluorinated Aromatic Polymer-Based Resin>>

The fluorinated aromatic polymer-based resin is not specifically restricted, but it is preferably a polymer containing an aromatic ring having at least one fluorine atom and a repeating unit containing at least one linkage selected from the group consisting of an ether linkage, a ketone linkage, a sulfone linkage, am amide linkage, an imide linkage and an ester linkage, and it can be synthesized by a process described in, for example, Japanese Patent Laid-Open Publication No. 2008-181121.

<<Acrylic Ultraviolet Curing Resin>>

The acrylic ultraviolet curing resin is not specifically restricted, but there can be mentioned a resin synthesized from a resin composition containing a compound having one or more acrylic groups or methacrylic groups in a molecule and a compound that is decomposed by ultraviolet rays to generate an active radical. When a base material in which a transparent resin layer containing the compound (Z) and a curable resin is laminated on a glass support or a resin support that becomes a base or a base material in which a resin layer such as an overcoat layer formed from a curable resin, etc. is laminated on the transparent resin substrate (ii) containing the compound (Z) is used as the base material (i), the acrylic ultraviolet curing resin is particularly preferably used as the curable resin.

<<Commercial Products>>

As commercial products of the transparent resins, the following commercial products, etc. can be mentioned. Examples of commercial products of the cyclic (poly)olefin-based resins include Arton available from JSR Corporation, ZEONOR available from Zeon Corporation, APEL available from Mitsui Chemicals, Inc. and TOPAS available from Polyplastics Co., Ltd. Examples of commercial products of the polyether sulfone-based resins include Sumika Excel PES available from Sumitomo Chemical Co., Ltd. Examples of commercial products of the polyimide-based resins include Neopulim L available from Mitsubishi Gas Chemical Company Inc. Examples of commercial products of the polycarbonate-based resins include PURE-ACE available from Teijin Ltd. Examples of commercial products of the fluorene polycarbonate-based resins include Lupizeta EP-5000 available from Mitsubishi Gas Chemical Company Inc. Examples of commercial products of the fluorene polyester-based resins include OKP4HT available from Osaka Gas Chemicals Co., Ltd. Examples of commercial products of the acrylic-based resins include ACRYVIEWA available from Nippon Shokubai Co., Ltd. Examples of commercial products of the silsesquioxane-based ultraviolet curing resins include Silplus available from Shin-Nittetsu Chemical Co., Ltd.

<Other Components>

The base material (i) may further contain additives, such as antioxidant, near-ultraviolet absorbing agent, fluorescence quencher and metal complex-based compound, as other components, within limits not detrimental to the effect of the present invention. These other components may be used singly or two or more kinds.

Examples of the near-ultraviolet absorbing agent include an azomethine-based compound, an indole-based compound, a benzotriazole-based compound and a triazine-based compound.

Examples of the antioxidant include 2,6-di-t-butyl-4-methylphenol, 2,2'-dioxy-3,3'-di-t-butyl-5,5'-dimethyldiphenylmethane, tetrakis[methylene-3-(3,5-di-t-butyl-4-hydroxyphenyl)propionate]methane and tris(2,6-di-t-butylphenyl)phosphite.

These additives may be mixed together with a resin, etc. in the production of the base material, or may be added when a resin is synthesized. Although the amount of such an additive is properly selected according to the desired properties, it is usually 0.01 to 5.0 parts by weight, preferably 0.05 to 2.0 parts by weight based on 100 parts by weight of the resin.

<Production Process for Base Material>

When the base material is a base material including a transparent resin substrate, the transparent resin substrate can be formed by, for example, melt-molding or cast molding, and if necessary, after molding, the molded product is coated with coating agents, such as an antireflection agent, a hard coating agent and/or an antistatic agent, whereby a base material in which an overcoat layer has been laminated can be produced.

When the base material is a base material in which a transparent resin layer such as an overcoat layer formed of a curable resin containing the compound (Z) is laminated on a glass support or a resin support that becomes a base, the base material in which a transparent resin layer is formed on a glass support or a resin support that becomes a base can be produced by, for example, subjecting a resin solution containing the compound (Z) to melt-molding or cast molding on a glass support or a resin support that becomes a base, preferably by coating through a method of spin coating, slit coating, ink jetting or the like, then removing the solvent by drying, and if necessary, further carrying out light irradiation or heating.

<<Melt-Molding>>

As the melt-molding, there can be specifically mentioned a method of melt-molding pellets obtained by melt-kneading a resin and the compound (Z), a method of melt-molding a resin composition containing a resin and the compound (Z), a method of melt-molding pellets obtained by removing a solvent from a resin composition containing the compound (Z), a resin and a solvent, or the like. Examples of the melt-molding methods include injection molding, melt extrusion molding and blow molding.

<<Cast Molding>>

The base material can be also produced by the cast molding, specifically by a method comprising casting a resin composition containing the compound (Z), a resin and a solvent onto an appropriate support and removing the solvent, a method comprising casting a curable composition containing the compound (Z), a photo-curable resin and/or a thermosetting resin onto an appropriate support, removing the solvent and then curing the composition by an appropriate means such as ultraviolet irradiation or heating, or the like.

When the base material is a base material formed of the transparent resin substrate containing the compound (Z), the base material can be obtained by performing cast molding and thereafter peeling the coating film from a molding support. When the base material is a base material in which a transparent resin layer such as an overcoat layer formed of a curable resin containing the compound (Z) is laminated on a support such as a glass support or a resin support that becomes a base, the base material can be obtained without peeling the coating film after cast molding.

[Dielectric Multilayer Film]

As the dielectric multilayer film, a dielectric multilayer film in which high-refractive index material layers and low-refractive index material layers are alternately laminated can be mentioned. As the material to form the high-refractive index material layers, a material having a refractive index of not less than 1.7 can be used, and a material having a refractive index in the range of 1.7 to 2.5 is usually selected. Such a material is, for example, a material containing titanium oxide, zirconium oxide, tantalum pentoxide, niobium pentoxide, lanthanum oxide, yttrium oxide, zinc oxide, zinc sulfide or indium oxide as a main component and containing titanium oxide, tin oxide and/or cerium oxide in a small amount (e.g., 0 to 10% by weight based on the main component).

As the material to form the low-refractive index material layer, a material having a refractive index of not more than 1.6 can be used, and a material having a refractive index in the range of 1.2 to 1.6 is usually selected. Examples of such materials include silica, alumina, lanthanum fluoride, magnesium fluoride and aluminum sodium hexafluoride.

The method for laminating the high-refractive index material layer and the low-refractive index material layer is not specifically restricted as far as a dielectric multilayer film wherein these material layers are laminated is formed. For example, the dielectric multilayer film can be formed by alternately laminating the high-refractive index material layer and the low-refractive index material layer directly on the base material through CVD method, sputtering method, vacuum deposition method, ion-assisted deposition method, ion plating method or the like.

The thickness of each layer of the high-refractive index material and the low-refractive index material is usually preferably 1 to 500 nm, still more preferably 2 to 450 nm, particularly preferably 5 to 400 nm. When the thickness of each layer is in this range, not only controlling in film formation can be easily made, but also cutting/transmission of a specific wavelength tends to be able to be easily controlled from the relationship between the optical properties of reflection and refraction.

The total number of the high-refractive index material layers and the low-refractive index material layers laminated in the dielectric multilayer film is preferably 8 to 120, more preferably 12 to 110, particularly preferably 16 to 100, in the whole optical filter. When the thickness of each layer, and the thickness of the dielectric multilayer film and the total number of lamination layers in the whole optical filter are in the above ranges, sufficient manufacturing margin can be ensured, and moreover, warpage of the optical filter and cracks of the dielectric multilayer film can be reduced.

Here, in order to optimize designing of the dielectric multilayer film, for example, optical thin film design software (e.g., Essential Macleod, available from Thin Film Center, Inc.) may be used to set parameters so that light cut characteristics in the visible region and light transmission characteristics in an objective near-infrared rays passband (wavelength region for use in near-infrared sensing) are compatible with one another. For example, in the case where near-infrared rays with a wavelength of about 850 nm are used for near-infrared sensing, there can be mentioned, according to the optical properties of the base material (i), a parameter setting method wherein the dielectric multilayer film is designed so that it has reflection characteristics in any wavelength band other than the wavelength band for use in near-infrared sensing under the assumption that the target transmittance is 0% and the value of Target Tolerance is 1 in measurement in the perpendicular direction in the wavelength region of 350 to 750 nm, the target transmittance is 100% and the value of Target Tolerance is 0.5 in measurement in the perpendicular direction in the wavelength region of 820 to 880 nm, and the target transmittance is 100% and the value of Target Tolerance is 0.8 in measurement in the perpendicular direction in the wavelength region of 950 to 1200 nm, a parameter setting method wherein the dielectric multilayer film is designed so that it has an antireflection effect in the wavelength band for use in visible to near-infrared sensing and has reflection characteristics on a longer wavelength side than the wavelength band for use in near-infrared sensing under the assumption that the target transmittance is 100% and the value of Target Tolerance is 0.5 in measurement in the perpendicular direction in the wavelength region of 400 to 880 nm, and the target transmittance is 100% in measurement in the perpendicular direction in the wavelength region of 950 to 1200 nm, or the like. These parameters can also be set so that the wavelength region is further finely divided and the light incident angle and the value of Target Tolerance for optimization of the resign are changed according to the optical properties of the base material (i). In the case of a configuration where the dielectric multilayer film is provided on both surfaces of the base material (i), a dielectric multilayer film similarly designed can be provided on such both surfaces, or dielectric multilayer films different in design from each other can be provided on such both surfaces, respectively. In the case where dielectric multilayer films different in design from each other are provided on such both surfaces, respectively, there can be mentioned a designing method where a dielectric multilayer film cutting rays in the wavelength region of about 350 to 750 nm is provided on one surface of the base material (i) and a dielectric multilayer film cutting rays in the wavelength region of about 950 to 1200 nm is provided on the other surface thereof, a designing method where a dielectric multilayer film having an antireflection effect of rays in the wavelength region of 400 to 880 nm is provided on one surface of the base material (i) and a dielectric multilayer film cutting rays in the wavelength region of about 950 to 1200 nm is provided on the other surface thereof, or the like.

[Other Functional Films]

In the optical filter of the present invention, for the purpose of, for example, enhancing surface hardness of the base material or the dielectric multilayer film, enhancing chemical resistance, preventing static electrification and removing flaws, functional films, such as an antireflection film, a hard coating film and an antistatic film, can be provided, as appropriate in such a manner that the effects of the present invention are not adversely affected, between the base material and the dielectric multilayer film, on a surface of the base material opposite to the surface where the dielectric multilayer film has been provided or on a surface of the dielectric multilayer film opposite to the surface where the base material has been provided.

The optical filter of the present invention may include one layer composed of the above functional film or may include two or more layers each of which is composed of the functional film. When the optical filter of the present invention includes two or more layers each of which is composed of the functional film, it may include two or more layers which are the same as one another or may include two or more layers which are different from one another.

Although the method for laminating the functional film is not specifically restricted, there can be mentioned a method of melt-molding or cast molding coating agents, such as an antireflection agent, a hard coating agent and/or an antistatic agent, on the base material or the dielectric multilayer film in the same manner as previously described.

The functional film can be produced also by applying a curable composition containing the coating agent, etc. onto the base material or the dielectric multilayer film with a bar coater or the like and then curing the composition through ultraviolet irradiation or the like.

As the coating agent, an ultraviolet (UV)/electron beam (EB) curable resin, a thermosetting resin or the like can be mentioned, and specific examples thereof include vinyl compounds, and urethane-based, urethane acrylate-based, acrylate-based, epoxy-based and epoxy acrylate-based resins. Examples of the curable compositions containing these coating agents include vinyl-based, urethane-based, urethane acrylate-based, acrylate-based, epoxy-based and epoxy acrylate-based curable compositions.

The curable composition may contain a polymerization initiator. As the polymerization initiator, a known photopolymerization initiator or thermal polymerization initiator can be used, and a photopolymerization initiator and a thermal polymerization initiator may be used in combination. Such polymerization initiators may be used singly or two or more kinds.

When the total amount of the curable composition is 100% by weight, the blending ratio of the polymerization initiator in the curable composition is preferably 0.1 to 10% by weight, more preferably 0.5 to 10% by weight, still more preferably 1 to 5% by weight. When the blending ratio of the polymerization initiator is in the above range, the curable composition is excellent in curing properties and handling properties, and a functional film having a desired hardness, such as an antireflection film, a hard coating film or an antistatic film, can be obtained.

To the curable composition, an organic solvent may be further added as a solvent, and as the organic solvent, a known solvent can be used. Specific examples of the organic solvents include alcohols, such as methanol, ethanol, isopropanol, butanol and octanol; ketones, such as acetone, methyl ethyl ketone, methyl isobutyl ketone and cyclohexanone; esters, such as ethyl acetate, butyl acetate, ethyl lactate, γ-butyrolactone, propylene glycol monomethyl ether acetate and propylene glycol monoethyl ether acetate; ethers, such as ethylene glycol monomethyl ether and diethylene glycol monobutyl ether; aromatic hydrocarbons, such as benzene, toluene and xylene; and amides, such as dimethylformamide, dimethylacetamide and N-methylpyrrolidone. These solvents may be used singly or two or more kinds.

The thickness of the functional film is preferably 0.1 to 20 μm, still more preferably 0.5 to 10 μm, particularly preferably 0.7 to 5 μm.

For the purpose of enhancing adhesion between the base material and the functional film and/or the dielectric multilayer film or adhesion between the functional film and the dielectric multilayer film, the surface of the base material, the functional film or the dielectric multilayer film may be subjected to surface treatment, such as corona treatment or plasma treatment.

[Use of Optical Filter]

The optical filter of the present invention is characterized by having excellent visible light cutting performance and having light transmission characteristics in the wavelength region for use in near-infrared sensing, and furthermore being less in the change in optical properties depending on the incident angle. Accordingly, the optical filter is useful for an optical sensor device. In particular, the optical filter is useful for an optical sensor to be mounted in smart phone, tablet terminal, cellular phone, wearable device, automobile, TV, game console, drone, and the like.

EXAMPLES

The present invention is more specifically described with reference to the following examples, but it should be construed that the present invention is in no way limited to those examples. The term "part(s)" means "part(s) by weight" unless otherwise noted. Methods for measuring property values and methods for evaluating properties are as follows.

<Molecular Weight>

Taking into consideration the solubility of each resin in a solvent, etc., a molecular weight of the resin was measured by the following method (a) or (b).

(a) Using a gel permeation chromatography (GPC) apparatus (150C type, column: H type column available from Tosoh Corporation, developing solvent: o-dichlorobenzene) manufactured by WATERS Corporation, a weight-average molecular weight (Mw) and a number-average molecular weight (Mn) in terms of standard polystyrene were measured.

(b) Using a GPC apparatus (HLC-8220 type, column: TSKgel α-M, developing solvent: THF) manufactured by Tosoh Corporation, a weight-average molecular weight (Mw) and a number-average molecular weight (Mn) in terms of standard polystyrene were measured.

With regard to the resin synthesized in the later-described Resin Synthesis Example 3, measurement of a molecular weight by the above method was not carried out, but measurement of a logarithmic viscosity by the following method (c) was carried out.

(c) A part of a polyimide resin solution was introduced into anhydrous methanol to precipitate a polyimide resin, and filtration was carried out to separate the resin from an unreacted monomer. Then, 0.1 g of polyimide obtained by vacuum drying the resulting resin at 80° C. for 12 hours was dissolved in 20 mL of N-methyl-2-pyrrolidone, and a logarithmic viscosity (p) at 30° C. was determined using a Canon-Fenske viscometer and the following formula.

$$\mu = \{\ln(t_s/t_0)\}/C$$

$t_0$: flow time of solvent $t_s$: flow time of dilute polymer solution

C: 0.5 g/dL

<Glass Transition Temperature (Tg)>

Using a differential scanning calorimeter (DSC 6200) manufactured by SII Nanotechnology Inc., a glass transition temperature was measured at a heating rate of 20° C./min in a stream of nitrogen.

<Spectral Transmittance>

Using a spectrophotometer (U-4100) manufactured by Hitachi High-Technologies Corporation, a transmittance of an optical filter in each wavelength region was measured.

Here, with regard to the transmittance measured in the perpendicular direction to the optical filter, a transmittance of light 1 transmitted perpendicularly to an optical filter 2 was measured by a spectrophotometer 3, as shown in FIG. 3(A). With regard to the transmittance measured at an angle of 30° to the perpendicular direction to the optical filter, a transmittance of light 1' transmitted at an angle of 30° to the perpendicular direction to an optical filter 2 was measured by a spectrophotometer 3, as shown in FIG. 3(B).

SYNTHESIS EXAMPLES

The dye compound used in the following Examples was synthesized by a commonly known method. Examples of such commonly known methods include the methods described in Japanese Patent No. 3366697, Japanese Patent No. 2846091, Japanese Patent No. 2864475, Japanese Patent No. 3703869, Japanese Patent Laid-Open Publication No. S60(1985)-228448, Japanese Patent Laid-Open Publication No. H01(1989)-146846, Japanese Patent Laid-Open Publication No. H01(1989)-228960, Japanese Patent No. 4081149, Japanese Patent Laid-Open Publication No. S63 (1988)-124054, "phthalocyanine-Chemistry and Functions" (IPC, 1997), Japanese Patent Laid-Open Publication No. 2007-169315, Japanese Patent Laid-Open Publication No. 2009-108267, Japanese Patent Laid-Open Publication No. 2010-241873, Japanese Patent No. 3699464 and Japanese Patent No. 4740631.

Resin Synthesis Example 1

In a reaction container purged with nitrogen, 100 parts of 8-methyl-8-methoxycarbonyltetracyclo[4.4.0.12,5.17,10] dodec-3-ene (also referred to as "DNM" hereinafter.) represented by the following formula ($X_1$), 18 parts of 1-hexene (molecular weight modifier) and 300 parts of toluene (solvent for ring-opening polymerization reaction) were placed, and this solution was heated to 80° C. Then, to the solution in the reaction container, 0.2 parts of a toluene solution of triethylaluminum (0.6 mol/liter) and 0.9 parts of a toluene solution of methanol-modified tungsten hexachloride (concentration: 0.025 mol/liter) were added as polymerization catalysts, and the resulting solution was heated and stirred at 80° C. for 3 hours to perform ring-opening polymerization reaction, whereby a ring-opened polymer solution was obtained. The polymerization conversion ratio in this polymerization reaction was 97%.

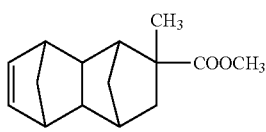

(X₁)

In an autoclave, 1,000 parts of the ring-opened polymer solution obtained as above were placed, and to this ring-opened polymer solution, 0.12 part of RuHCl(CO)[P(C₆H₅)₃]₃ was added, and they were heated and stirred for 3 hours under the conditions of a hydrogen gas pressure of 100 kg/cm² and a reaction temperature of 165° C. to perform hydrogenation reaction. After the resulting reaction solution (hydrogenated polymer solution) was cooled, the hydrogen gas pressure was released. This reaction solution was poured into a large amount of methanol, and the resulting precipitate was separated and recovered. Then, the precipitate was dried to obtain a hydrogenated polymer (also referred to as a "resin A" hereinafter). The resulting resin A had a number-average molecular weight (Mn) of 32,000, a weight-average molecular weight (Mw) of 137,000 and a glass transition temperature (Tg) of 165° C.

Resin Synthesis Example 2

In a 3-liter four-neck flask, 35.12 g (0.253 mol) of 2,6-difluorobenzonitrile, 87.60 g (0.250 mol) of 9,9-bis(4-hydroxyphenyl)fluorene, 41.46 g (0.300 mol) of potassium carbonate, 443 g of N,N-dimethylacetamide (also referred to as "DMAc" hereinafter) and 111 g of toluene were placed. Subsequently, to the four-neck flask, a thermometer, a stirrer, a three-way cock with a nitrogen feed pipe, a Dean-Stark tube and a cooling pipe were fixed.

Then, the flask was purged with nitrogen. Thereafter, the resulting solution was subjected to reaction at 140° C. for 3 hours, and water produced was removed from the Dean-Stark tube whenever necessary. When production of water came to be not detected, the temperature was slowly raised up to 160° C., and the reaction was carried out at the same temperature for 6 hours.

After the reaction solution was cooled down to room temperature (25° C.), a salt produced was removed by a filter paper, then the filtrate was introduced into methanol to perform reprecipitation, and filtration was carried out to isolate a filter residue (residue). The resulting filter residue was vacuum dried at 60° C. for one night to obtain a white powder (also referred to as a "resin B" hereinafter) (yield: 95%). The resulting resin B had a number-average molecular weight (Mn) of 75,000, a weight-average molecular weight (Mw) of 188,000 and a glass transition temperature (Tg) of 285° C.

Resin Synthesis Example 3

In a 500-mL five-neck flask equipped with a thermometer, a stirrer, a nitrogen feed pipe, a dropping funnel with a side tube, a Dean-Stark tube and a cooling pipe, 27.66 g (0.08 mol) of 1,4-bis(4-amino-α,α-dimethylbenzyl)benzene and 7.38 g (0.02 mol) of 4,4'-bis(4-aminophenoxy)biphenyl were placed, and they were dissolved in 68.65 g of γ-butyrolactone and 17.16 g of N,N-dimethylacetamide in a stream of nitrogen. The resulting solution was cooled to 5° C. using an ice water bath, and with maintaining the solution at the same temperature, 22.62 g (0.1 mol) of 1,2,4,5-cyclohexanetetracarboxylic dianhydride and 0.50 g (0.005 mol) of triethylamine as an imidization catalyst were added all together. After the addition was completed, the temperature was raised to 180° C., and with removing the distillate whenever necessary, the reaction solution was refluxed for 6 hours. After the reflux was completed, air cooling was carried out until the internal temperature became 100° C. Thereafter, 143.6 g of N,N-dimethylacetamide was added to dilute the reaction solution, and with stirring, the resulting solution was cooled to obtain 264.16 g of a polyimide resin solution having a solid concentration of 20% by weight. A part of the polyimide resin solution was poured into 1 L of methanol to precipitate polyimide. The polyimide was filtered off, washed with methanol and then dried for 24 hours in a vacuum dryer at 100° C. to obtain a white powder (also referred to as "resin C", hereinafter.). When an IR spectrum of the resulting resin C was measured, absorption at 1704 cm⁻¹ and 1770 cm⁻¹ characteristic of an imide group was observed. The resin C had a glass transition temperature (Tg) of 310° C., and the logarithmic viscosity measurement resulted in 0.87.

Example 1

In Example 1, an optical filter which had a base material formed of a transparent resin substrate and which could transmit near-infrared rays with a wavelength of about 850 nm was prepared the following procedure and conditions.

Figure 4:
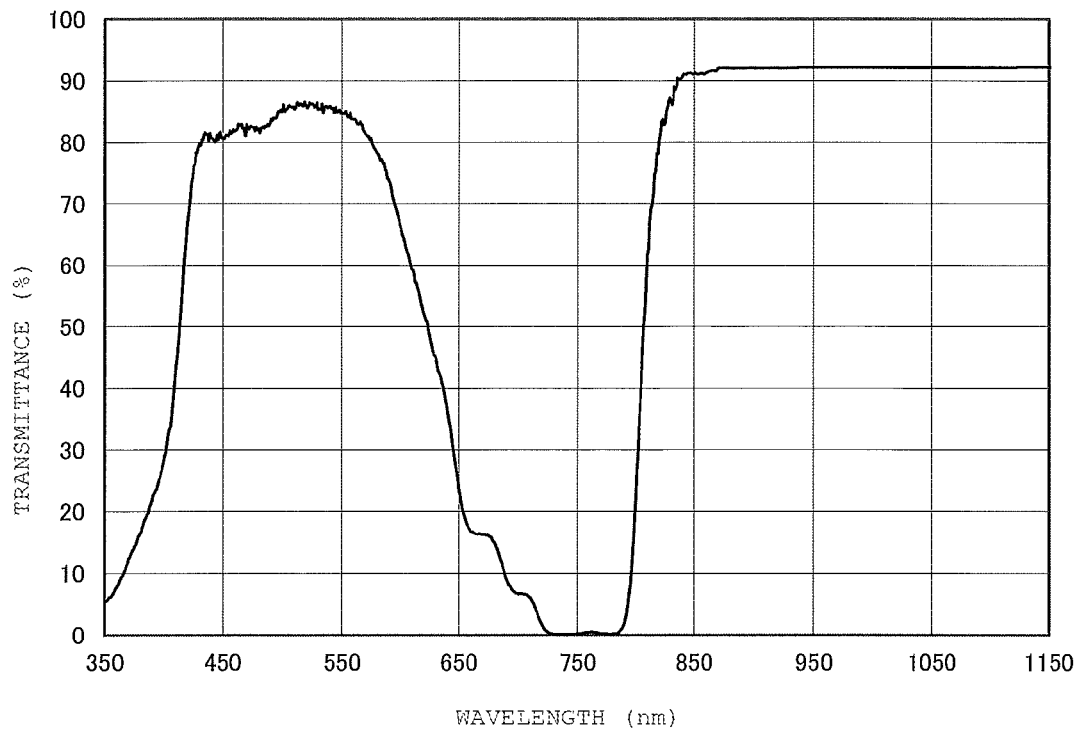
FIG. 4 is a graph representing a spectral transmittance of a base material produced in Example 1.

In a container, 100 parts of the resin A obtained in Resin Synthesis Example 1, 0.04 parts of the compound (z-5) (absorption maximum wavelength in dichloromethane: 770 nm) described in Table 1 above, as the compound (Z), 0.21 parts of a compound (a-1) represented by the following formula (a-1) (absorption maximum wavelength in dichloromethane: 738 nm) as the compound (Z), and methylene chloride were placed to prepare a solution having a resin concentration of 20% by weight. The resulting solution was cast onto a flat glass plate and dried at 20° C. for 8 hours, and then, the resulting coating film was peeled from the glass plate. The coating film thus peeled was further dried at 100° C. for 8 hours under reduced pressure to obtain a base material formed of a transparent resin substrate having a thickness of 0.1 mm, a length of 60 mm and a width of 60 mm. A spectral transmittance of this base material was measured, and the transmittances (Ta) and (Tb) and the wavelength (Xf) were determined. The results are set forth in FIG. 4 and Table 23.

(a-1)

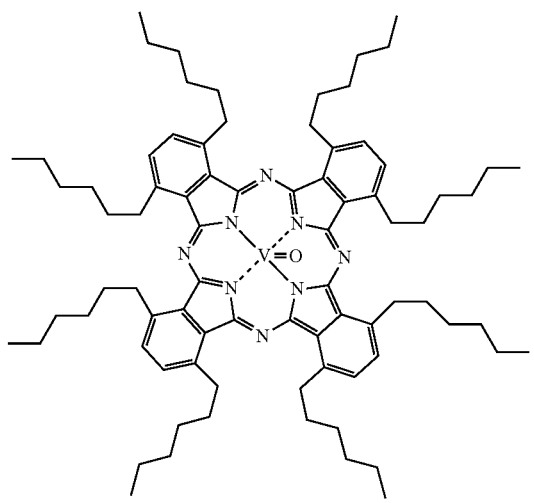

Subsequently, on one surface of the resulting base material, a dielectric multilayer film (I) was formed, and on the other surface of the base material, a dielectric multilayer film (II) was formed, whereby an optical filter having a thickness of about 0.105 mm was obtained.

The dielectric multilayer film (I) was constituted of silica ($SiO_2$) layers and titania ($TiO_2$) layers that had been alternatively laminated at a deposition temperature of 100° C. (total: 36 layers). The dielectric multilayer film (II) was constituted of silica ($SiO_2$) layers and titania ($TiO_2$) layers that had been alternatively laminated at a deposition temperature of 100° C. (total: 26 layers). In each of the dielectric multilayer films (I) and (II), the silica layers and the titania layers were alternately laminated in the order of a titania layer, a silica layer, a titania layer, - - - a silica layer, a titania layer and a silica layer from the base material side, and the outermost layer of the optical filter was a silica layer.

Designing of the dielectric multilayer films (I) and (II) was carried out in the following manner.

The thickness of each layer and the number of layers were optimized according to the dependence of the base material refractive index on the wavelength and the absorption properties of the applied compound (Z) so that light cut characteristics in the visible region and transmission properties in an objective near-infrared region could be attained, by the use of optical thin film design software (Essential Macleod, available from Thin Film Center, Inc.). When optimization was carried out, input parameters (Target values) into the software in this Example were set as shown in the following Table 3.

TABLE 3

| Dielectric multilayer film | Wavelength (nm) | Input parameter into software | | | |
|---|---|---|---|---|---|
| | | Incident Angle | Required Value | Target Tolerance | Type |
| (I) | 340 to 540 | 0 | 0 | 0.8 | Transmittance |
| | 785 to 815 | 0 | 100 | 1.0 | Transmittance |
| | 820 to 880 | 0 | 100 | 0.5 | Transmittance |
| (II) | 525 to 740 | 0 | 0 | 0.8 | Transmittance |
| | 780 to 810 | 0 | 100 | 1.0 | Transmittance |
| | 815 to 880 | 0 | 100 | 0.5 | Transmittance |

As a result of optimization of film constitution, in Example 1, the dielectric multilayer film (I) became a multilayer deposited film of 36 lamination layers, the film being constituted of silica layers each having a film thickness of 57 to 169 nm and titania layers each having a film thickness of 16 to 45 nm alternatively laminated, and the dielectric multilayer film (II) became a multilayer deposited film of 26 lamination layers, the film being constituted of silica layers each having a film thickness of 22 to 480 nm and titania layers each having a film thickness of 22 to 65 nm alternatively laminated. An example of the film constitution obtained by optimization is shown in Table 4.

TABLE 4

| Dielectric multilayer film | Layer | Film material | Physical film thickness (nm) | Optical film thickness (nd) |
|---|---|---|---|---|
| (I) | 1 | $SiO_2$ | 168.5 | 0.443λ |
| | 2 | $TiO_2$ | 45.4 | 0.199λ |
| | 3 | $SiO_2$ | 96.8 | 0.255λ |
| | 4 | $TiO_2$ | 29.6 | 0.13λ |
| | 5 | $SiO_2$ | 114.8 | 0.302λ |
| | 6 | $TiO_2$ | 39.8 | 0.175λ |
| | 7 | $SiO_2$ | 94.6 | 0.249λ |
| | 8 | $TiO_2$ | 39.6 | 0.174λ |
| | 9 | $SiO_2$ | 97.0 | 0.255λ |
| | 10 | $TiO_2$ | 40.4 | 0.178λ |
| | 11 | $SiO_2$ | 91.3 | 0.24λ |
| | 12 | $TiO_2$ | 37.4 | 0.164λ |
| | 13 | $SiO_2$ | 89.8 | 0.236λ |
| | 14 | $TiO_2$ | 42.6 | 0.187λ |
| | 15 | $SiO_2$ | 89.8 | 0.236λ |
| | 16 | $TiO_2$ | 39.1 | 0.172λ |
| | 17 | $SiO_2$ | 83.4 | 0.219λ |
| | 18 | $TiO_2$ | 38.4 | 0.169λ |
| | 19 | $SiO_2$ | 78.3 | 0.206λ |
| | 20 | $TiO_2$ | 32.1 | 0.141λ |
| | 21 | $SiO_2$ | 84.7 | 0.223λ |
| | 22 | $TiO_2$ | 21.7 | 0.095λ |
| | 23 | $SiO_2$ | 59.4 | 0.156λ |
| | 24 | $TiO_2$ | 23.6 | 0.104λ |
| | 25 | $SiO_2$ | 87.8 | 0.231λ |
| | 26 | $TiO_2$ | 33.5 | 0.147λ |
| | 27 | $SiO_2$ | 80.3 | 0.353λ |
| | 28 | $TiO_2$ | 29.8 | 0.131λ |
| | 29 | $SiO_2$ | 57.0 | 0.25λ |
| | 30 | $TiO_2$ | 19.5 | 0.086λ |
| | 31 | $SiO_2$ | 81.2 | 0.357λ |
| | 32 | $TiO_2$ | 31.9 | 0.14λ |
| | 33 | $SiO_2$ | 68.9 | 0.303λ |
| | 34 | $TiO_2$ | 28.6 | 0.125λ |
| | 35 | $SiO_2$ | 58.5 | 0.257λ |
| | 36 | $TiO_2$ | 16.0 | 0.07λ |
| | Base material | | | |
| (II) | 37 | $TiO_2$ | 45.4 | 0.2λ |
| | 38 | $SiO_2$ | 100.0 | 0.263λ |
| | 39 | $TiO_2$ | 55.4 | 0.243λ |
| | 40 | $SiO_2$ | 97.8 | 0.257λ |
| | 41 | $TiO_2$ | 54.7 | 0.24λ |
| | 42 | $SiO_2$ | 479.7 | 1.262λ |
| | 43 | $TiO_2$ | 44.8 | 0.197λ |
| | 44 | $SiO_2$ | 103.6 | 0.272λ |
| | 45 | $TiO_2$ | 63.0 | 0.277λ |
| | 46 | $SiO_2$ | 113.2 | 0.298λ |
| | 47 | $TiO_2$ | 64.6 | 0.284λ |
| | 48 | $SiO_2$ | 113.9 | 0.3λ |
| | 49 | $TiO_2$ | 65.1 | 0.286λ |
| | 50 | $SiO_2$ | 113.9 | 0.3λ |

TABLE 4-continued

| Dielectric multilayer film | Layer | Film material | Physical film thickness (nm) | Optical film thickness (nd) |
|---|---|---|---|---|
| | 51 | TiO$_2$ | 64.7 | 0.284λ |
| | 52 | SiO$_2$ | 111.9 | 0.294λ |
| | 53 | TiO$_2$ | 62.5 | 0.275λ |
| | 54 | SiO$_2$ | 142.6 | 0.375λ |
| | 55 | TiO$_2$ | 29.5 | 0.13λ |
| | 56 | SiO$_2$ | 187.6 | 0.493λ |
| | 57 | TiO$_2$ | 62.5 | 0.164λ |
| | 58 | SiO$_2$ | 124.6 | 0.328λ |
| | 59 | TiO$_2$ | 44.9 | 0.118λ |
| | 60 | SiO$_2$ | 146.1 | 0.384λ |
| | 61 | TiO$_2$ | 22.1 | 0.058λ |
| | 62 | SiO$_2$ | 21.6 | 0.057λ |

*λ = 550 nm

Figure 5:
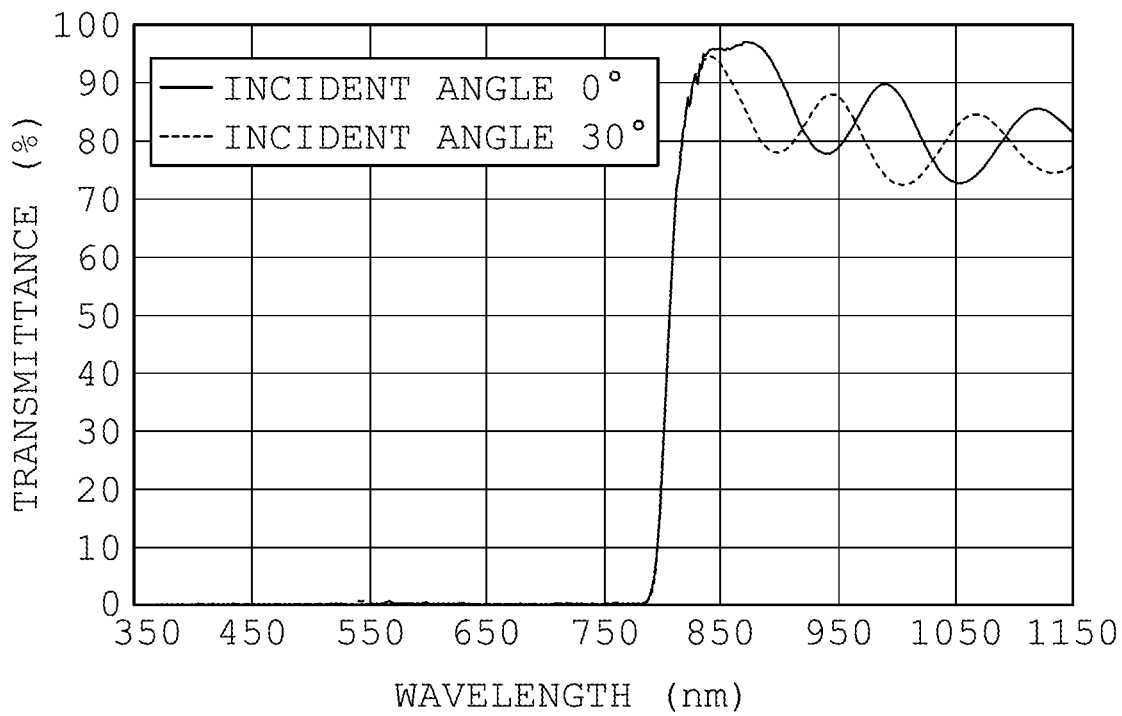
FIG. 5 is a graph representing a spectral transmittance of an optical filter produced in Example 1.

The spectral transmittances measured in the perpendicular direction to the resulting optical filter and at an angle of 300 to the perpendicular direction to the optical filter were determined, and optical properties in each wavelength region were evaluated. The results are set forth in FIG. 5 and Table 23.

Example 2

In Example 2, an optical filter which had a base material formed of a transparent resin substrate and which could selectively transmit near-infrared rays with a wavelength of about 850 nm was prepared according to the following procedure and conditions.

A base material formed of a transparent resin substrate was prepared in the same manner as in Example 1. Then, a dielectric multilayer film (III) was formed on one surface of the resulting base material and furthermore a dielectric multilayer film (IV) was formed on the other surface of the base material in the same manner as in Example 1, except that designing of the dielectric multilayer film (the number of layers and the thickness of each layer) was different, whereby an optical filter having a thickness of about 0.108 mm was obtained.

Designing of the dielectric multilayer films (III) and (IV) was carried out in the same manner as in Example 1, except that input parameters (Target values) into the software were set as shown in the following Table 5. An example of the film constitution obtained by optimization is shown in Table 6.

TABLE 5

| Dielectric multilayer film | Wavelength (nm) | Input parameter into software | | | |
|---|---|---|---|---|---|
| | | Incident angle | Required value | Target tolerance | Type |
| (III) | 340 to 600 | 0 | 0 | 1.0 | Transmittance |
| | 601 to 740 | 0 | 0 | 0.8 | Transmittance |
| | 780 to 880 | 0 | 100 | 0.5 | Transmittance |
| (IV) | 400 to 500 | 0 | 0 | 1.0 | Transmittance |
| | 800 to 910 | 0 | 100 | 0.5 | Transmittance |
| | 930 to 1200 | 0 | 0 | 0.3 | Transmittance |

TABLE 6

| Dielectric multilayer film | Layer | Film material | Physical film thickness (nm) | Optical film thickness (nd) |
|---|---|---|---|---|
| (III) | 1 | SiO$_2$ | 24.6 | 0.065λ |
| | 2 | TiO$_2$ | 11.5 | 0.051λ |
| | 3 | SiO$_2$ | 113.7 | 0.299λ |
| | 4 | TiO$_2$ | 72.8 | 0.32λ |
| | 5 | SiO$_2$ | 91.8 | 0.242λ |
| | 6 | TiO$_2$ | 47.4 | 0.208λ |
| | 7 | SiO$_2$ | 89.2 | 0.235λ |
| | 8 | TiO$_2$ | 48.6 | 0.213λ |
| | 9 | SiO$_2$ | 91.2 | 0.24λ |
| | 10 | TiO$_2$ | 49.1 | 0.216λ |
| | 11 | SiO$_2$ | 91.9 | 0.242λ |
| | 12 | TiO$_2$ | 56.3 | 0.247λ |
| | 13 | SiO$_2$ | 91.6 | 0.241λ |
| | 14 | TiO$_2$ | 44.2 | 0.194λ |
| | 15 | SiO$_2$ | 73.3 | 0.193λ |
| | 16 | TiO$_2$ | 40.1 | 0.176λ |
| | 17 | SiO$_2$ | 71.4 | 0.188λ |
| | 18 | TiO$_2$ | 41.1 | 0.18λ |
| | 19 | SiO$_2$ | 63.7 | 0.168λ |
| | 20 | TiO$_2$ | 35.5 | 0.156λ |
| | 21 | SiO$_2$ | 75.2 | 0.198λ |
| | 22 | TiO$_2$ | 32.2 | 0.141λ |
| | 23 | SiO$_2$ | 68.9 | 0.181λ |
| | 24 | TiO$_2$ | 40.5 | 0.178λ |
| | 25 | SiO$_2$ | 76.3 | 0.201λ |
| | 26 | TiO$_2$ | 31.6 | 0.139λ |
| | 27 | SiO$_2$ | 19.5 | 0.086λ |
| | 28 | TiO$_2$ | 24.7 | 0.108λ |
| | 29 | SiO$_2$ | 150.6 | 0.661λ |
| | 30 | TiO$_2$ | 44.4 | 0.195λ |
| | 31 | SiO$_2$ | 101.4 | 0.446λ |
| | 32 | TiO$_2$ | 64.6 | 0.284λ |
| | 33 | SiO$_2$ | 186.4 | 0.819λ |
| | 34 | TiO$_2$ | 32.4 | 0.142λ |
| | 35 | SiO$_2$ | 141.4 | 0.621λ |
| | 36 | TiO$_2$ | 63.0 | 0.277λ |
| | 37 | SiO$_2$ | 111.5 | 0.49λ |
| | 38 | TiO$_2$ | 70.2 | 0.308λ |
| | 39 | SiO$_2$ | 112.7 | 0.495λ |
| | 40 | TiO$_2$ | 65.2 | 0.286λ |
| | 41 | SiO$_2$ | 111.5 | 0.49λ |
| | 42 | TiO$_2$ | 63.9 | 0.281λ |
| | 43 | SiO$_2$ | 114.1 | 0.501λ |
| | 44 | TiO$_2$ | 64.6 | 0.284λ |
| | 45 | SiO$_2$ | 109.6 | 0.481λ |
| | 46 | TiO$_2$ | 64.2 | 0.282λ |
| | 47 | SiO$_2$ | 108.8 | 0.478λ |
| | 48 | TiO$_2$ | 40.3 | 0.177λ |
| | 49 | SiO$_2$ | 488.7 | 2.147λ |

TABLE 6-continued

| Dielectric multilayer film | Layer | Film material | Physical film thickness (nm) | Optical film thickness (nd) |
|---|---|---|---|---|
| | 50 | TiO₂ | 39.0 | 0.171λ |
| | 51 | SiO₂ | 104.5 | 0.459λ |
| | 52 | TiO₂ | 55.9 | 0.246λ |
| | 53 | SiO₂ | 99.9 | 0.439λ |
| | 54 | TiO₂ | 30.2 | 0.133λ |
| | | Base material | | |
| (IV) | 55 | TiO₂ | 222.9 | 0.979λ |
| | 56 | SiO₂ | 54.9 | 0.144λ |
| | 57 | TiO₂ | 79.6 | 0.35λ |
| | 58 | SiO₂ | 36.3 | 0.096λ |
| | 59 | TiO₂ | 96.3 | 0.423λ |
| | 60 | SiO₂ | 89.0 | 0.234λ |
| | 61 | TiO₂ | 73.3 | 0.322λ |
| | 62 | SiO₂ | 29.2 | 0.077λ |
| | 63 | TiO₂ | 98.6 | 0.433λ |
| | 64 | SiO₂ | 130.6 | 0.344λ |
| | 65 | TiO₂ | 92.5 | 0.406λ |
| | 66 | SiO₂ | 136.2 | 0.358λ |
| | 67 | TiO₂ | 81.5 | 0.358λ |
| | 68 | SiO₂ | 11.2 | 0.03λ |
| | 69 | TiO₂ | 107.9 | 0.474λ |
| | 70 | SiO₂ | 118.4 | 0.311λ |
| | 71 | TiO₂ | 141.7 | 0.622λ |
| | 72 | SiO₂ | 124.3 | 0.327λ |
| | 73 | TiO₂ | 197.6 | 0.868λ |
| | 74 | SiO₂ | 118.1 | 0.519λ |
| | 75 | TiO₂ | 191.3 | 0.84λ |
| | 76 | SiO₂ | 94.3 | 0.248λ |
| | 77 | TiO₂ | 204.5 | 0.538λ |
| | 78 | SiO₂ | 128.3 | 0.337λ |
| | 79 | TiO₂ | 174.8 | 0.46λ |
| | 80 | SiO₂ | 104.4 | 0.274λ |
| | 81 | TiO₂ | 198.1 | 0.521λ |
| | 82 | SiO₂ | 151.5 | 0.398λ |

*λ = 550 nm

Figure 6:
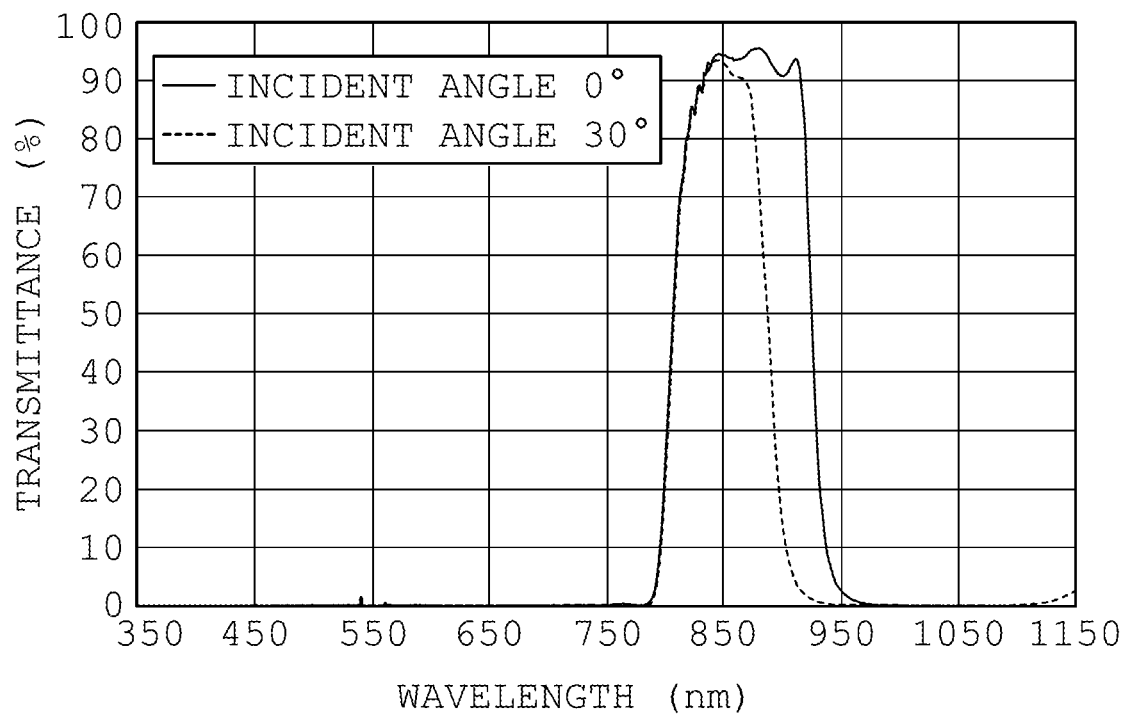
FIG. 6 is a graph representing a spectral transmittance of an optical filter produced in Example 2.

The spectral transmittances measured in the perpendicular direction to the resulting optical filter and at an angle of 300 to the perpendicular direction to the optical filter were determined, and optical properties in each wavelength region were evaluated. The results are set forth in FIG. 6 and Table 23.

Example 3

In Example 3, an optical filter which had a base material formed of a transparent resin substrate having a resin layer on both surfaces and which could transmit near-infrared rays with a wavelength of about 950 nm was prepared according to the following procedure and conditions.

A transparent resin substrate containing the compound (Z) was obtained in the same manner under the same conditions as those in Example 1, except that 0.10 parts of a compound (z-27) described in Table 1 above (absorption maximum wavelength in dichloromethane: 868 nm) was used as the compound (Z) instead of 0.04 parts of the compound (z-5) used as the compound (Z) and 0.21 parts of the compound (a-1) in Example 1.

Figure 7:
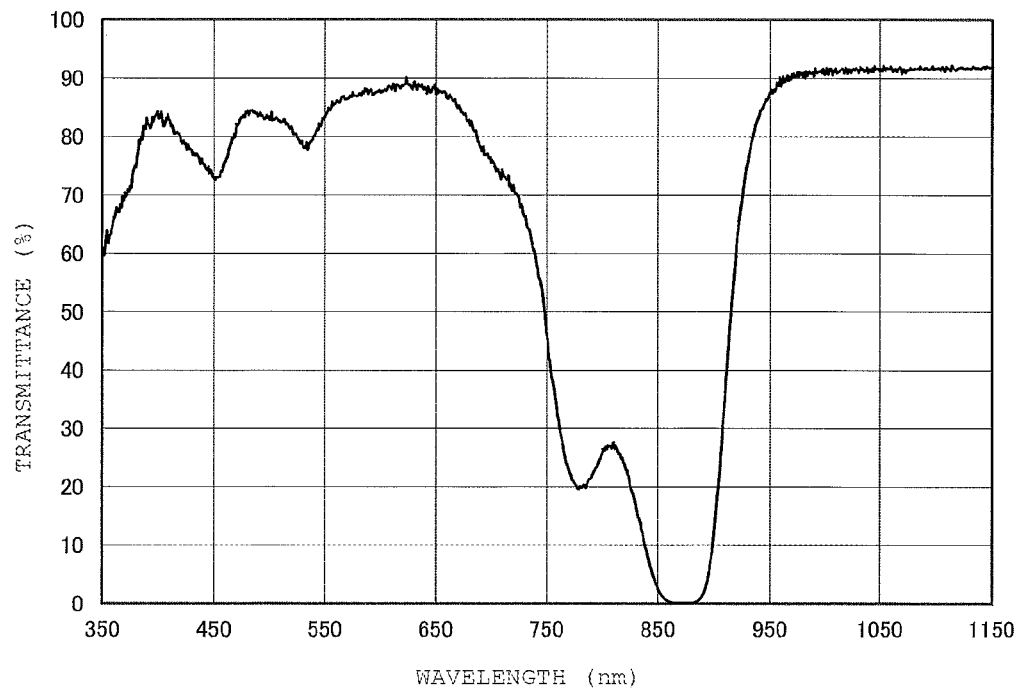
FIG. 7 is a graph representing a spectral transmittance of a base material produced in Example 3.

One surface of the resulting transparent resin substrate was coated with a resin composition (1) having the following formulation by a bar coater, and the composition was heated at 70° C. for 2 minutes in an oven to remove the solvent by volatilization. In this coating, the coating conditions using the bar coater were controlled so that the thickness after drying might become 2.5 μm. Next, using a conveyer type exposure device, exposure (exposure quantity: 500 mJ/cm², 200 mW) was carried out to cure the resin composition (1), whereby a resin layer was formed on the transparent resin substrate. Such a resin layer formed from the resin composition (1) was also formed on the other surface of the transparent resin substrate in the same manner, whereby a base material having the resin layer on both surfaces of the transparent resin substrate containing the compound (Z) was obtained. A spectral transmittance of this base material was measured, and the transmittances (Ta) and (Tb) and the wavelength (Xf) were determined. The results are set forth in FIG. 7 and Table 23.

Resin composition (1): tricyclodecane dimethanol acrylate 60 parts by weight, dipentaerythritol hexaacrylate 40 parts by weight, 1-hydroxycyclohexyl phenyl ketone 5 parts by weight, methyl ethyl ketone (solvent, solid concentration (TSC): 30%)

Subsequently, a dielectric multilayer film (V) was formed on one surface of the resulting base material and furthermore a dielectric multilayer film (VI) was formed on the other surface of the base material in the same manner as in Example 1, except that designing of the dielectric multilayer film (the number of layers and the thickness of each layer) was different, whereby an optical filter having a thickness of about 0.110 mm was obtained.

Designing of the dielectric multilayer films (V) and (VI) was carried out in the same manner as in Example 1, except that input parameters (Target values) into the software were set as shown in the following Table 7. An example of the film constitution obtained by optimization is shown in Table 8.

TABLE 7

| | | Input parameter into software | | | |
|---|---|---|---|---|---|
| Dielectric multilayer film | Wavelength (nm) | Incident angle | Required value | Target tolerance | Type |
| (V) | 340 to 500 | 0 | 0 | 0.8 | Transmittance |
| | 50 to 650 | 0 | 0 | 1.0 | Transmittance |
| | 880 to 980 | 0 | 100 | 0.5 | Transmittance |
| (VI) | 600 to 750 | 0 | 0 | 1.0 | Transmittance |
| | 751 to 880 | 0 | 0 | 0.5 | Transmittance |
| | 900 to 980 | 0 | 100 | 0.5 | Transmittance |

TABLE 8

| Dielectric multilayer film | Layer | Film material | Physical film thickness (nm) | Optical film thickness (nd) |
|---|---|---|---|---|
| (V) | 1 | SiO$_2$ | 34.7 | 0.091λ |
| | 2 | TiO$_2$ | 108.1 | 0.475λ |
| | 3 | SiO$_2$ | 72.0 | 0.189λ |
| | 4 | TiO$_2$ | 101.4 | 0.445λ |
| | 5 | SiO$_2$ | 59.7 | 0.157λ |
| | 6 | TiO$_2$ | 88.0 | 0.387λ |
| | 7 | SiO$_2$ | 54.7 | 0.144λ |
| | 8 | TiO$_2$ | 110.4 | 0.485λ |
| | 9 | SiO$_2$ | 55.3 | 0.145λ |
| | 10 | TiO$_2$ | 93.0 | 0.408λ |
| | 11 | SiO$_2$ | 56.0 | 0.147λ |
| | 12 | TiO$_2$ | 94.9 | 0.417λ |
| | 13 | SiO$_2$ | 53.0 | 0.139λ |
| | 14 | TiO$_2$ | 103.1 | 0.453λ |
| | 15 | SiO$_2$ | 47.3 | 0.125λ |
| | 16 | TiO$_2$ | 70.8 | 0.311λ |
| | 17 | SiO$_2$ | 39.2 | 0.103λ |
| | 18 | TiO$_2$ | 65.5 | 0.288λ |
| | 19 | SiO$_2$ | 39.5 | 0.104λ |
| | 20 | TiO$_2$ | 76.6 | 0.336λ |
| | 21 | SiO$_2$ | 41.9 | 0.11λ |
| | 22 | TiO$_2$ | 64.6 | 0.284λ |
| | 23 | SiO$_2$ | 36.3 | 0.096λ |
| | 24 | TiO$_2$ | 73.6 | 0.323λ |
| | 25 | SiO$_2$ | 12.5 | 0.033λ |
| | 26 | TiO$_2$ | 32.6 | 0.143λ |
| | 27 | SiO$_2$ | 71.6 | 0.315λ |
| | 28 | TiO$_2$ | 41.4 | 0.182λ |
| | 29 | SiO$_2$ | 66.1 | 0.29λ |
| | 30 | TiO$_2$ | 23.6 | 0.104λ |
| | | Base material | | |
| (VI) | 31 | TiO$_2$ | 126.2 | 0.554λ |
| | 32 | SiO$_2$ | 69.3 | 0.182λ |
| | 33 | TiO$_2$ | 87.9 | 0.386λ |
| | 34 | SiO$_2$ | 55.1 | 0.145λ |
| | 35 | TiO$_2$ | 545.9 | 2.398λ |
| | 36 | SiO$_2$ | 62.5 | 0.164λ |
| | 37 | TiO$_2$ | 126.5 | 0.556λ |
| | 38 | SiO$_2$ | 76.2 | 0.2λ |
| | 39 | TiO$_2$ | 130.9 | 0.575λ |
| | 40 | SiO$_2$ | 76.9 | 0.202λ |
| | 41 | TiO$_2$ | 131.2 | 0.576λ |
| | 42 | SiO$_2$ | 77.0 | 0.203λ |
| | 43 | TiO$_2$ | 131.2 | 0.576λ |
| | 44 | SiO$_2$ | 80.1 | 0.211λ |
| | 45 | TiO$_2$ | 130.0 | 0.571λ |
| | 46 | SiO$_2$ | 93.1 | 0.245λ |
| | 47 | TiO$_2$ | 132.9 | 0.584λ |
| | 48 | SiO$_2$ | 79.7 | 0.21λ |
| | 49 | TiO$_2$ | 138.3 | 0.607λ |
| | 50 | SiO$_2$ | 72.3 | 0.318λ |
| | 51 | TiO$_2$ | 137.4 | 0.603λ |
| | 52 | SiO$_2$ | 55.8 | 0.147λ |
| | 53 | TiO$_2$ | 69.2 | 0.182λ |
| | 54 | SiO$_2$ | 52.5 | 0.138λ |
| | 55 | TiO$_2$ | 49.4 | 0.13λ |
| | 56 | SiO$_2$ | 64.2 | 0.169λ |

*λ = 550 nm

Figure 8:
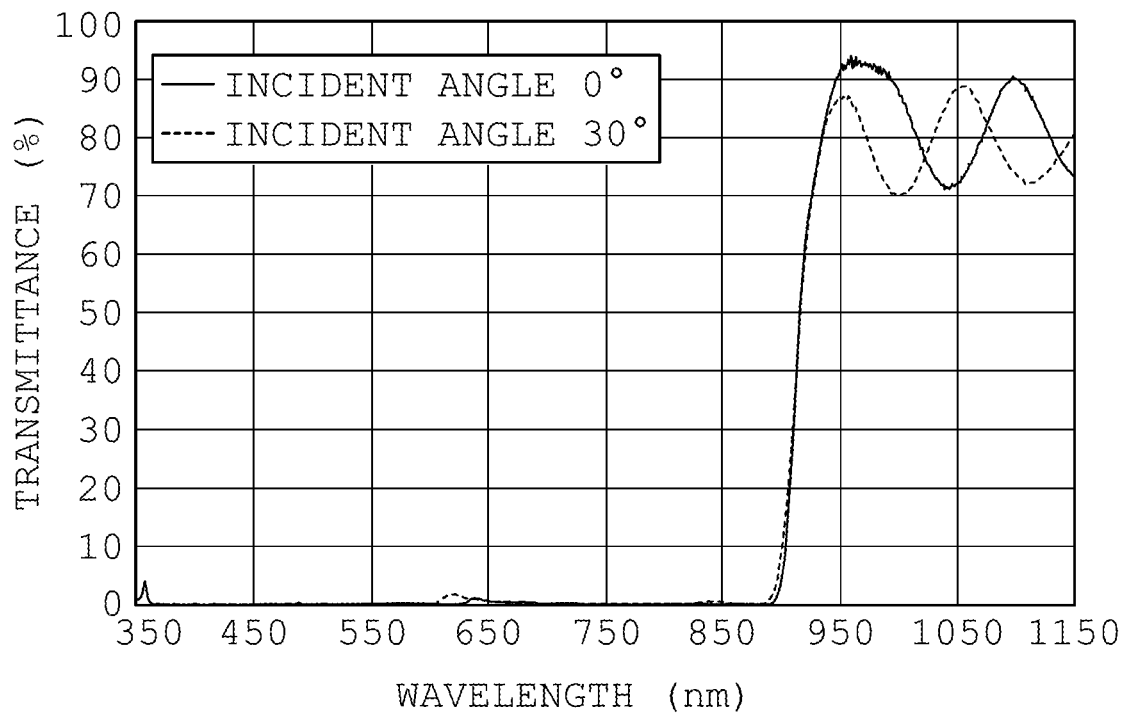
FIG. 8 is a graph representing a spectral transmittance of an optical filter produced in Example 3.

The spectral transmittances measured in the perpendicular direction to the resulting optical filter and at an angle of 30° to the perpendicular direction to the optical filter were determined, and optical properties in each wavelength region were evaluated. The results are set forth in FIG. 8 and Table 23.

Example 4

In Example 4, an optical filter which had a base material formed of a transparent resin substrate having a resin layer on both surfaces and which could selectively transmit near-infrared rays with a wavelength of about 950 nm was prepared according to the following procedure and conditions.

A base material formed of a transparent resin substrate having a resin layer on both surfaces was prepared in the same manner as in Example 3. Then, a dielectric multilayer film (VII) was formed on one surface of the resulting base material and furthermore a dielectric multilayer film (VIII) was formed on the other surface of the base material in the same manner as in Example 1, except that designing of the dielectric multilayer film (the number of layers and the thickness of each layer) was different, whereby an optical filter having a thickness of about 0.111 mm was obtained.

Designing of the dielectric multilayer films (VII) and (VIII) was carried out in the same manner as in Example 1, except that input parameters (Target values) into the software were set as shown in the following Table 9. An example of the film constitution obtained by optimization is shown in Table 10.

TABLE 9

| | | Input parameter into software | | | |
|---|---|---|---|---|---|
| Dielectric multilayer film | Wavelength (nm) | Incident angle | Required value | Target tolerance | Type |
| (VII) | 340 to 600 | 0 | 0 | 1.0 | Transmittance |
| | 601 to 880 | 0 | 0 | 0.5 | Transmittance |
| | 900 to 980 | 0 | 100 | 0.5 | Transmittance |
| (VIII) | 350 to 500 | 0 | 0 | 1.0 | Transmittance |
| | 900 to 1010 | 0 | 100 | 0.5 | Transmittance |
| | 1030 to 1200 | 0 | 0 | 0.3 | Transmittance |

TABLE 10

| Dielectric multilayer film | Layer | Film material | Physical film thickness (nm) | Optical film thickness (nd) |
|---|---|---|---|---|
| (VII) | 1 | SiO$_2$ | 54.7 | 0.144λ |
| | 2 | TiO$_2$ | 99.7 | 0.438λ |
| | 3 | SiO$_2$ | 62.3 | 0.164λ |
| | 4 | TiO$_2$ | 87.3 | 0.383λ |
| | 5 | SiO$_2$ | 48.6 | 0.128λ |
| | 6 | TiO$_2$ | 92.4 | 0.406λ |
| | 7 | SiO$_2$ | 61.6 | 0.162λ |
| | 8 | TiO$_2$ | 115.5 | 0.507λ |
| | 9 | SiO$_2$ | 53.6 | 0.141λ |
| | 10 | TiO$_2$ | 72.1 | 0.317λ |
| | 11 | SiO$_2$ | 47.1 | 0.124λ |
| | 12 | TiO$_2$ | 107.1 | 0.47λ |
| | 13 | SiO$_2$ | 63.7 | 0.168λ |
| | 14 | TiO$_2$ | 107.7 | 0.473λ |
| | 15 | SiO$_2$ | 46.4 | 0.122λ |
| | 16 | TiO$_2$ | 46.1 | 0.202λ |
| | 17 | SiO$_2$ | 41.3 | 0.109λ |
| | 18 | TiO$_2$ | 61.0 | 0.268λ |
| | 19 | SiO$_2$ | 36.7 | 0.097λ |
| | 20 | TiO$_2$ | 80.4 | 0.353λ |
| | 21 | SiO$_2$ | 49.9 | 0.131λ |
| | 22 | TiO$_2$ | 181.9 | 0.799λ |
| | 23 | SiO$_2$ | 60.3 | 0.159λ |
| | 24 | TiO$_2$ | 103.3 | 0.454λ |
| | 25 | SiO$_2$ | 45.8 | 0.12λ |
| | 26 | TiO$_2$ | 62.1 | 0.273λ |
| | 27 | SiO$_2$ | 30.1 | 0.132λ |
| | 28 | TiO$_2$ | 84.4 | 0.371λ |
| | 29 | SiO$_2$ | 24.1 | 0.106λ |
| | 30 | TiO$_2$ | 85.1 | 0.374λ |
| | 31 | SiO$_2$ | 59.5 | 0.261λ |
| | 32 | TiO$_2$ | 125.9 | 0.553λ |
| | 33 | SiO$_2$ | 88.4 | 0.388λ |
| | 34 | TiO$_2$ | 120.8 | 0.53λ |
| | 35 | SiO$_2$ | 80.6 | 0.354λ |
| | 36 | TiO$_2$ | 133.9 | 0.588λ |
| | 37 | SiO$_2$ | 79.0 | 0.347λ |
| | 38 | TiO$_2$ | 126.3 | 0.555λ |
| | 39 | SiO$_2$ | 85.0 | 0.373λ |
| | 40 | TiO$_2$ | 123.7 | 0.543λ |
| | 41 | SiO$_2$ | 67.0 | 0.294λ |
| | 42 | TiO$_2$ | 95.3 | 0.419λ |
| | 43 | SiO$_2$ | 94.9 | 0.417λ |
| | 44 | TiO$_2$ | 126.6 | 0.556λ |
| Base material | | | | |
| (VIII) | 45 | TiO$_2$ | 200.9 | 0.882λ |
| | 46 | SiO$_2$ | 146.6 | 0.386λ |
| | 47 | TiO$_2$ | 84.9 | 0.373λ |
| | 48 | SiO$_2$ | 20.6 | 0.054λ |
| | 49 | TiO$_2$ | 92.5 | 0.406λ |
| | 50 | SiO$_2$ | 127.5 | 0.335λ |
| | 51 | TiO$_2$ | 88.5 | 0.389λ |
| | 52 | SiO$_2$ | 16.1 | 0.042λ |
| | 53 | TiO$_2$ | 89.5 | 0.393λ |
| | 54 | SiO$_2$ | 150.5 | 0.396λ |
| | 55 | TiO$_2$ | 101.9 | 0.447λ |
| | 56 | SiO$_2$ | 142.1 | 0.374λ |
| | 57 | TiO$_2$ | 67.9 | 0.298λ |
| | 58 | SiO$_2$ | 18.5 | 0.049λ |
| | 59 | TiO$_2$ | 112.4 | 0.494λ |
| | 60 | SiO$_2$ | 150.7 | 0.396λ |
| | 61 | TiO$_2$ | 150.0 | 0.659λ |
| | 62 | SiO$_2$ | 139.0 | 0.366λ |
| | 63 | TiO$_2$ | 217.4 | 0.955λ |
| | 64 | SiO$_2$ | 127.0 | 0.558λ |
| | 65 | TiO$_2$ | 198.0 | 0.87λ |
| | 66 | SiO$_2$ | 125.2 | 0.329λ |
| | 67 | TiO$_2$ | 233.7 | 0.615λ |
| | 68 | SiO$_2$ | 137.1 | 0.361λ |
| | 69 | TiO$_2$ | 174.0 | 0.458λ |
| | 70 | SiO$_2$ | 113.4 | 0.298λ |

TABLE 10-continued

| Dielectric multilayer film | Layer | Film material | Physical film thickness (nm) | Optical film thickness (nd) |
|---|---|---|---|---|
| | 71 | TiO$_2$ | 93.8 | 0.247λ |
| | 72 | SiO$_2$ | 25.7 | 0.068λ |
| | 73 | TiO$_2$ | 71.2 | 0.187λ |
| | 74 | SiO$_2$ | 167.3 | 0.44λ |

*λ = 550 nm

Figure 9:
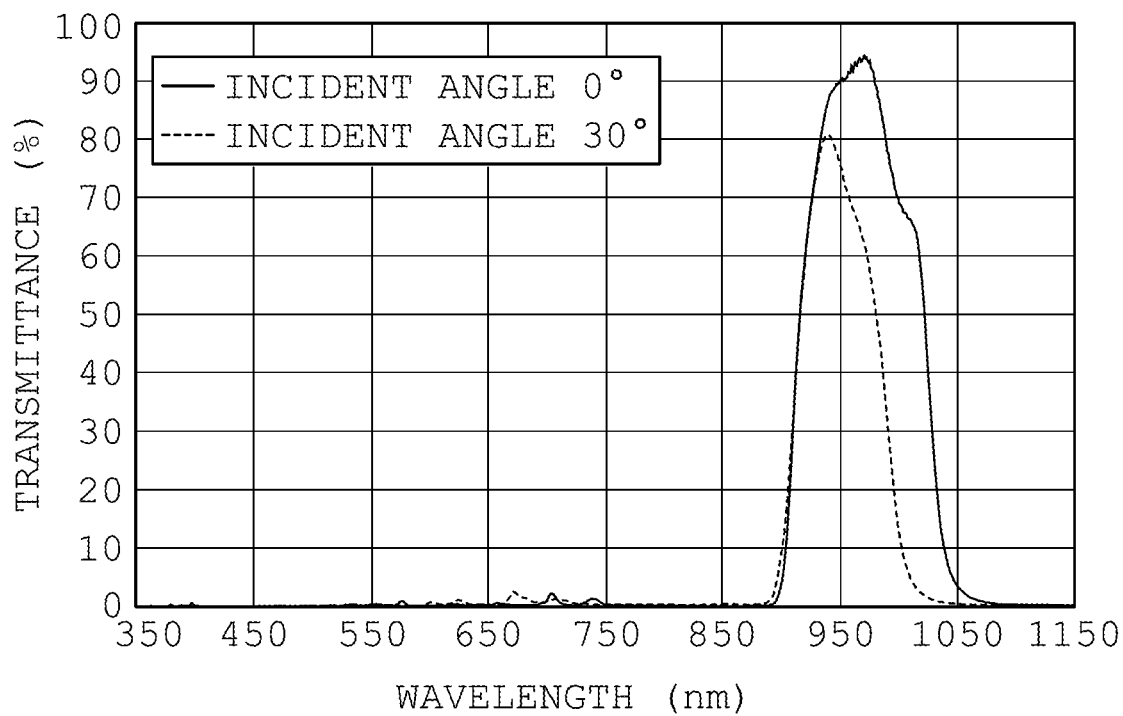
FIG. 9 is a graph representing a spectral transmittance of an optical filter produced in Example 4.

The spectral transmittances measured in the perpendicular direction to the resulting optical filter and at an angle of 30° to the perpendicular direction were measured, and optical properties in each wavelength region were evaluated. The results are set forth in FIG. 9 and Table 23.

Example 5

In Example 5, an optical filter having a base material formed of a transparent glass substrate having a transparent resin layer containing the compound (Z) on one surface was prepared according to the following procedure and conditions.

A transparent glass substrate "OA-10G (thickness: 200 μm)" (available from Nippon Electric Glass Co., Ltd.) having been cut into a length of 60 mm and a width of 60 mm was coated with a resin composition (2) having the following formulation by a spin coater, and on a hot plate, the composition was heated at 80° C. for 2 minutes to remove the solvent by volatilization. In this coating, the coating conditions using the spin coater were controlled so that the thickness after drying might become 5 μm. Next, using a conveyer type exposure device, exposure (exposure quantity: 500 mJ/cm$^2$, 200 mW) was carried out to cure the resin composition (2), whereby a base material formed of the transparent glass substrate having the transparent resin layer containing the compound (Z) was obtained. A spectral transmittance of this base material was measured, and the transmittances (Ta) and (Tb) and the wavelength (Xf) were determined. The results are set forth in Table 23.

Resin composition (2): tricyclodecane dimethanol acrylate 20 parts by weight, dipentaerythritol hexaacrylate 80 parts by weight, 1-hydroxycyclohexyl phenyl ketone 4 parts by weight, compound (z-5) 0.8 parts by weight, compound (a-1) 4.2 parts by weight, methyl ethyl ketone (solvent, TSC: 35%)

Subsequently, a dielectric multilayer film (IX) was formed on one surface of the resulting base material and furthermore a dielectric multilayer film (X) was formed on the other surface of the base material in the same manner as in Example 1, except that designing of the dielectric multilayer film (the number of layers and the thickness of each layer) was different, whereby an optical filter having a thickness of about 0.110 mm was obtained.

Designing of the dielectric multilayer films (IX) and (X) was carried out in the same manner as in Example 1, except that input parameters (Target values) into the software were set as shown in the following Table 11. An example of the film constitution obtained by optimization is shown in Table 12.

TABLE 11

| Dielectric multilayer film | Wavelength (nm) | Incident angle | Required value | Target tolerance | Type |
|---|---|---|---|---|---|
| (IX) | 340 to 600 | 0 | 0 | 1.0 | Transmittance |
| | 601 to 740 | 0 | 0 | 0.8 | Transmittance |
| | 780 to 880 | 0 | 100 | 0.5 | Transmittance |
| (X) | 805 to 900 | 0 | 100 | 0.5 | Transmittance |

TABLE 12

| Dielectric multilayer film | Layer | Film material | Physical film thickness (nm) | Optical film thickness (nd) |
|---|---|---|---|---|
| (IX) | 1 | SiO$_2$ | 24.6 | 0.065λ |
| | 2 | TiO$_2$ | 11.5 | 0.051λ |
| | 3 | SiO$_2$ | 113.7 | 0.299λ |
| | 4 | TiO$_2$ | 72.8 | 0.32λ |
| | 5 | SiO$_2$ | 91.8 | 0.242λ |
| | 6 | TiO$_2$ | 47.4 | 0.208λ |
| | 7 | SiO$_2$ | 89.2 | 0.235λ |
| | 8 | TiO$_2$ | 48.6 | 0.213λ |
| | 9 | SiO$_2$ | 91.2 | 0.24λ |
| | 10 | TiO$_2$ | 49.1 | 0.216λ |
| | 11 | SiO$_2$ | 91.9 | 0.242λ |
| | 12 | TiO$_2$ | 56.3 | 0.247λ |
| | 13 | SiO$_2$ | 91.6 | 0.241λ |
| | 14 | TiO$_2$ | 44.2 | 0.194λ |
| | 15 | SiO$_2$ | 73.3 | 0.193λ |
| | 16 | TiO$_2$ | 40.1 | 0.176λ |
| | 17 | SiO$_2$ | 71.4 | 0.188λ |
| | 18 | TiO$_2$ | 41.1 | 0.18λ |
| | 19 | SiO$_2$ | 63.7 | 0.168λ |
| | 20 | TiO$_2$ | 35.5 | 0.156λ |
| | 21 | SiO$_2$ | 75.2 | 0.198λ |
| | 22 | TiO$_2$ | 32.2 | 0.141λ |
| | 23 | SiO$_2$ | 68.9 | 0.181λ |
| | 24 | TiO$_2$ | 40.5 | 0.178λ |
| | 25 | SiO$_2$ | 76.3 | 0.201λ |
| | 26 | TiO$_2$ | 31.6 | 0.139λ |
| | 27 | SiO$_2$ | 19.5 | 0.086λ |
| | 28 | TiO$_2$ | 24.7 | 0.108λ |
| | 29 | SiO$_2$ | 150.6 | 0.661λ |
| | 30 | TiO$_2$ | 44.4 | 0.195λ |
| | 31 | SiO$_2$ | 101.4 | 0.446λ |
| | 32 | TiO$_2$ | 64.6 | 0.284λ |
| | 33 | SiO$_2$ | 186.4 | 0.819λ |
| | 34 | TiO$_2$ | 32.4 | 0.142λ |
| | 35 | SiO$_2$ | 141.4 | 0.621λ |
| | 36 | TiO$_2$ | 63.0 | 0.277λ |
| | 37 | SiO$_2$ | 111.5 | 0.49λ |
| | 38 | TiO$_2$ | 70.2 | 0.308λ |
| | 39 | SiO$_2$ | 112.7 | 0.495λ |
| | 40 | TiO$_2$ | 65.2 | 0.286λ |
| | 41 | SiO$_2$ | 111.5 | 0.49λ |
| | 42 | TiO$_2$ | 63.9 | 0.281λ |
| | 43 | SiO$_2$ | 114.1 | 0.501λ |
| | 44 | TiO$_2$ | 64.6 | 0.284λ |
| | 45 | SiO$_2$ | 109.6 | 0.481λ |
| | 46 | TiO$_2$ | 64.2 | 0.282λ |
| | 47 | SiO$_2$ | 108.8 | 0.478λ |
| | 48 | TiO$_2$ | 40.3 | 0.177λ |
| | 49 | SiO$_2$ | 488.7 | 2.147λ |
| | 50 | TiO$_2$ | 39.0 | 0.171λ |
| | 51 | SiO$_2$ | 104.5 | 0.459λ |
| | 52 | TiO$_2$ | 55.9 | 0.246λ |
| | 53 | SiO$_2$ | 99.9 | 0.439λ |
| | 54 | TiO$_2$ | 30.2 | 0.133λ |
| | Base material | | | |
| (X) | 55 | TiO$_2$ | 53.4 | 0.235λ |
| | 56 | SiO$_2$ | 150.2 | 0.395λ |
| | 57 | TiO$_2$ | 227.3 | 0.998λ |
| | 58 | SiO$_2$ | 119.4 | 0.314λ |
| | 59 | TiO$_2$ | 161.9 | 0.711λ |
| | 60 | SiO$_2$ | 171.7 | 0.452λ |

*λ = 550 nm

Figure 10:
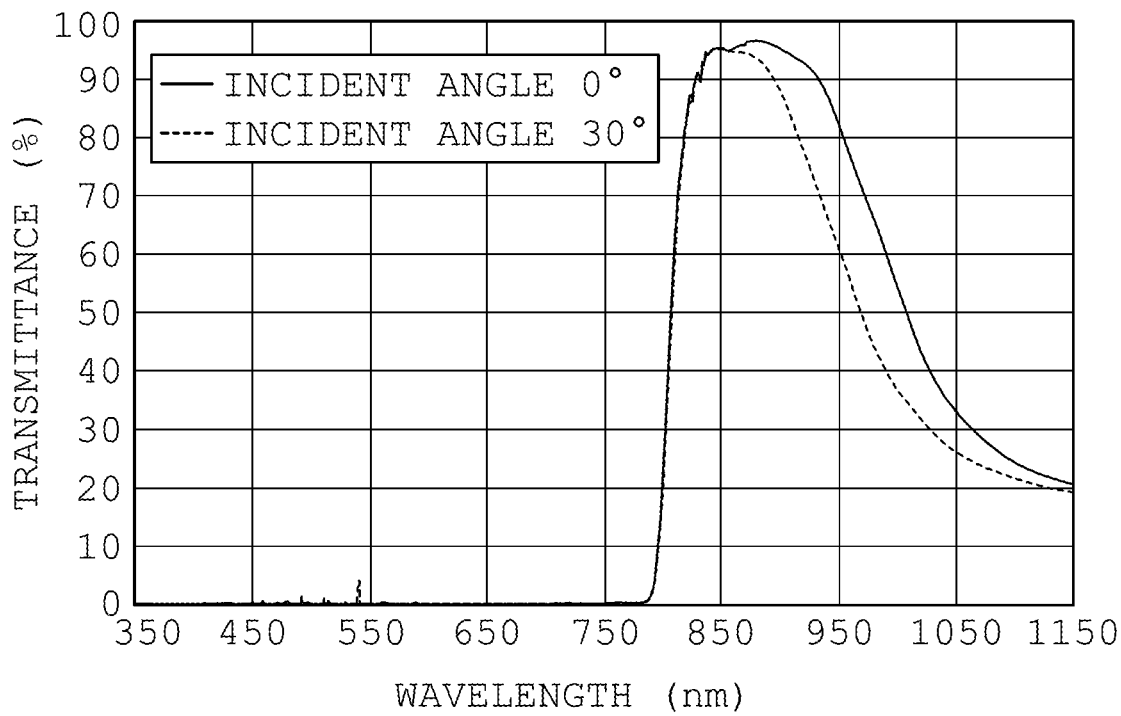
FIG. 10 is a graph representing a spectral transmittance of an optical filter produced in Example 5.

The spectral transmittances in the perpendicular direction to the resulting optical filter and at an angle of 30° to the perpendicular direction to the optical filter were determined, and optical properties in each wavelength region were evaluated. The results are set forth in FIG. 10 and Table 23.

Example 6

In Example 6, an optical filter which had a base material formed of a resin substrate having a transparent resin layer containing the compound (Z) on both surfaces was prepared according to the following procedure and conditions.

In a container, the resin A obtained in Resin Synthesis Example 1 and methylene chloride were placed to prepare a solution having a resin concentration of 20% by weight. Then, a resin substrate was prepared in the same manner as in Example 1, except that the resulting solution was used.

On both surfaces of the resulting resin substrate, resin layers were formed in the same manner as in Example 3, except that the resin composition (2) was used instead of the resin composition (1), whereby a base material formed of the resin substrate having transparent resin layers containing the compound (Z) on both surfaces was obtained. A spectral transmittance of this base material was measured, and the transmittances (Ta) and (Tb) and the wavelength (Xf) were determined. The results are set forth in Table 23.

Subsequently, in the same manner as in Example 2, a dielectric multilayer film was formed on both surfaces of the resulting base material, whereby an optical filter having a thickness of about 0.112 mm was obtained. The spectral transmittances measured in the perpendicular direction to the resulting optical filter and at an angle of 30° to the perpendicular direction to the optical filter were determined, and optical properties in each wavelength region were evaluated. The results are set forth in Table 23.

Example 7

In Example 7, an optical filter which had a base material formed of a transparent resin substrate having a resin layer on both surfaces and which could selectively transmit near-infrared rays with a wavelength of about 850 nm was prepared according to the following procedure and conditions.

A transparent resin substrate containing the compound (Z) was obtained in the same manner under the same conditions as those in Example 1, except that 0.15 parts of a compound (a-2) represented by the following formula (a-2) (absorption maximum wavelength in dichloromethane: 704 nm) was used, in addition to 0.04 parts of the compound (z-5) and 0.21 parts of the compound (a-1), as the compound (Z), and further, 0.40 parts of a compound (s-1) represented by the following formula (s-1) (absorption maximum wavelength in dichloromethane: 429 nm), 0.40 parts of a compound (s-2) represented by the following formula (s-2) (absorption maximum wavelength in dichloromethane: 550 nm) and 0.30 parts of a compound (s-3) represented by the following formula (s-3) (absorption maximum wavelength in dichloromethane: 606 nm) were used as the compound (S), in Example 1.

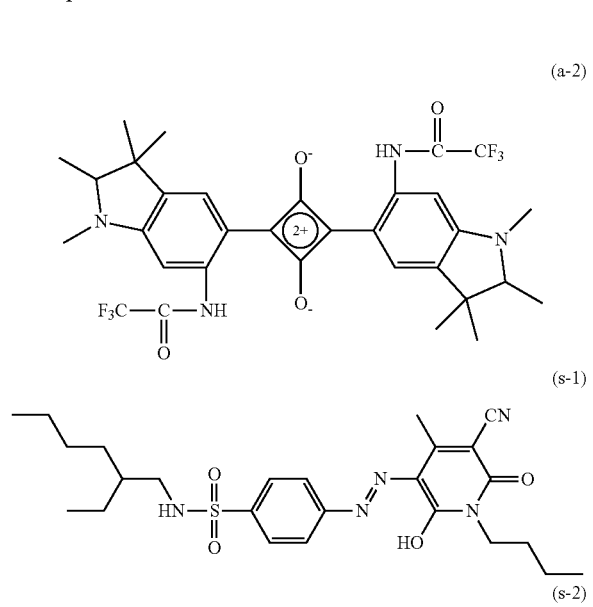

Figure 11:
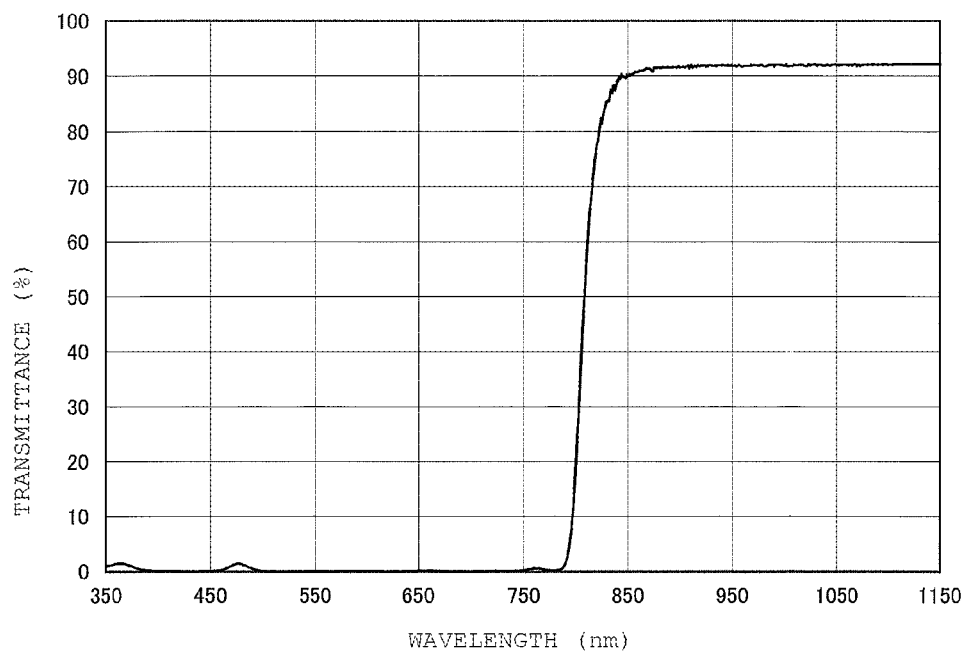
FIG. 11 is a graph representing a spectral transmittance of a base material produced in Example 7.
Figure 12:
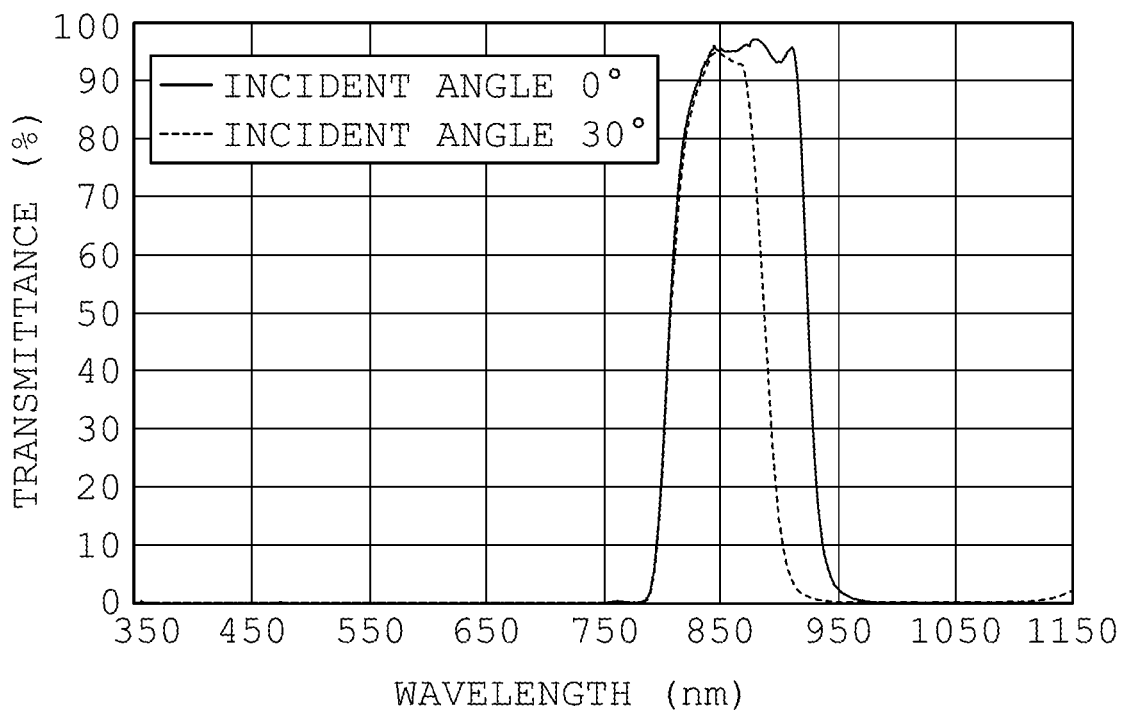
FIG. 12 is a graph representing a spectral transmittance of an optical filter produced in Example 7.

On both surfaces of the resulting resin substrate, resin layers were formed in the same manner as in Example 3, whereby a base material formed of the resin substrate having transparent resin layers on both surfaces was obtained. A spectral transmittance of this base material was measured, and the transmittances (Ta) and (Tb) and the wavelength (Xf) were determined. The results are set forth in FIG. 11 and Table 23.

Subsequently, a dielectric multilayer film (XI) was formed on one surface of the resulting base material and furthermore a dielectric multilayer film (XII) was formed on the other surface of the base material in the same manner as in Example 1, except that designing of the dielectric multilayer film (the number of layers and the thickness of each layer) was different, whereby an optical filter having a thickness of about 0.109 mm was obtained.

Designing of the dielectric multilayer films (XI) and (XII) was carried out in the same manner as in Example 1, except that input parameters (Target values) into the software were set as shown in the following Table 13. An example of the film constitution obtained by optimization is shown in Table 14.

TABLE 13

| Dielectric multilayer film | Wavelength (nm) | Input parameter into software | | | |
|---|---|---|---|---|---|
| | | Incident Angle | Required Value | Target Tolerance | Type |
| (XI) | 400 to 500 | 0 | 0 | 1.0 | Transmittance |
| | 800 to 910 | 0 | 100 | 0.5 | Transmittance |
| | 930 to 1200 | 0 | 0 | 0.3 | Transmittance |
| (XII) | 805 to 900 | 0 | 100 | 0.5 | Transmittance |

TABLE 14

| Dielectric multilayer film | Layer | Film material | Physical film thickness (nm) | Optical film thickness (nd) |
|---|---|---|---|---|
| (XI) | 1 | SiO$_2$ | 151.5 | 0.398λ |
|  | 2 | TiO$_2$ | 198.1 | 0.87λ |
|  | 3 | SiO$_2$ | 104.4 | 0.274λ |
|  | 4 | TiO$_2$ | 174.8 | 0.768λ |
|  | 5 | SiO$_2$ | 128.3 | 0.337λ |
|  | 6 | TiO$_2$ | 204.5 | 0.898λ |
|  | 7 | SiO$_2$ | 94.3 | 0.248λ |
|  | 8 | TiO$_2$ | 191.3 | 0.84λ |
|  | 9 | SiO$_2$ | 118.1 | 0.311λ |
|  | 10 | TiO$_2$ | 197.6 | 0.868λ |
|  | 11 | SiO$_2$ | 124.3 | 0.327λ |
|  | 12 | TiO$_2$ | 141.7 | 0.622λ |
|  | 13 | SiO$_2$ | 118.4 | 0.311λ |
|  | 14 | TiO$_2$ | 107.9 | 0.474λ |
|  | 15 | SiO$_2$ | 11.2 | 0.03λ |
|  | 16 | TiO$_2$ | 81.5 | 0.358λ |
|  | 17 | SiO$_2$ | 136.2 | 0.358λ |
|  | 18 | TiO$_2$ | 92.5 | 0.406λ |
|  | 19 | SiO$_2$ | 130.6 | 0.344λ |
|  | 20 | TiO$_2$ | 98.6 | 0.433λ |
|  | 21 | SiO$_2$ | 29.2 | 0.077λ |
|  | 22 | TiO$_2$ | 73.3 | 0.322λ |
|  | 23 | SiO$_2$ | 89.0 | 0.234λ |
|  | 24 | TiO$_2$ | 96.3 | 0.423λ |
|  | 25 | SiO$_2$ | 36.3 | 0.096λ |
|  | 26 | TiO$_2$ | 79.6 | 0.35λ |
|  | 27 | SiO$_2$ | 54.9 | 0.241λ |
|  | 28 | TiO$_2$ | 222.9 | 0.979λ |
|  | Base material | | | |
| (XII) | 29 | TiO$_2$ | 53.4 | 0.235λ |
|  | 30 | SiO$_2$ | 150.2 | 0.395λ |
|  | 31 | TiO$_2$ | 227.3 | 0.998λ |
|  | 32 | SiO$_2$ | 119.4 | 0.314λ |
|  | 33 | TiO$_2$ | 161.9 | 0.711λ |
|  | 34 | SiO$_2$ | 171.7 | 0.452λ |

*λ = 550 nm

The spectral transmittances measured in the perpendicular direction to the resulting optical filter and at an angle of 300 to the perpendicular direction to the optical filter were determined, and optical properties in each wavelength region were evaluated. The results are set forth in FIG. 11 and Table 23.

Example 8

A base material and an optical filter were prepared in the same manner as in Example 3, except that the type and the amount of the compound (Z) were changed as shown in Table 23. The optical properties of the resulting base material and optical filter are set forth in Table 23.

Examples 9 to 13

Base materials each formed of a transparent resin substrate having resin layers on both surfaces were prepared in the same manner as in Example 3, except that the resin, the compound (Z), the compound (S), the solvent, and the drying conditions for the resin substrate were changed as shown in Table 23, and optical filters were prepared using the same design parameters as those in Example 2. The optical properties of the resulting base materials and optical filters are set forth in Table 23.

Examples 14 and 15

Optical filters were prepared in the same manner as in Example 7, except that the compound (Z) and the compound (S) were changed as shown in Table 23. The optical properties of the resulting base materials and optical filters are set forth in Table 23.

Example 16

Figure 13:
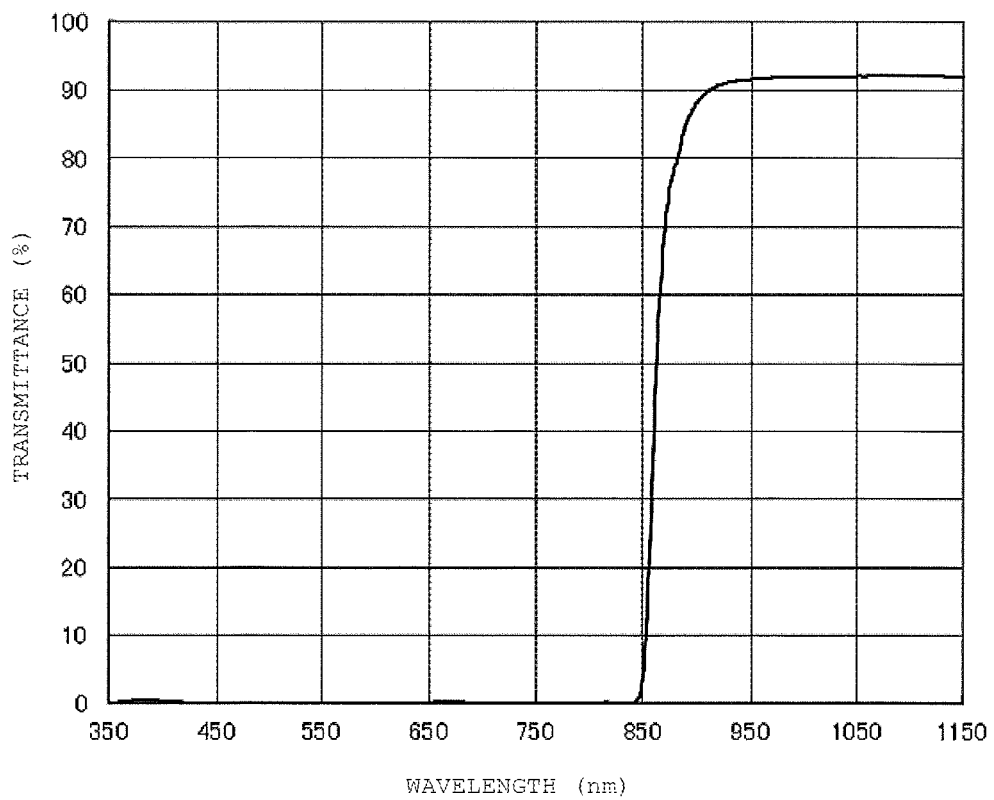
FIG. 13 is a graph representing a spectral transmittance of a base material produced in Example 16.

A base material formed of a transparent resin substrate was prepared in the same manner as in Example 1, except that the compound (Z) and the compound (S) were changed as shown in Table 24. The optical properties of the resulting base material are set forth in FIG. 13 and Table 24.

Figure 14:
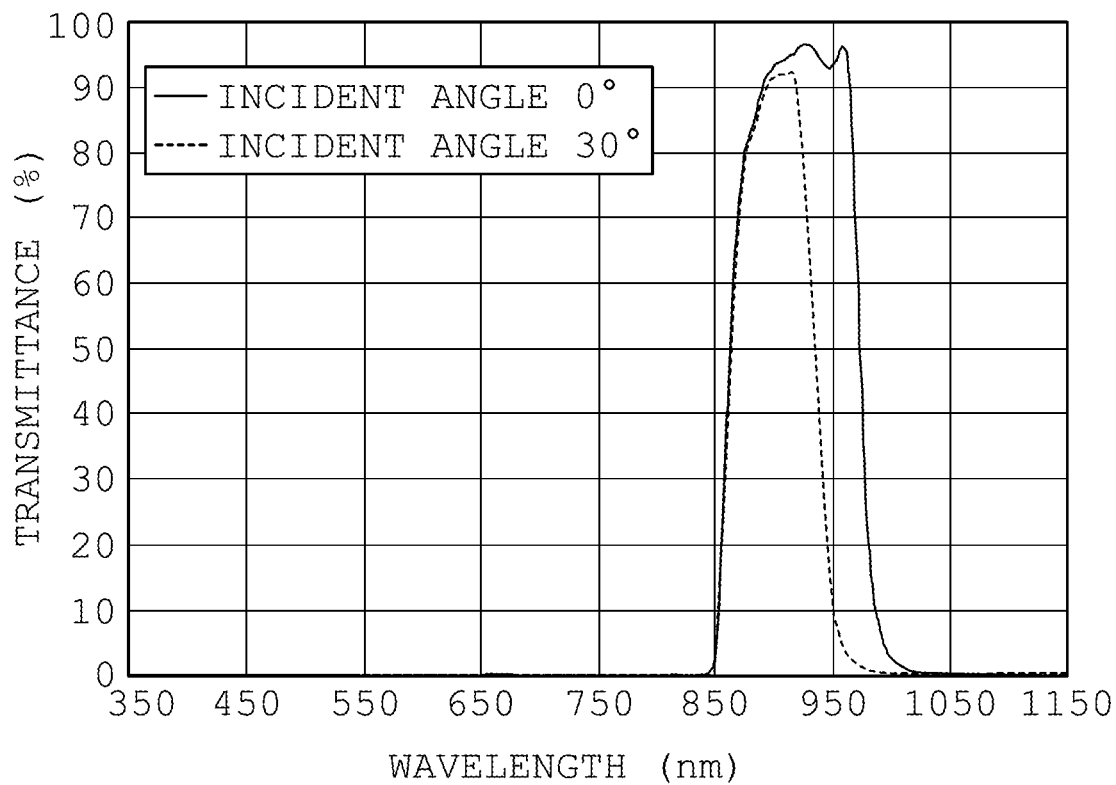
FIG. 14 is a graph representing a spectral transmittance of an optical filter produced in Example 16.

Subsequently, a dielectric multilayer film (XIII) was formed on one surface of the resulting base material and furthermore a dielectric multilayer film (XIV) was formed on the other surface of the base material in the same manner as in Example 1, except that designing of the dielectric multilayer film (the number of layers and the thickness of each layer) was different, whereby an optical filter selectively transmitting near-infrared rays with a wavelength of about 910 nm and having a thickness of about 0.104 mm was obtained. The optical properties of the resulting optical filter are set forth in FIG. 14 and Table 24.

Designing of the dielectric multilayer film (XIII) and (XIV) was carried out in the same manner as in Example 1, except that input parameters (Target values) into the software were set as shown in the following Table 15. An example of the film constitution obtained by optimization is shown in Table 16.

TABLE 15

| | | Input parameter into software | | | |
|---|---|---|---|---|---|
| Dielectric multilayer film | Wavelength (nm) | Incident angle | Required value | Target tolerance | Type |
| (XIII) | 400 to 500 | 0 | 0 | 1.0 | Transmittance |
|  | 855 to 965 | 0 | 100 | 0.5 | Transmittance |
|  | 990 to 1200 | 0 | 0 | 0.3 | Transmittance |
| (XIV) | 860 to 955 | 0 | 100 | 0.5 | Transmittance |

TABLE 16

| Dielectric multilayer film | Layer | Film material | Physical film thickness(nm) | Optical film thickness(nd) |
|---|---|---|---|---|
| (XIII) | 1 | SiO$_2$ | 158.1 | 0.416λ |
|  | 2 | TiO$_2$ | 67.9 | 0.298λ |
|  | 3 | SiO$_2$ | 24.3 | 0.064λ |
|  | 4 | TiO$_2$ | 89.4 | 0.393λ |
|  | 5 | SiO$_2$ | 107.1 | 0.282λ |
|  | 6 | TiO$_2$ | 166.0 | 0.729λ |
|  | 7 | SiO$_2$ | 129.5 | 0.341λ |
|  | 8 | TiO$_2$ | 222.9 | 0.979λ |
|  | 9 | SiO$_2$ | 118.3 | 0.311λ |
|  | 10 | TiO$_2$ | 188.9 | 0.83λ |
|  | 11 | SiO$_2$ | 120.0 | 0.316λ |
|  | 12 | TiO$_2$ | 207.3 | 0.911λ |

TABLE 16-continued

| Dielectric multilayer film | Layer | Film material | Physical film thickness(nm) | Optical film thickness(nd) |
|---|---|---|---|---|
| | 13 | SiO$_2$ | 131.3 | 0.345λ |
| | 14 | TiO$_2$ | 143.1 | 0.629λ |
| | 15 | SiO$_2$ | 142.4 | 0.374λ |
| | 16 | TiO$_2$ | 107.2 | 0.471λ |
| | 17 | SiO$_2$ | 17.5 | 0.046λ |
| | 18 | TiO$_2$ | 64.7 | 0.284λ |
| | 19 | SiO$_2$ | 134.2 | 0.353λ |

TABLE 16-continued

| Dielectric multilayer film | Layer | Film material | Physical film thickness(nm) | Optical film thickness(nd) |
|---|---|---|---|---|
| | 20 | TiO$_2$ | 97.2 | 0.427λ |
| | 21 | SiO$_2$ | 142.2 | 0.374λ |
| | 22 | TiO$_2$ | 85.4 | 0.375λ |
| | 23 | SiO$_2$ | 15.2 | 0.04λ |
| | 24 | TiO$_2$ | 84.4 | 0.371λ |
| | 25 | SiO$_2$ | 120.4 | 0.317λ |
| | 26 | TiO$_2$ | 88.2 | 0.387λ |
| | 27 | SiO$_2$ | 19.4 | 0.085λ |
| | 28 | TiO$_2$ | 81.0 | 0.356λ |
| | 29 | SiO$_2$ | 138.5 | 0.608λ |
| | 30 | TiO$_2$ | 191.6 | 0.842λ |
| | Base material | | | |
| (XIV) | 29 | TiO$_2$ | 143.3 | 0.629λ |
| | 30 | SiO$_2$ | 273.5 | 0.719λ |
| | 31 | TiO$_2$ | 106.8 | 0.469λ |
| | 32 | SiO$_2$ | 160.6 | 0.422λ |
| | 33 | TiO$_2$ | 191.6 | 0.842λ |

*λ = 550 nm

Example 17

An optical filter was prepared in the same manner as in Example 16, except that the compound (Z) and the compound (S) were changed as shown in Table 24. The optical properties of the resulting base material and optical filter are set forth in Table 24.

Example 18

A base material formed of a transparent resin substrate was prepared in the same manner as in Example 1, except that the compound (Z) and the compound (S) were changed as shown in Table 24. The optical properties of the resulting base material are set forth in Table 24.

Figure 15:
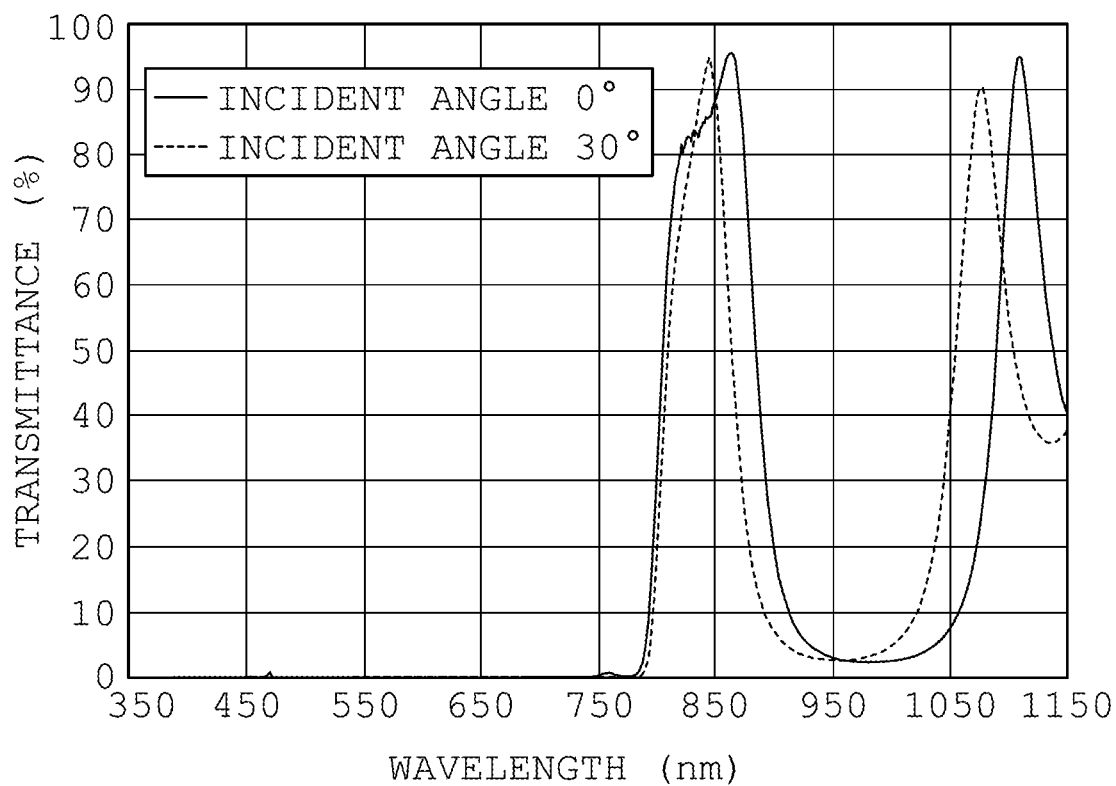
FIG. 15 is a graph representing a spectral transmittance of an optical filter produced in Example 18.

Subsequently, a dielectric multilayer film (XV) was formed on one surface of the resulting base material and furthermore a dielectric multilayer film (XVI) was formed on the other surface of the base material in the same manner as in Example 1, except that designing of the dielectric multilayer film (the number of layers and the thickness of each layer) was different, whereby an optical filter selectively transmitting near-infrared rays with a wavelength of about 850 nm and having a thickness of about 0.104 mm was obtained. The optical properties of the resulting optical filter are set forth in FIG. 15 and Table 24.

Designing of the dielectric multilayer films (XV) and (XVI) was carried out by adjustment of the film thickness of layers so that not only input parameters (Target values) into the software were as shown in the following Table 17, but also an nH·dH/nL·dL of 3.2 was satisfied. An example of the film constitution obtained by optimization is shown in Table 18.

TABLE 17

| | | Input parameter into software | | | |
|---|---|---|---|---|---|
| Dielectric multilayer film | Wavelength (nm) | Incident angle | Required value | Target tolerance | Type |
| (XV), (XVI) | 750 to 870 | 0 | 100 | 0.2 | Transmittance |
| | 920 to 1100 | 0 | 0 | 0.8 | Transmittance |
| | 740 to 860 | 30 | 100 | 0.3 | Transmittance |

TABLE 18

| Dielectric multilayer film | Layer | Film material | Physical film thickness (nm) | Optical film thickness (nd) |
|---|---|---|---|---|
| (XV) | 1 | SiO$_2$ | 77.5 | 0.204λ |
| | 2 | TiO$_2$ | 143.1 | 0.629λ |
| | 3 | SiO$_2$ | 49.6 | 0.131λ |
| | 4 | TiO$_2$ | 175.8 | 0.772λ |
| | 5 | SiO$_2$ | 47.2 | 0.124λ |
| | 6 | TiO$_2$ | 177.9 | 0.781λ |
| | 7 | SiO$_2$ | 49.4 | 0.13λ |
| | 8 | TiO$_2$ | 176.1 | 0.773λ |
| | 9 | SiO$_2$ | 52.3 | 0.137λ |
| | 10 | TiO$_2$ | 175.3 | 0.77λ |
| | 11 | SiO$_2$ | 52.3 | 0.138λ |
| | 12 | TiO$_2$ | 175.0 | 0.769λ |
| | 13 | SiO$_2$ | 53.8 | 0.142λ |
| | 14 | TiO$_2$ | 171.6 | 0.754λ |
| | 15 | SiO$_2$ | 59.9 | 0.158λ |
| | 16 | TiO$_2$ | 156.6 | 0.688λ |
| | 17 | SiO$_2$ | 266.8 | 0.702λ |
| | 18 | TiO$_2$ | 19.4 | 0.085λ |
| | Base material | | | |
| (XVI) | 19 | TiO$_2$ | 19.4 | 0.085λ |
| | 20 | SiO$_2$ | 266.8 | 0.702λ |
| | 21 | TiO$_2$ | 156.6 | 0.688λ |
| | 22 | SiO$_2$ | 59.9 | 0.158λ |
| | 23 | TiO$_2$ | 171.6 | 0.754λ |
| | 24 | SiO$_2$ | 53.8 | 0.142λ |
| | 25 | TiO$_2$ | 175.0 | 0.769λ |
| | 26 | SiO$_2$ | 52.3 | 0.138λ |
| | 27 | TiO$_2$ | 175.3 | 0.77λ |
| | 28 | SiO$_2$ | 52.3 | 0.137λ |
| | 29 | TiO$_2$ | 176.1 | 0.773λ |
| | 30 | SiO$_2$ | 49.4 | 0.13λ |
| | 31 | TiO$_2$ | 177.9 | 0.781λ |
| | 32 | SiO$_2$ | 47.2 | 0.124λ |
| | 33 | TiO$_2$ | 175.8 | 0.772λ |
| | 34 | SiO$_2$ | 49.6 | 0.131λ |
| | 35 | TiO$_2$ | 143.1 | 0.629λ |
| | 36 | SiO$_2$ | 77.5 | 0.204λ |

*λ = 550 nm

Example 19

Figure 16:
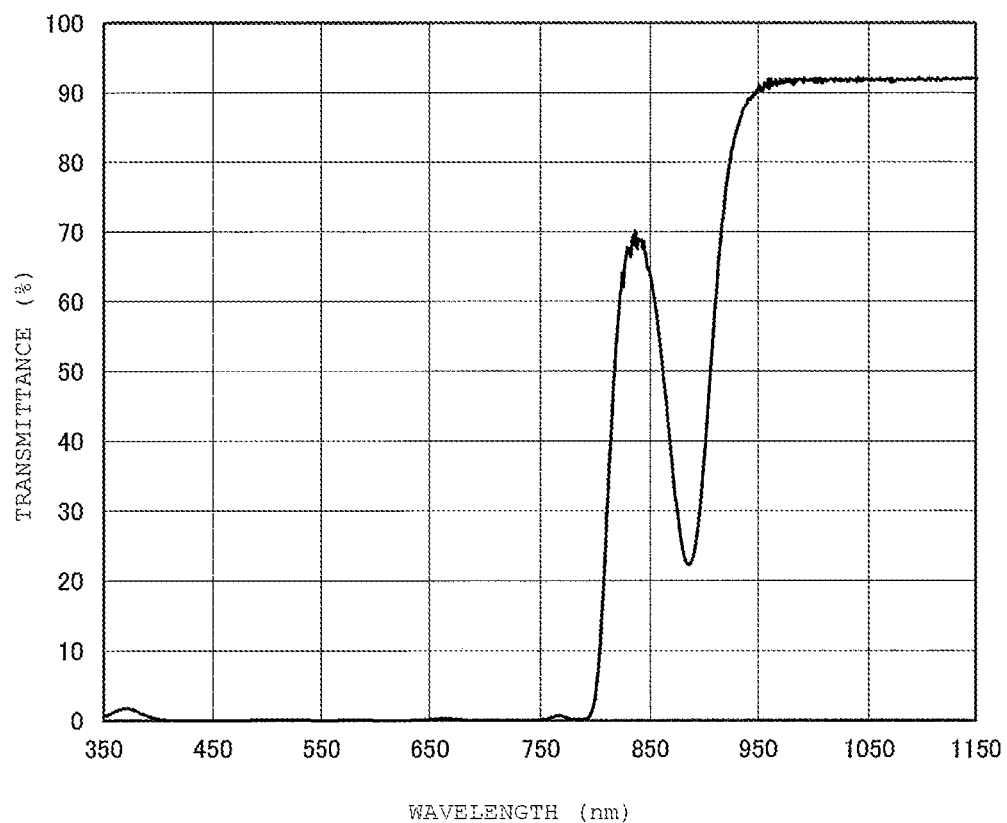
FIG. 16 is a graph representing a spectral transmittance of a base material produced in Example 19.

A base material formed of a transparent resin substrate was prepared in the same manner as in Example 1, except that the compound (Z), the compound (S) and the compound (Y) were changed as shown in Table 24. The optical properties of the resulting base material are set forth in FIG. 16 and Table 24.

Figure 17:
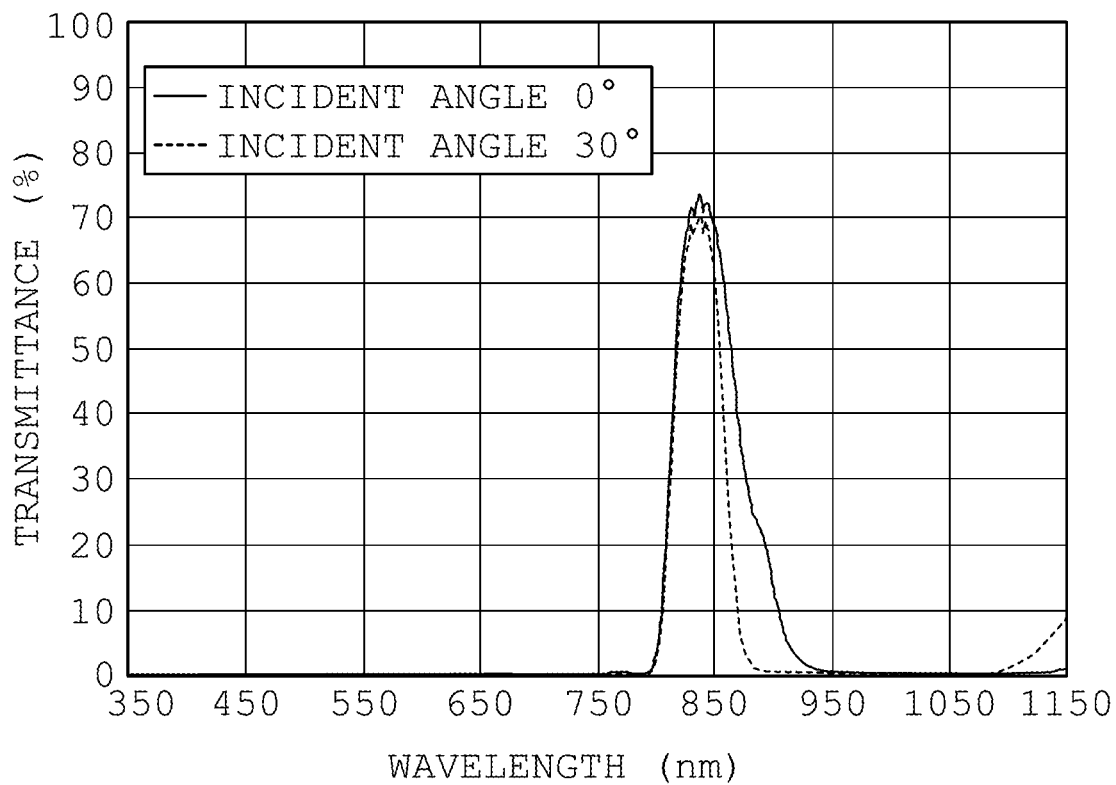
FIG. 17 is a graph representing a spectral transmittance of an optical filter produced in Example 19.

Subsequently, a dielectric multilayer film (XVII) was formed on one surface of the resulting base material and furthermore a dielectric multilayer film (XVIII) was formed on the other surface of the base material in the same manner as in Example 1, except that designing of the dielectric multilayer film (the number of layers and the thickness of each layer) was different, whereby an optical filter selectively transmitting near-infrared rays with a wavelength of about 850 nm and having a thickness of about 0.104 mm was obtained. The optical properties of the resulting optical filter are set forth in FIG. 17 and Table 24.

Designing of the dielectric multilayer films (XVII) and (XVIII) was carried out in the same manner as in Example 1, except that input parameters (Target values) into the software were set as shown in the following Table 19. An example of the film constitution obtained by optimization is shown in Table 20.

TABLE 19

| Dielectric multilayer film | Wavelength (nm) | Input parameter into software | | | |
| --- | --- | --- | --- | --- | --- |
| | | Incident angle | Required value | Target tolerance | Type |
| (XVII) | 400 to 500 | 0 | 0 | 1.0 | Transmittance |
| | 775 to 935 | 0 | 100 | 0.3 | Transmittance |
| | 905 to 1180 | 0 | 0 | 0.4 | Transmittance |
| (XVIII) | 805 to 900 | 0 | 100 | 0.5 | Transmittance |

TABLE 20

| Dielectric multilayer film | Layer | Film material | Physical film thickness (nm) | Optical film thickness (nd) |
| --- | --- | --- | --- | --- |
| (XVII) | 1 | $SiO_2$ | 146.5 | 0.385λ |
| | 2 | $TiO_2$ | 192.6 | 0.846λ |
| | 3 | $SiO_2$ | 100.9 | 0.265λ |
| | 4 | $TiO_2$ | 169.9 | 0.746λ |
| | 5 | $SiO_2$ | 124.0 | 0.326λ |
| | 6 | $TiO_2$ | 198.8 | 0.873λ |
| | 7 | $SiO_2$ | 91.2 | 0.24λ |
| | 8 | $TiO_2$ | 186.0 | 0.817λ |
| | 9 | $SiO_2$ | 114.2 | 0.3λ |
| | 10 | $TiO_2$ | 192.1 | 0.844λ |
| | 11 | $SiO_2$ | 120.2 | 0.316λ |
| | 12 | $TiO_2$ | 137.7 | 0.605λ |
| | 13 | $SiO_2$ | 114.5 | 0.301λ |
| | 14 | $TiO_2$ | 104.9 | 0.461λ |
| | 15 | $SiO_2$ | 10.9 | 0.029λ |
| | 16 | $TiO_2$ | 79.2 | 0.348λ |
| | 17 | $SiO_2$ | 131.7 | 0.347λ |
| | 18 | $TiO_2$ | 89.9 | 0.395λ |
| | 19 | $SiO_2$ | 126.3 | 0.332λ |
| | 20 | $TiO_2$ | 95.8 | 0.421λ |
| | 21 | $SiO_2$ | 28.3 | 0.074λ |
| | 22 | $TiO_2$ | 71.3 | 0.313λ |
| | 23 | $SiO_2$ | 86.0 | 0.226λ |
| | 24 | $TiO_2$ | 93.7 | 0.411λ |
| | 25 | $SiO_2$ | 35.1 | 0.092λ |
| | 26 | $TiO_2$ | 77.4 | 0.34λ |
| | 27 | $SiO_2$ | 53.1 | 0.233λ |
| | 28 | $TiO_2$ | 216.7 | 0.952λ |

TABLE 20-continued

| Dielectric multilayer film | Layer | Film material | Physical film thickness (nm) | Optical film thickness (nd) |
| --- | --- | --- | --- | --- |
| Base material | | | | |
| (XVIII) | 29 | $TiO_2$ | 53.4 | 0.235λ |
| | 30 | $SiO_2$ | 150.2 | 0.395λ |
| | 31 | $TiO_2$ | 227.3 | 0.998λ |
| | 32 | $SiO_2$ | 119.4 | 0.314λ |
| | 33 | $TiO_2$ | 161.9 | 0.711λ |
| | 34 | $SiO_2$ | 171.7 | 0.452λ |

*λ = 550 nm

Example 20

Figure 18:
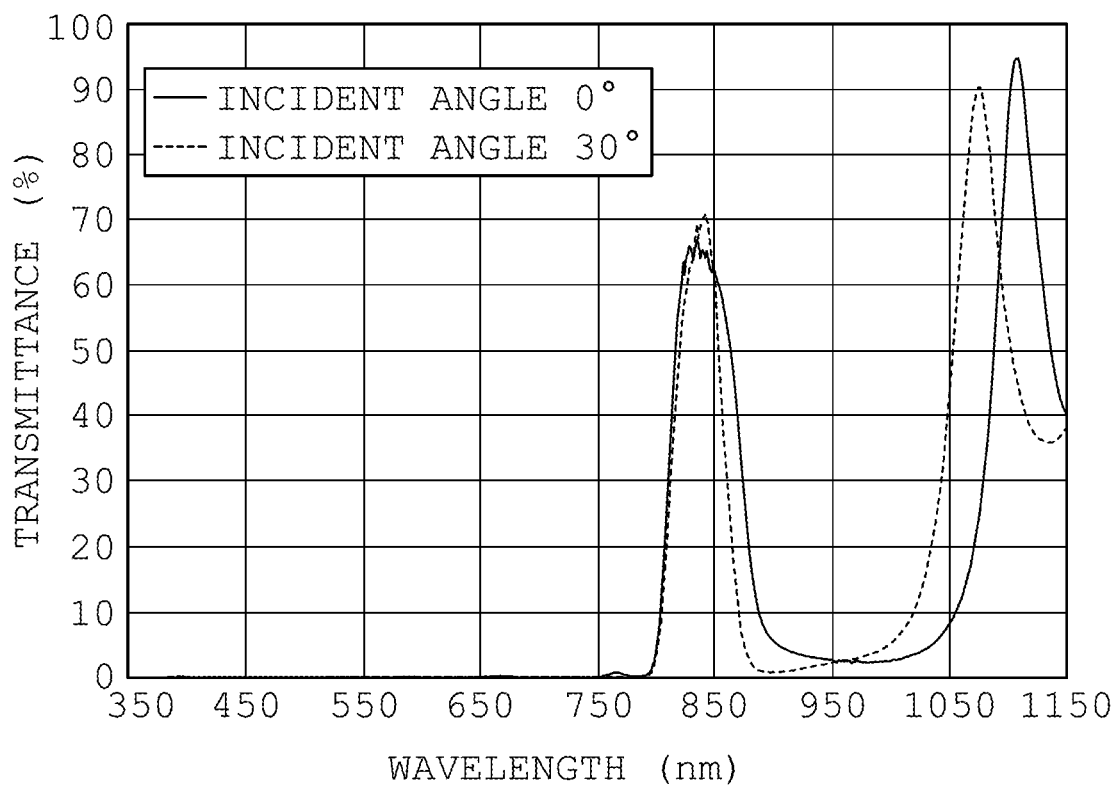
FIG. 18 is a graph representing a spectral transmittance of an optical filter produced in Example 20.

A base material formed of a transparent resin substrate was prepared in the same manner as in Example 19. Subsequently, a dielectric multilayer film was formed on both surfaces of the base material in the same design under the same conditions as those in Example 18, whereby an optical filter selectively transmitting near-infrared rays with a wavelength of about 850 nm and having a thickness of about 0.104 mm was obtained. The optical properties of the resulting optical filter are set forth in FIG. 18 and Table 24.

Example 21

Figure 19:
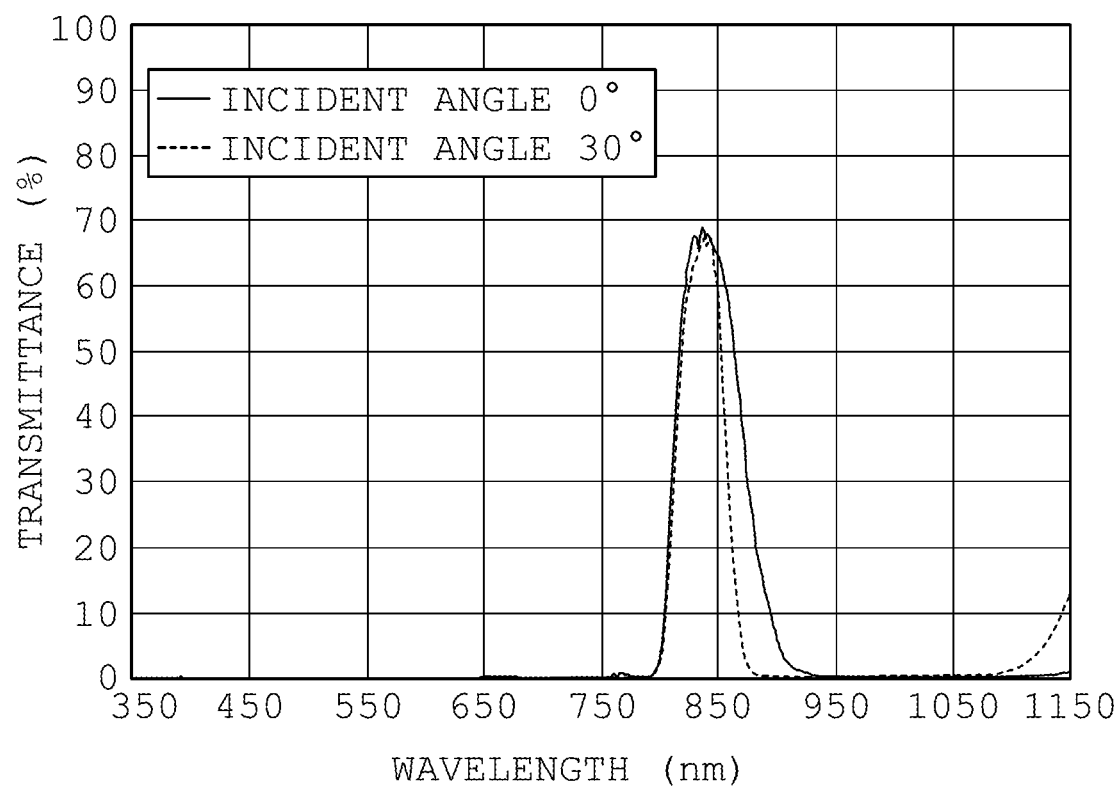
FIG. 19 is a graph representing a spectral transmittance of an optical filter produced in Example 21.

A base material formed of a transparent resin substrate was prepared in the same manner as in Example 19. Subsequently, a dielectric multilayer film (XIX) was formed on one surface of the resulting base material and furthermore a dielectric multilayer film (XX) was formed on the other surface of the base material in the same manner as in Example 1, except that designing of the dielectric multilayer film (the number of layers and the thickness of each layer) was different, whereby an optical filter selectively transmitting near-infrared rays with a wavelength of about 850 nm and having a thickness of about 0.105 mm was obtained. The optical properties of the resulting optical filter are set forth in FIG. 19 and Table 24.

Designing of the dielectric multilayer films (XIX) and (XX) was carried out by adjustment of the film thickness of layers so that not only input parameters (Target values) into the software were set as shown in the following Table 21, but also the dielectric multilayer film (XX) satisfied an nH·dH/nL·dL of 3.2. An example of the film constitution obtained by optimization is shown in Table 22.

TABLE 21

| Dielectric multilayer film | Wavelength (nm) | Incident Angle | Required Value | Target Tolerance | Type |
|---|---|---|---|---|---|
| (XIX) | 400 to 500 | 0 | 0 | 1.0 | Transmittance |
| | 775 to 935 | 0 | 100 | 0.3 | Transmittance |
| | 905 to 1180 | 0 | 0 | 0.4 | Transmittance |
| (XX) | 750 to 870 | 0 | 100 | 0.2 | Transmittance |
| | 920 to 1100 | 0 | 0 | 0.8 | Transmittance |
| | 740 to 860 | 30 | 100 | 0.3 | Transmittance |

TABLE 22

| Dielectric multilayer film | Layer | Film material | Physical film thickness (nm) | Optical film thickness (nd) |
|---|---|---|---|---|
| (XIX) | 1 | $SiO_2$ | 146.5 | 0.385λ |
| | 2 | $TiO_2$ | 192.6 | 0.846λ |
| | 3 | $SiO_2$ | 100.9 | 0.265λ |
| | 4 | $TiO_2$ | 169.9 | 0.746λ |
| | 5 | $SiO_2$ | 124.0 | 0.326λ |
| | 6 | $TiO_2$ | 198.8 | 0.873λ |
| | 7 | $SiO_2$ | 91.2 | 0.24λ |
| | 8 | $TiO_2$ | 186.0 | 0.817λ |
| | 9 | $SiO_2$ | 114.2 | 0.3λ |
| | 10 | $TiO_2$ | 192.1 | 0.844λ |
| | 11 | $SiO_2$ | 120.2 | 0.316λ |
| | 12 | $TiO_2$ | 137.7 | 0.605λ |
| | 13 | $SiO_2$ | 114.5 | 0.301λ |
| | 14 | $TiO_2$ | 104.9 | 0.461λ |
| | 15 | $SiO_2$ | 10.9 | 0.029λ |
| | 16 | $TiO_2$ | 79.2 | 0.348λ |
| | 17 | $SiO_2$ | 131.7 | 0.347λ |
| | 18 | $TiO_2$ | 89.9 | 0.395λ |
| | 19 | $SiO_2$ | 126.3 | 0.332λ |
| | 20 | $TiO_2$ | 95.8 | 0.421λ |
| | 21 | $SiO_2$ | 28.3 | 0.074λ |
| | 22 | $TiO_2$ | 71.3 | 0.313λ |
| | 23 | $SiO_2$ | 86.0 | 0.226λ |
| | 24 | $TiO_2$ | 93.7 | 0.411λ |
| | 25 | $SiO_2$ | 35.1 | 0.092λ |
| | 26 | $TiO_2$ | 77.4 | 0.34λ |
| | 27 | $SiO_2$ | 53.1 | 0.233λ |
| | 28 | $TiO_2$ | 216.7 | 0.952λ |
| | | Base material | | |
| (XX) | 29 | $TiO_2$ | 19.4 | 0.085λ |
| | 30 | $SiO_2$ | 266.8 | 0.702λ |
| | 31 | $TiO_2$ | 156.6 | 0.688λ |
| | 32 | $SiO_2$ | 59.9 | 0.158λ |
| | 33 | $TiO_2$ | 171.6 | 0.754λ |
| | 34 | $SiO_2$ | 53.8 | 0.142λ |
| | 35 | $TiO_2$ | 175.0 | 0.769λ |
| | 36 | $SiO_2$ | 52.3 | 0.138λ |
| | 37 | $TiO_2$ | 175.3 | 0.77λ |
| | 38 | $SiO_2$ | 52.3 | 0.137λ |
| | 39 | $TiO_2$ | 176.1 | 0.773λ |
| | 40 | $SiO_2$ | 49.4 | 0.13λ |
| | 41 | $TiO_2$ | 177.9 | 0.781λ |
| | 42 | $SiO_2$ | 47.2 | 0.124λ |
| | 43 | $TiO_2$ | 175.8 | 0.772λ |
| | 44 | $SiO_2$ | 49.6 | 0.131λ |
| | 45 | $TiO_2$ | 143.1 | 0.629λ |
| | 46 | $SiO_2$ | 77.5 | 0.204λ |

*λ = 550 nm

Comparative Example 1

A base material and an optical filter were prepared in the same manner as in Example 1, except that no compound (Z) was used in Example 1. The optical properties of the resulting base material and optical filter are set forth in Table 24.

Comparative Example 2

A base material and an optical filter were prepared in the same manner as in Example 10, except that no compound (Z) was used. The optical properties of the resulting base material and optical filter are set forth in Table 24.

Comparative Example 3

An optical filter was prepared in the same manner as in Example 1, except that a glass support "BS-8 (thickness: 210 μm)" (available from Matsunami Glass Ind., Ltd.) for absorption of near-infrared rays, having been cut into a length of 60 mm and a width of 60 mm, was used as the base material. The optical properties of the base material and the resulting optical filter are set forth in Table 24.

TABLE 23

| | | | | Ex. 1 | Ex. 2 | Ex. 3 | Ex. 4 | Ex. 5 | Ex. 6 | Ex. 7 | Ex. 8 | Ex. 9 | Ex. 10 | Ex. 11 | Ex. 12 | Ex. 13 | Ex. 14 | Ex. 15 |
|---|---|---|---|---|---|---|---|---|---|---|---|---|---|---|---|---|---|---|
| Base material constitution | Form of base material | | | (1) | (1) | (2) | (2) | (3) | (4) | (2) | (2) | (2) | (2) | (2) | (2) | (2) | (2) | (2) |
| | Formulation of transparent resin substrate or resin support (weight part(s)) | Transparent resin | Resin A | 100 | 100 | 100 | 100 | | 100 | 100 | 100 | 100 | 100 | | | | 100 | 100 |
| | | | Resin B | | | | | | | | | | | 100 | | | | |
| | | | Resin C | | | | | | | | | | | | 100 | | | |
| | | | Resin D | | | | | | | | | | | | | 100 | | |
| | | Compound (Z) | Z-5 | 0.04 | 0.04 | | | | 0.04 | | | | 0.02 | 0.04 | 004 | | 0.04 | 0.04 |
| | | | Z-25 | | | | | | | | | | | 0.05 | 0.03 | | | 0.05 |
| | | | Z-27 | | | 0.10 | 0.10 | | | | | | | | | | | |
| | | | Z-35 | | | | | | | | | | 0.08 | | | | | |
| | | | Z-63 | | | | | | | | | | | | | | | |
| | | | a-1 | 0.21 | 0.21 | | | | 0.21 | | 0.25 | 0.20 | | 0.21 | 0.21 | 0.21 | 0.21 | |
| | | | a-2 | | | | | | | 0.15 | 0.20 | | 0.15 | | | | | 0.15 |

TABLE 23-continued

|  |  |  | Ex. 1 | Ex. 2 | Ex. 3 | Ex. 4 | Ex. 5 | Ex. 6 | Ex. 7 | Ex. 8 | Ex. 9 | Ex. 10 | Ex. 11 | Ex. 12 | Ex. 13 | Ex. 14 | Ex. 15 |
|---|---|---|---|---|---|---|---|---|---|---|---|---|---|---|---|---|---|
|  | Compound (S) | S-1 |  |  |  |  |  |  | 0.40 |  |  | 0.40 |  |  |  |  |  |
|  |  | S-2 |  |  |  |  |  |  | 0.40 |  |  | 0.40 |  |  |  |  |  |
|  |  | S-3 |  |  |  |  |  |  | 0.30 |  |  | 0.30 |  |  |  |  |  |
|  |  | S-4 |  |  |  |  |  |  |  |  |  |  |  |  |  | 0.35 | 0.40 |
|  |  | S-5 |  |  |  |  |  |  |  |  |  |  |  |  |  | 0.20 | 0.30 |
|  |  | S-6 |  |  |  |  |  |  |  |  |  |  |  |  |  | 0.40 |  |
|  |  | S-7 |  |  |  |  |  |  |  |  |  |  |  |  |  |  | 0.50 |
|  | Compound (Y) | y-1 |  |  |  |  |  |  |  |  |  |  |  |  |  |  |  |
|  | Solvent |  | (1) | (1) | (1) | (1) | — | (1) | (1) | (1) | (1) | (1) | (2) | (2) | (3) | (1) | (1) |
| Drying conditions |  |  | (1) | (1) | (1) | (1) | — | (1) | (1) | (1) | (1) | (1) | (2) | (2) | (3) | (1) | (1) |
| Glass substrate |  |  | — | — | — | — | (1) | — | — | — | — | — | — | — | — | — | — |
| (Transparent) resin layer-forming composition |  |  | — | — | (1) | (1) | (2) | (2) | (1) | (1) | (1) | (1) | (1) | (1) | (1) | (1) | (1) |
| Base material optical properties | Ta (%) |  | 1%≥ | 1%≥ | 1%≥ | 1%≥ | 1%≥ | 1%≥ | 1%≥ | 1%≥ | 1%≥ | 1%≥ | 1%≥ | 1%≥ | 1%≥ | 1%≥ | 1%≥ |
|  | Tb (%) |  | 92 | 92 | 92 | 92 | 92 | 91 | 92 | 92 | 91 | 92 | 88 | 87 | 91 | 92 | 92 |
|  | Xf (nm) |  | 807 | 807 | 915 | 915 | 806 | 808 | 808 | 920 | 814 | 810 | 809 | 809 | 807 | 808 | 814 |
| Glass transition temperature of resin substrate (° C.) |  |  | 164 | 164 | 165 | 165 | — | 165 | 159 | 163 | 163 | 159 | 280 | 307 | 134 | 160 | 158 |
| Dielectric multilayer film (both-side constitution) | Number of layers on one side |  | 36 | 54 | 30 | 44 | 54 | 54 | 28 | 30 | 54 | 54 | 54 | 54 | 54 | 28 | 28 |
|  | Number of layers on one side |  | 26 | 28 | 26 | 30 | 6 | 28 | 6 | 26 | 28 | 28 | 28 | 28 | 28 | 6 | 6 |
| Optical properties of optical filter | Average value of transmittances in wavelength region of 380 to 700 nm in incidence at 0° (%) |  | 1%≥ | 1%≥ | 1%≥ | 1%≥ | 1%≥ | 1%≥ | 1%≥ | 1%≥ | 1%≥ | 1%≥ | 1%≥ | 1%≥ | 1%≥ | 1%≥ | 1%≥ |
|  | Average value of transmittances in wavelength region of 701 to 750 nm in incidence at 0° (%) |  | 1%≥ | 1%≥ | 1%≥ | 1%≥ | 1%≥ | 1%≥ | 1%≥ | 1%≥ | 1%≥ | 1%≥ | 1%≥ | 1%≥ | 1%≥ | 1%≥ | 1%≥ |
|  | Td (%) |  | 97 | 96 | 94 | 94 | 96 | 95 | 97 | 94 | 94 | 94 | 90 | 91 | 95 | 97 | 96 |
|  | Xa (nm) |  | 806 | 807 | 915 | 915 | 806 | 807 | 807 | 920 | 813 | 810 | 809 | 809 | 807 | 808 | 813 |
|  | \|Xa-Xb\| (nm) |  | 2 | 2 | 2 | 2 | 2 | 3 | 2 | 3 | 2 | 3 | 3 | 3 | 2 | 2 | 2 |
|  | Xc (nm) |  | 874 | 878 | 959 | 970 | 879 | 876 | 880 | 963 | 880 | 880 | 881 | 380 | 379 | 879 | 880 |
|  | \|Xd-Xe\| (nm) |  | 11 | 10 | 17 | 17 | 11 | 10 | 10 | 18 | 11 | 11 | 12 | 11 | 11 | 10 | 11 |
|  | Tc (%) |  | 85 | 76 | 87 | 62 | 94 | 72 | 71 | 83 | 78 | 75 | 73 | 75 | 76 | 72 | 77 |
|  | Te (%) |  | — | 1%≥ | — | 1%≥ | — | 1%≥ | 1%≥ | — | 1%≥ | 1%≥ | 1%≥ | 1%≥ | 1%≥ | 1%≥ | 1%≥ |
|  | \|Xg-Xh\| (nm) |  | — | 37 | — | 42 | — | 38 | 37 | — | 37 | 37 | 36 | 36 | 37 | 38 | 38 |

TABLE 24

|  |  |  |  | Ex. 16 | Ex. 17 | Ex. 18 | Ex. 19 | Ex. 20 | Ex. 21 | Comp. Ex. 1 | Comp. Ex. 2 | Comp. Ex. 3 |
|---|---|---|---|---|---|---|---|---|---|---|---|---|
| Base material constitution | Form of base material | Material |  | (1) | (1) | (1) | (1) | (1) | (1) | (5) | (6) | (7) |
|  | Formulation of transparent resin substrate or resin support (weight part(s)) | Transparent resin | Resin A | 120 | 100 | 100 | 100 | 100 | 100 | 100 | 100 |  |
|  |  |  | Resin B |  |  |  |  |  |  |  |  |  |
|  |  |  | Resin C |  |  |  |  |  |  |  |  |  |
|  |  |  | ResinD |  |  |  |  |  |  |  |  |  |
|  |  | Compound (Z) | Z-5 | 0.30 | 0.40 | 0.04 | 0.04 | 0.04 | 0.04 |  |  |  |
|  |  |  | Z-25 |  |  |  |  |  |  |  |  |  |
|  |  |  | Z-27 |  |  |  |  |  |  |  |  |  |
|  |  |  | Z-35 |  |  |  |  |  |  |  |  |  |
|  |  |  | Z-63 | 0.15 | 0.15 |  |  |  |  |  |  |  |
|  |  |  | a-1 |  |  |  | 0.21 | 0.21 | 021 | 0.21 |  |  |
|  |  |  | a-2 |  |  |  | 0.15 | 0.15 | 0.15 | 0.15 |  |  |

TABLE 24-continued

| | | | Ex. 16 | Ex. 17 | Ex. 18 | Ex. 19 | Ex. 20 | Ex. 21 | Comp. Ex. 1 | Comp. Ex. 2 | Comp. Ex. 3 |
|---|---|---|---|---|---|---|---|---|---|---|---|
| | Compound (S) | S-1 | | | 0.40 | | | | | 0.40 | |
| | | S-2 | | | 0.40 | | | | | 0.40 | |
| | | S-3 | | | 0.30 | | | | | 0.30 | |
| | | S-4 | 0.35 | 0.40 | | 0.35 | 0.35 | 0.35 | | | |
| | | S-5 | 0.25 | 0.40 | | 0.20 | 0.20 | 0.20 | | | |
| | | S-6 | 0.40 | 0.20 | | 0.40 | 0.40 | 0.40 | | | |
| | | S-7 | | 0.90 | | | | | | | |
| | Compound (Y) | y-1 | | | | 0.02 | 002 | 0.02 | | | |
| | Solvent | | (1) | (1) | (1) | (1) | (1) | (1) | (1) | (1) | — |
| | Drying conditions | | (1) | (1) | (1) | (1) | (1) | (1) | (1) | (1) | — |
| | Glass substrate | | — | — | — | — | — | — | — | — | (2) |
| | (Transparent) resin layer-forming composition | | — | — | — | — | — | — | — | (1) | — |
| Base material optical properties | Ta (%) | | 1%≥ | 1%≥ | 1%≥ | 1%≥ | 1%≥ | 1%≥ | 91 | 65 | 5 |
| | Tb (%) | | 92 | 92 | 92 | 92 | 92 | 92 | 92 | 92 | 11 |
| | Xf (nm) | | 863 | 864 | 809 | 817 | 817 | 817 | — | — | — |
| Glass transition temperature of resin substrate (° C.) | | | 157 | 154 | 160 | 160 | 160 | 160 | 165 | 160 | — |
| Dielectric multilayer film (both-side constitution) | Number of layers on one side | | 30 | 30 | 18 | 28 | 18 | 28 | 36 | 54 | 36 |
| | Number of layers on one side | | 5 | 5 | 18 | 6 | 18 | 18 | 26 | 28 | 26 |
| Optical properties of optical filter | Average value of transmittances in wavelength region of 380 to 700 nm in incidence at 0° (%) | | 1%≥ | 1%≥ | 1%≥ | 1%≥ | 1%≥ | 1%≥ | 1%≥ | 1%≥ | 1%≥ |
| | Average value of transmittances in wavelength region of 701 10 750 nm in incidence at 0° (%) | | 1%≥ | 1%≥ | 1%≥ | 1%≥ | 1%≥ | 1%≥ | 1%≥ | 1%≥ | 1%≥ |
| | Td (%) | | 97 | 96 | 96 | 74 | 66 | 69 | 97 | 97 | 7 |
| | Xa (nm) | | 863 | 864 | 809 | 813 | 812 | 813 | 764 | 762 | — |
| | \|Xa-Xb\|(nm) | | 2 | 2 | 2 | 2 | 3 | 2 | 32 | 33 | — |
| | Xc (nm) | | 925 | 926 | 861 | 836 | 834 | 842 | 876 | 875 | 876 |
| | \|Xd-Xe\| (nm) | | 11 | 11 | 11 | 17 | — | — | 7 | 7 | — |
| | Tc (%) | | 79 | 78 | 56 | 71 | 67 | 68 | 85 | 86 | 5 |
| | Te (%) | | 1%≥ | 1%≥ | 3 | 1%≥ | 2 | 1%≥ | — | 1%≥ | — |
| | \|Xg-Xh\| (nm) | | 38 | 38 | 23 | 14 | 13 | 12 | — | 37 | — |

Reference numerals with respect to base material constitutions, various compounds and the like in Table 23 and 24 are as follows.

<Form of Base Material>

Form (1): a transparent resin substrate containing a compound (Z)

Form (2): a transparent resin substrate containing a compound (Z) and having resin layers on both surfaces Form (3): a glass substrate having, on one surface, a transparent resin layer containing a compound (Z)

Form (4): a resin substrate having, on both surfaces, transparent resin layers containing a compound (Z)

Form (5): a transparent resin substrate containing no compound (Z) (comparative example)

Form (6): a transparent resin substrate containing no compound (Z) and containing a compound (S), and having resin layers on both surfaces (comparative example)

Form (7): a glass substrate for absorption of near-infrared rays (comparative example)

<Transparent Resin>

Resin A: cyclic olefin-based resin (Resin Synthesis Example 1, glass transition temperature: 165° C.)

Resin B: aromatic polyether-based resin (Resin Synthesis Example 2, glass transition temperature: 285° C.)

Resin C: polyimide-based resin (Resin Synthesis Example 3, glass transition temperature: 310° C.)

Resin D: cyclic olefin-based resin "Zeonor 1420R" (available from Zeon Corporation, glass transition temperature: 136° C.)

<Glass Substrate>

Glass substrate (1): a transparent glass substrate "OA-10G (thickness: 200 μm)" (available from Nippon Electric Glass Co., Ltd.) having been cut into a length of 60 mm and a width of 60 mm Glass substrate (2): a glass support "BS-8 (thickness: 210 μm)" (available from Matsunami Glass Ind., Ltd.) for absorption of near-infrared rays, having been cut into a length of 60 mm and a width of 60 mm <Compound (Z)> z-5: compound (z-5) described in Table 1 (absorption maximum wavelength in dichloromethane: 770 nm)

z-25: compound (z-25) described in Table 1 (absorption maximum wavelength in dichloromethane: 781 nm)

z-27: compound (z-27) described in Table 1 (absorption maximum wavelength in dichloromethane: 868 nm)

z-35: compound (z-35) described in Table 1 (absorption maximum wavelength in dichloromethane: 882 nm)

z-63: compound (z-63) described in Table 2 (absorption maximum wavelength in dichloromethane: 813 nm)

a-1: compound (a-1) represented by formula (a-1) (absorption maximum wavelength in dichloromethane: 738 nm)

a-2: compound (a-2) represented by formula (a-2) (absorption maximum wavelength in dichloromethane: 704 nm)

<Compound (S)> s-1: compound (s-1) represented by formula (s-1) (absorption maximum wavelength in dichloromethane: 429 nm)

s-2: compound (s-2) represented by formula (s-2) (absorption maximum wavelength in dichloromethane: 550 nm)

s-3: compound (s-3) represented by formula (s-3) (absorption maximum wavelength in dichloromethane: 606 nm)

s-4: compound (s-4) represented by the following formula (s-4) (absorption maximum wavelength in dichloromethane: 466 nm)

(s-4)

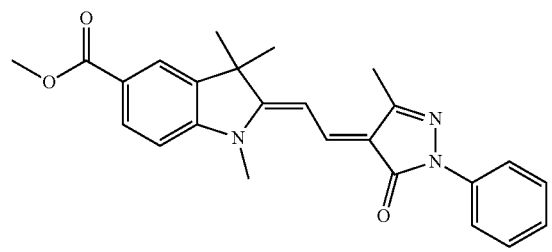

s-5: compound (s-5) represented by the following formula (s-5) (absorption maximum wavelength in dichloromethane: 549 nm)

(s-5)

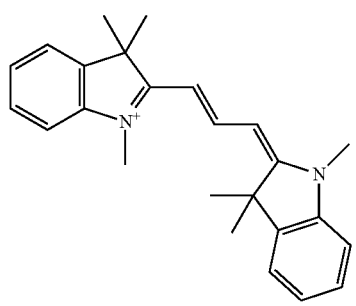

s-6: compound (s-6) represented by the following formula (s-6) (absorption maximum wavelength in dichloromethane: 604 nm)

(s-6)

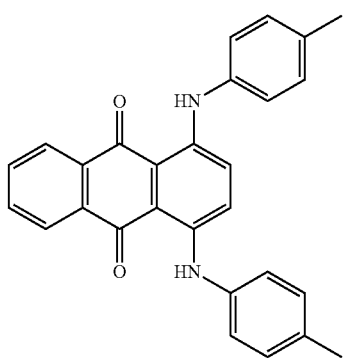

s-7: compound (s-7) represented by formula (s-7) (absorption maximum wavelength in dichloromethane: 646 nm)

(s-7)

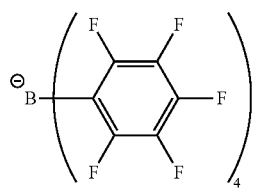

<Compound (Y)> y-1: compound (y-1) represented by the following formula (y-1) (absorption maximum wavelength in dichloromethane: 882 nm)

(y-1)

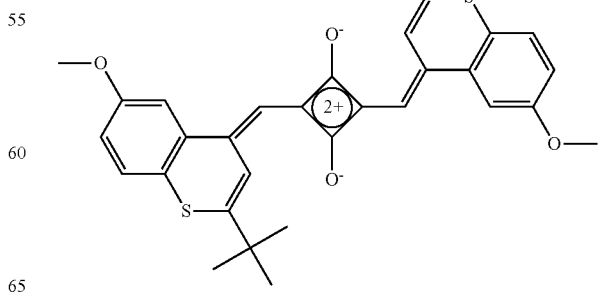

<Solvent>

Solvent (1): methylene chloride

Solvent (2): N,N-dimethylacetamide

Solvent (3): cyclohexane/xylene (weight ratio: 7/3)

The drying conditions of the (transparent) resin substrates of Examples and Comparative Examples in Tables 23 and 24 are as follows. The coating film was peeled from the glass plate before drying under reduced pressure.

<Drying Conditions for Resin Substrate>

Condition (1): 20° C./8 hr→100° C./8 hr under reduced pressure

Condition (2): 60° C./8 hr→80° C./8 hr→140° C./8 hr under reduced pressure

Condition (3): 60° C./8 hr→80° C./8 hr→100° C./24 hr under reduced pressure

REFERENCE SIGNS LIST

1,1': light
2: optical filter
3: spectrophotometer
100: optical filter
102: base material
104: dielectric multilayer film
106: antireflection film
108: transparent resin substrate containing compound (Z)
110: support
112: resin layer

The invention claimed is:

1. An optical filter, comprising:
   a base material (i) comprising a resin layer containing a compound (Z) having an absorption maximum in a wavelength region of 700 to 930 nm; and
   a dielectric multilayer film formed on at least one surface of the base material (i),
   wherein the optical filter satisfies the following requirements (a) to (c):
   (a) an average value of transmittances measured in a perpendicular direction to the optical filter in a wavelength region of 380 to 700 nm is not more than 10%;
   (b) the optical filter has a light passband (Za) in a wavelength region of not less than 750 nm but not more than 1050 nm, and a maximum transmittance (Td) measured in a perpendicular direction to the optical filter in the light passband (Za) is not less than 45%; and
   (c) an absolute value |Xa−Xb| of a difference between a wavelength (Xa) on the shortest wavelength side, at which a transmittance measured in the perpendicular direction to the optical filter is half the transmittance (Td), and a wavelength (Xb) on the shortest wavelength side, at which a transmittance measured at an angle of 30° to the perpendicular direction to the optical filter is half the transmittance (Td), in the light passband (Za), is not more than 15 nm, and the wavelength (Xa) is in the range of 730 to 980 nm, and
   wherein the optical filter has a light stopband (Zb) in a region on a longer wavelength side than the light passband (Za), and a minimum transmittance (Te) measured in the perpendicular direction to the optical filter in the light stopband (Zb) is not more than 10%.

2. The optical filter according to claim 1, wherein the optical filter further satisfies the following requirement (d):
   (d) an average value of transmittances measured in the perpendicular direction to the optical filter in the wavelength region of 701 to 750 μm is not more than 15%.

3. The optical filter according to claim 1, wherein a wavelength (Xc), at which a transmittance measured in the perpendicular direction to the optical filter in the light passband (Za) is maximum, is in the range of 780 to 1000 nm.

4. The optical filter according to claim 3, wherein a transmittance (Tc) measured at an angle of 30° to the perpendicular direction to the optical filter at the wavelength (Xc) is not less than 45%.

5. The optical filter according to claim 1, wherein the optical filter further satisfies the following requirement (e):
   (e) a maximum transmittance measured in the perpendicular direction to the optical filter in the light passband (Za) is not less than 75%, and an absolute value |Xd−Xe| of a difference between a wavelength (Xd) on the shortest wavelength side, at which a transmittance measured in the perpendicular direction to the optical filter in the light passband (Za) is 70%, and a wavelength (Xe) on the shortest wavelength side, at which a transmittance measured in the perpendicular direction to the optical filter in the wavelength region of not less than 720 nm is 30%, is not more than 30 nm.

6. The optical filter according to claim 1, wherein the thickness of the optical filter is not more than 180 μm.

7. The optical filter according to claim 1, wherein the compound (Z) is at least one compound selected from the group consisting of a squarylium-based compound, a phthalocyanine-based compound, a naphthalocyanine-based compound, a croconium-based compound, a hexaphyrin-based compound and a cyanine-based compound.

8. The optical filter according to claim 7, wherein the squarylium-based compound is a compound represented by the following formula (Z):

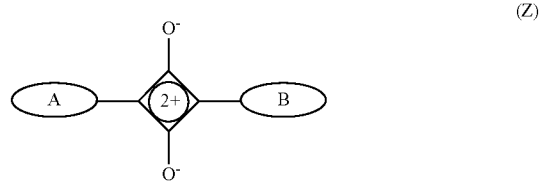

wherein in formula (Z), substitution units A and B are each independently any of substitution units represented by the following formulae (I) to (III):

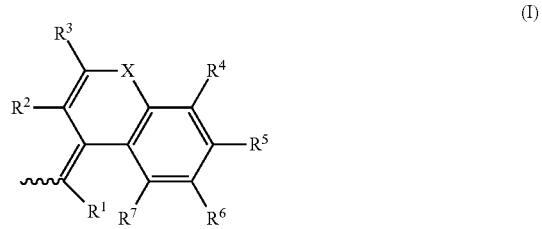

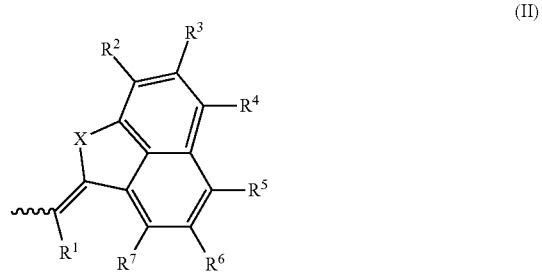

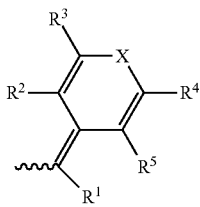

(III)

wherein in formulae (I) to (III), a site represented by a wavy line is a binding site to a central 4-membered ring, each X is independently an oxygen atom, a sulfur atom, a selenium atom, a tellurium atom or $-NR^8-$, $R^1$ to $R^8$ are each independently a hydrogen atom, a halogen atom, a sulfo group, a hydroxyl group, a cyano group, a nitro group, a carboxy group, a phosphoric acid group, a $-NR^gR^h$ group, a $-SR^i$ group, a $-SO_2R^i$ group, a $-OSO_2R^i$ group or any one of the following $L^a$ to $L^h$, $R^g$ and $R^h$ are each independently a hydrogen atom, a $-C(O)R^i$ group or any one of the following $L^a$ to $L^e$, and $R^i$ is any one of the following $L^a$ to $L^e$, ($L^a$) an aliphatic hydrocarbon group of 1 to 12 carbon atoms ($L^b$) a halogen-substituted alkyl group of 1 to 12 carbon atoms ($L^c$) an alicyclic hydrocarbon group of 3 to 14 carbon atoms ($L^d$) an aromatic hydrocarbon group of 6 to 14 carbon atoms ($L^e$) a heterocyclic group of 3 to 14 carbon atoms ($L^f$) an alkoxy group of 1 to 12 carbon atoms ($L^g$) an acyl group of 1 to 12 carbon atoms, which may have a substituent L ($L^h$) an alkoxycarbonyl group of 1 to 12 carbon atoms, which may have a substituent L, and the substituent L is at least one kind selected from the group consisting of an aliphatic hydrocarbon group of 1 to 12 carbon atoms, a halogen-substituted alkyl group of 1 to 12 carbon atoms, an alicyclic hydrocarbon group of 3 to 14 carbon atoms, an aromatic hydrocarbon group of 6 to 14 carbon atoms and a heterocyclic group of 3 to 14 carbon atoms.

9. The optical filter according to claim 1, wherein a resin for forming the resin layer is at least one resin selected from the group consisting of a cyclic (poly)olefin-based resin, an aromatic polyether-based resin, a polyimide-based resin, a fluorene polycarbonate-based resin, a fluorene polyester-based resin, a polycarbonate-based resin, a polyamide-based resin, a polyarylate-based resin, a polysulfone-based resin, a polyether sulfone-based resin, a polyparaphenylene-based resin, a polyamideimide-based resin, a polyethylene naphthalate-based resin, a fluorinated aromatic polymer-based resin, a (modified) acrylic-based resin, an epoxy-based resin, an allyl ester-based curing type resin, a silsesquioxane-based ultraviolet curing resin, an acrylic-based ultraviolet curing resin and a vinyl-based ultraviolet curing resin.

10. The optical filter according to claim 1, wherein the base material (i) comprises a resin substrate (ii) containing the compound (Z).

11. The optical filter according to claim 10, wherein the resin substrate (ii) further contains a compound (S) having an absorption maximum in the wavelength region of 350 to 699 nm.

12. The optical filter according to claim 10, wherein the glass transition temperature of the resin substrate (ii) is 130 to 300° C.

13. The optical filter according to claim 10, wherein a difference between the glass transition temperature of the resin substrate (ii) and the glass transition temperature of the resin contained in the resin substrate (ii) is 0 to 10° C.

14. The optical filter according to claim 1, wherein the base material (i) further contains a compound (S) having an absorption maximum in the wavelength region of 350 to 699 nm.

15. The optical filter according to claim 1, wherein the base material (i) contains a compound (S-a) having an absorption maximum in the wavelength region of 350 to 500 nm, a compound (S-b) having an absorption maximum in the wavelength region of 501 to 600 nm and a compound (S-c) having an absorption maximum in the wavelength region of 601 to 699 nm.

16. The optical filter according to claim 15, wherein a difference in absorption maximum wavelength between the compound (S-a) and the compound (S-b) is 50 to 140 nm, and a difference in absorption maximum wavelength between the compound (S-b) and the compound (S-c) is 30 to 100 nm.

17. The optical filter according to claim 1, wherein an absolute value |Xg–Xh| of a difference between a wavelength (Xg) on the longest wavelength side, at which a transmittance measured in the perpendicular direction to the optical filter is half the transmittance (Td), and a wavelength (Xh) on the longest wavelength side, at which a transmittance measured at an angle of 30° to the perpendicular direction to the optical filter is half the transmittance (Td), in the light passband (Za), is not more than 30 nm.

18. The optical filter according to claim 1, wherein the base material (i) further comprises a compound (Y) having an absorption maximum on a longer wavelength side than the light passband (Za).

19. The optical filter according to claim 18, wherein when a wavelength at which a transmittance measured in the perpendicular direction to the optical filter in the light passband (Za) is maximum is a wavelength (Xc), an absorption maximum wavelength of the compound (Y) is from the wavelength (Xc)+10 nm to the wavelength (Xc)+100 nm.

20. The optical filter according to claim 1, which is for an optical sensor device.

21. An optical sensor device equipped with the optical filter according to claim 1.

* * * * *